United States Patent
Tsuchimura et al.

(10) Patent No.: US 10,007,180 B2
(45) Date of Patent: Jun. 26, 2018

(54) NEGATIVE RESIST COMPOSITION, RESIST FILM USING SAME, PATTERN FORMING METHOD, AND MASK BLANK PROVIDED WITH RESIST FILM

(71) Applicant: FUJIFILM Corporation, Tokyo (JP)

(72) Inventors: Tomotaka Tsuchimura, Shizuoka (JP); Tadateru Yatsuo, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 14/794,393

(22) Filed: Jul. 8, 2015

(65) Prior Publication Data

US 2015/0309408 A1 Oct. 29, 2015

Related U.S. Application Data

(63) Continuation of application No. PCT/JP2014/050162, filed on Jan. 8, 2014.

(30) Foreign Application Priority Data

Jan. 10, 2013 (JP) .................. 2013-002922

(51) Int. Cl.

| G03F 7/038 | (2006.01) |
|---|---|
| G03F 7/039 | (2006.01) |
| G03F 7/40 | (2006.01) |
| G03F 7/20 | (2006.01) |
| G03F 1/50 | (2012.01) |
| G03F 1/76 | (2012.01) |
| G03F 7/004 | (2006.01) |

(52) U.S. Cl.
CPC ............... *G03F 7/038* (2013.01); *G03F 1/50* (2013.01); *G03F 1/76* (2013.01); *G03F 7/0045* (2013.01); *G03F 7/0046* (2013.01); *G03F 7/0382* (2013.01); *G03F 7/20* (2013.01); *G03F 7/40* (2013.01)

(58) Field of Classification Search
None
See application file for complete search history.

(56) References Cited

U.S. PATENT DOCUMENTS

| 4,954,416 | A | * | 9/1990 | Wright | .................. C07C 381/12 430/281.1 |
|---|---|---|---|---|---|
| 5,955,241 | A | * | 9/1999 | Sato | ...................... G03F 7/0045 430/270.1 |
| 6,033,828 | A | * | 3/2000 | Shimada | .................... C08F 8/04 430/270.11 |
| 6,156,477 | A | * | 12/2000 | Motomi | ................. G03F 7/0045 430/270.1 |
| 2005/0238992 | A1 | | 10/2005 | Kodama | |
| 2006/0003260 | A1 | * | 1/2006 | Nakagawa | ............ G03F 7/0392 430/281.1 |
| 2008/0241745 | A1 | * | 10/2008 | Shirakawa | ............ G03F 7/0382 430/281.1 |
| 2009/0104563 | A1 | * | 4/2009 | Ishiduka | ............... C07C 309/10 430/285.1 |
| 2011/0212390 | A1 | * | 9/2011 | Masunaga | ............. G03F 7/0046 430/5 |
| 2011/0318691 | A1 | * | 12/2011 | Tsuchimura | ......... C07D 213/20 430/285.1 |
| 2012/0164574 | A1 | * | 6/2012 | Tokugawa | ............ G03F 7/0045 430/281.1 |
| 2012/0273924 | A1 | * | 11/2012 | Matsuda | ............... C07C 381/12 257/632 |
| 2013/0004741 | A1 | * | 1/2013 | Matsuda | ............... G03F 7/0397 428/195.1 |

FOREIGN PATENT DOCUMENTS

| JP | 07-252214 | * | 10/1995 | |
|---|---|---|---|---|
| JP | 09-241234 | * | 9/1997 | |
| JP | 09-241234 A | | 9/1997 | |
| JP | 10-207066 | * | 8/1998 | |
| JP | 2003-121999 A | | 4/2003 | |
| JP | 2003-307839 A | | 10/2003 | |
| JP | 2005-308969 A | | 11/2005 | |
| JP | 2006-084924 A | | 3/2006 | |
| JP | 2006-282652 | * | 10/2006 | ............. G03F 7/004 |
| JP | 2006-290798 | * | 10/2006 | |
| JP | 2007-230913 | * | 9/2007 | |
| JP | 2007-230913 A | | 9/2007 | |
| JP | 2008-129433 A | | 6/2008 | |
| JP | 2009-053665 | * | 3/2009 | |
| JP | 2012-133055 A | | 7/2012 | |
| JP | 2012-159688 | * | 8/2012 | |
| WO | 2012/086850 A1 | | 6/2012 | |

OTHER PUBLICATIONS

Machine translation of JP 2005-308969 (2005).*
Machine translation of JP 2003-307839 (2003).*
Machine translation of JP 09-241234 (1997).*
Machine translation of JP 2012-159688 (2012).*
Machine translation of JP 2003-121999 (2003).*
Machine translation of JP 2009-053665 (2009).*
Office Action dated Feb. 23, 2016 in Japanese Application No. 2013-002922.
International Preliminary Report on Patentability dated Jul. 23, 2015, issued by the International Bureau of WIPO in counterpart Application No. PCT/JP2014/050162.
International Search Report for PCT/JP2014/050162 dated Mar. 25, 2014.
Office Action dated Jan. 25, 2017 from the Taiwanese Patent Office in counterpart Taiwanese Application No. 103100840.
Office Action dated Oct. 19, 2016, in corresponding Korean Application No. 10-2015-7018164, 10 pages in Korean and English.
Office Action dated Aug. 23, 2016, from the Japanese Patent Office in counterpart Japanese Application No. 2013-002922.
Office Action dated Nov. 24, 2017 from the Korean Patent Office in counterpart Korean Application No. 10-2015-7018164.
Notification of Reason for Refusal, dated April 23, 2018, issued in corresponding Korean Application No. 10-2015-7018164, 9 pages in Korean and English.

* cited by examiner

*Primary Examiner* — Martin J Angebranndt

(74) *Attorney, Agent, or Firm* — Sughrue Mion, PLLC

(57) ABSTRACT

A negative resist composition includes an onium salt compound (A) containing a nitrogen atom in its cation moiety, a compound (B) that is configured to produce an acid when exposed to actinic rays or radiation, and a compound (C) containing an acid-crosslinkable group.

12 Claims, No Drawings

NEGATIVE RESIST COMPOSITION, RESIST FILM USING SAME, PATTERN FORMING METHOD, AND MASK BLANK PROVIDED WITH RESIST FILM

CROSS-REFERENCE TO RELATED APPLICATIONS

This application is a Continuation application of PCT Application No. PCT/JP2014/050162, filed Jan. 8, 2014, and based upon and claiming the benefit of priority from Japanese Patent Application No. 2013-002922, filed Jan. 10, 2013, the entire contents of of which are incorporated herein by reference.

BACKGROUND OF THE INVENTION

1. Field of the Invention

The present invention relates to a negative resist composition capable of forming a high-definition pattern with the use of electron beams, extreme ultraviolet or the like, which composition can find appropriate application in an ultramicrolithography process applicable to the manufacturing of a super-LSI or a high-capacity microchip, etc. and other photofabrication processes. The present invention further relates to a resist film and a method of forming a pattern using the composition, and a mask blank provided with the resist film. In particular, the present invention relates to a negative resist composition that can find appropriate application in processes in which use is made of a substrate provided with a specified base film, and relates to a resist film and a method of forming a pattern using the composition, and a mask blank provided with the resist film. Moreover, the present invention relates to a process for manufacturing an electronic device, in which the above pattern forming method is used, and to an electronic device manufactured by the process.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly required in accordance with the realization of high integration for integrated circuits. Accordingly, the trend of exposure wavelength toward a short wavelength, for example, from g-rays to i-rays and further to an excimer laser light is seen. Further, now, the development of lithography using electron beams or X-rays is being promoted.

In particular, the electron beam or extreme ultraviolet lithography is positioned as the next-generation or next-next-generation pattern forming technology. As high resolution can be attained, this technology is widely utilized in the fabrication of a photomask for use in semiconductor exposure. For example, in the process for fabricating a photomask by electron beam lithography, a resist layer is formed on a shielding substrate comprising a transparent substrate and, provided thereon, a shielding layer composed mainly of chromium or the like. Subsequently, selective exposure thereof to electron beams is performed, followed by alkali development, thereby obtaining a resist pattern. Thereafter, the shielding layer is etched using the resist pattern as a mask, thereby forming a pattern in the shielding layer. As a result, a photomask having a shielding layer with a given pattern provided on a transparent substrate can be obtained.

In accordance with thus required further enhancement of pattern fineness, a deterioration of resolution attributed to pattern shape is now a problem. Cited reference 1 discloses the use of an acid generator containing a nitrogen atom in its cation moiety as a means for solving the resolution problem.

CITATION LIST

Patent Literature

Patent reference 1: Jpn. Pat. Appln. KOKAI Publication No. (JP-A-) 2007-230913

SUMMARY OF THE INVENTION

Especially in the forming of a negative pattern, there is a problem that the apical portion of the pattern is likely to have a swollen shape (hereinafter also referred to as T-top shape), and that when it is intended to form an isolated space pattern, bridging thereof is likely to occur. Thus, enhancing of resolution is difficult in the forming of a negative pattern. Accordingly, there is a demand for a negative resist composition excelling in resolution. There is also a demand for a negative resist composition that satisfies not only resolution but also other performance.

It is an object of the present invention to provide a negative resist composition from which a pattern excelling in resolution (for example, resolving power, pattern shape and line edge roughness (LER)), dependence on post-exposure baking (PEB) temperature and post-exposure line width (PED) stability can be formed. It is another object of the present invention to provide a resist film and a method of forming a pattern using the composition. It is a further object of the present invention to provide a mask blank provided with the resist film. It is still a further object of the present invention to provide a process for manufacturing an electronic device, in which the above pattern forming method is included, and to provide an electronic device manufactured by the process.

Embodiments of the present invention are as described below.

[1] A negative resist composition comprising:
an onium salt compound (A) containing a nitrogen atom in its cation moiety,
a compound (B) that is configured to produce an acid when exposed to actinic rays or radiation, and
a compound (C) containing an acid-crosslinkable group.

[2] The negative resist composition according to item [1], further comprising a compound (D) containing a phenolic hydroxyl group.

[3] The negative resist composition according to item [2], wherein the compound (D) containing a phenolic hydroxyl group is a resin containing any of repeating units of general formula (II) below,

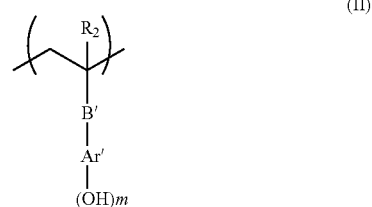

in which

R$_2$ represents a hydrogen atom, an optionally substituted methyl group or a halogen atom, B' represents a single bond or a bivalent organic group, Ar' represents an aromatic ring group, and m is an integer of 1 or greater.

[4] The negative resist composition according to any one of items [1] to [3], wherein the compound (C) containing an acid-crosslinkable group contains two or more hydroxymethyl groups or alkoxymethyl groups in its molecule.

[5] The negative resist composition according to any one of items [1] to [4], for exposure to electron beams or extreme ultraviolet.

[6] The negative resist composition according to any of items [1] to [5], wherein the cation moiety comprises a basic moiety containing a nitrogen atom.

[7] The negative resist composition according to item [6], wherein the basic moiety contains an amino group or a nitrogen-containing heterocyclic group.

[8] The negative resist composition according to item [7], wherein the basic moiety contains an amino group, the amino group being an aliphatic amino group.

[9] The negative resist composition according to any one of items [1] to [8], wherein the cation moiety comprises any of partial structures of general formula (N-I) below,

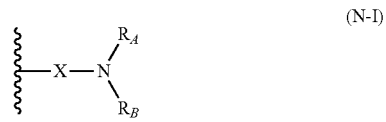

(N-I)

in which each of R$_A$ and R$_B$ independently represents a hydrogen atom or an organic group; and X represents a single bond or a connecting group;

provided that at least two of R$_A$, R$_B$ and X may be bonded to each other to thereby form a ring.

[10] The negative resist composition according to any one of items [1] to [8], wherein the onium salt compound (A) is expressed by general formula (N-II) below,

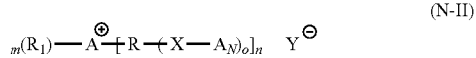

(N-II)

in which

A represents a sulfur atom or an iodine atom;

R$_1$ represents a hydrogen atom or an organic group, provided that when there are a plurality of R$_1$s, they may be identical to or different from each other;

R represents a (o+1)-valent organic group, provided that when there are a plurality of R's, they may be identical to or different from each other;

X represents a single bond or a connecting group, provided that when there are a plurality of X's, they may be identical to or different from each other;

A$_N$ represents a basic moiety containing a nitrogen atom, provided that when there are a plurality of A$_N$s, they may be identical to or different from each other;

when A is a sulfur atom, n is an integer of 1 to 3 and m is an integer satisfying the relationship m+n=3; and when A is an iodine atom, n is 1 or 2 and m is an integer satisfying the relationship m+n=2;

o is an integer of 1 to 10; and

Y$^-$ represents an anion;

provided that at least two of R$_1$, X, R and A$_N$ may be bonded to each other to thereby form a ring.

[11] The negative resist composition according to item [10], wherein in general formula (N-II) above, at least one of n R's is an aromatic hydrocarbon group, and X in at least one of o —(X-A$_N$) groups bonded to the at least one aromatic hydrocarbon group is a connecting group whose portion of bonding to the aromatic hydrocarbon group is a carbon atom.

[12] The negative resist composition according to any one of items [1] to [11], wherein the onium salt compound (A) is contained in an amount of 0.1 to 10 mass % based on total solids of the negative resist composition.

[13] A resist film comprising the composition of any one of items [1] to [12].

[14] A method of forming a pattern, comprising exposing the resist film of item [13] to actinic rays or radiation and developing the thus exposed film.

[15] A mask blank comprising the resist film of item [13].

[16] A method of forming a pattern, comprising exposing a mask blank comprising the resist film of item [13] to actinic rays or radiation and developing the thus exposed mask blank.

[17] The pattern forming method according to item [14] or [16], wherein the exposure to actinic rays or radiation is performed using electron beams or extreme ultraviolet.

[18] A process for manufacturing an electronic device, comprising the pattern forming method according to any one of items [14], [16] and [17].

[19] An electronic device manufactured by the process of item [18].

The present invention makes it feasible to provide a negative resist composition from which a pattern excelling in resolution (for example, resolving power, pattern shape and line edge roughness (LER)), dependence on post-exposure baking (PEB) temperature and post-exposure line width (PED) stability can be formed. The present invention further makes it feasible to provide a resist film and a method of forming a pattern using the composition. The present invention still further makes it feasible to provide a mask blank provided with the resist film. Moreover, the present invention makes it feasible to provide a process for manufacturing an electronic device, in which the above pattern forming method is included, and to provide an electronic device manufactured by the process.

DESCRIPTION OF THE INVENTION

The present invention will be described in detail below.

Herein, the term "group" or "atomic group" for which no statement is made as to substitution or nonsubstitution is to be interpreted as including not only one containing no substituent but also one containing a substituent. For example, the term "alkyl group" for which no statement is made as to substitution or nonsubstitution is to be interpreted as including not only an alkyl group containing no substituent (unsubstituted alkyl group) but also an alkyl group containing a substituent (substituted alkyl group).

In the present invention, the term "actinic rays or radiation" means, for example, brightline spectra from a mercury lamp, far ultraviolet represented by an excimer laser, extreme ultraviolet (EUV light), X-rays, particle beams such as electron beams and ion beams, or the like. In the present invention, the term "light" means actinic rays or radiation.

Moreover, herein, the term "exposure to light" unless otherwise specified means not only irradiation with light, such as a mercury lamp, far ultraviolet represented by an excimer laser, X-rays or extreme ultraviolet (EUV light), but also lithography using particle beams, such as electron beams and ion beams.

<Negative Resist Composition>

The negative resist composition of the present invention (hereinafter also referred to as "composition of the present invention") comprises [1] an onium salt compound (A) containing a nitrogen atom in its cation moiety (hereinafter also referred to as "onium salt compound (A)"), [2] a compound (B) that is configured to produce an acid when exposed to actinic rays or radiation (hereinafter also referred to as "photoacid generator (B)"), and [3] a compound (C) containing an acid-crosslinkable group (hereinafter also referred to as "crosslinking agent").

The composition of the present invention in its one form is a chemically amplified negative resist composition.

Compound (C) containing an acid-crosslinkable group may be a low molecular compound containing an acid-crosslinkable group, or alternatively a resin containing a repeating unit containing an acid-crosslinkable group. When compound (C) is a low molecular compound, the resist composition of the present invention must further comprise a compound containing a phenolic hydroxyl group, which compound is a resin. In contrast, when compound (C) is a resin containing a repeating unit containing an acid-crosslinkable group, it is optional for the resist composition of the present invention to contain a compound containing a phenolic hydroxyl group.

The composition of the present invention by virtue of the incorporation of onium salt compound (A) therein can form a negative pattern excelling in pattern shape and improved in T-top shape and bridging. Onium salt compound (A) ensures a smaller evaporation amount during exposure to light and post-exposure bake than that exhibited by conventional simple amines. Therefore, the composition of the present invention comprising onium salt compound (A) can form a negative pattern excelling in dependence on post-exposure baking (PEB) temperature and post-exposure line width (PED) stability. Moreover, as compared with an onium salt compound containing a nitrogen atom in its anion moiety, the onium salt compound containing a nitrogen atom in its cation moiety not only excels in the decomposition efficiency during exposure to light but also allows the acid compound produced as a result of the decomposition to position very close to the nitrogen atom. Therefore, it is presumed that a neutralization reaction promptly proceeds, so that a pattern excelling in LER performance can be formed.

The present invention by virtue of the use of compound (C) containing an acid-crosslinkable group in combination with onium salt compound (A) realizes striking improvement of T-top shape and striking enhancements of pattern shape and resolution. It is presumed that the reason therefor is that the incorporation of compound (C) in the composition facilitates the distribution of onium salt compound (A) in the vicinity of the surface of the resist film.

The composition of the present invention in its one form is a composition appropriately used for exposure to electron beams or extreme ultraviolet.

Further components that can be incorporated in the composition of the present invention include [4] a compound (D) containing a phenolic hydroxyl group, [5] a basic compound, [6] a surfactant, [7] an organic carboxylic acid, [8] a carboxylic acid onium salt, [9] an acid amplifier and [10] a solvent. The composition of the present invention can be used for pattern formation in accordance with, for example, the method to be described hereinafter as a "pattern forming method."

These components will be sequentially described below.

[1] Onium Salt Compound (A) Containing a Nitrogen Atom in its Cation Moiety

The composition of the present invention comprises an onium salt compound containing a nitrogen atom in its cation moiety (hereinafter also referred to as "compound (A)").

As the onium salt compound, there can be mentioned, for example, a diazonium salt compound, a phosphonium salt compound, a sulfonium salt compound, an iodonium salt compound or the like. Among these, a sulfonium salt compound and an iodonium salt compound are preferred. A sulfonium salt compound is more preferred.

This onium salt compound typically comprises a basic moiety containing a nitrogen atom in its cation moiety. Herein, the "basic moiety" refers to the portion of the cation moiety of compound (A) whose conjugate acid exhibits a pKa value of −3 or higher. This pKa value is preferably in the range of −3 to 15, more preferably 0 to 15. The pKa value refers to a value calculated by ACD/ChemSketch (ACD/Labs 8.00 Release Product Version: 8.08).

This basic moiety comprises, for example, a structure selected from the group consisting of amino groups (each a group resulting from the removal of one hydrogen atom from ammonia, a primary amine or a secondary amine; same hereinafter) and nitrogen-containing heterocyclic groups. It is preferred for the amino group to be an aliphatic amino group. The aliphatic amino group refers to a group resulting from the removal of one hydrogen atom from an aliphatic amine.

In this structure, it is preferred for all the atoms adjacent to nitrogen atom contained in the structure to be carbon atoms or hydrogen atoms from the viewpoint of basicity increase. Also, from the viewpoint of basicity increase, it is preferred that no electron withdrawing functional group (a carbonyl group, a sulfonyl group, a cyano group, a halogen atom, etc.) be directly bonded to the nitrogen atom.

The onium salt compound may contain two or more of the above basic moieties.

When the cation moiety of compound (A) contains an amino group, it is preferred for the cation moiety to comprise a partial structure expressed by general formula (N-I) below,

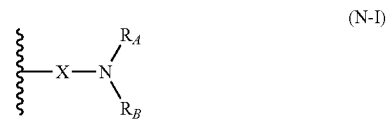

(N-I)

In the formula, each of $R_A$ and $R_B$ independently represents a hydrogen atom or an organic group.

X represents a single bond or a connecting group.

At least two of $R_A$, $R_B$ and X may be bonded to each other to thereby form a ring.

As the organic group represented by $R_A$ or $R_B$, there can be mentioned, for example, an alkyl group, a cycloalkyl group, an alkenyl group, an aryl group, a heterocyclic hydrocarbon group, an alkoxycarbonyl group, a lactone group or the like.

Substituents may be introduced in these groups. The substituents include an alkyl group, a cycloalkyl group, an alkoxy group, an alkoxycarbonyl group, a carboxyl group, a halogen atom, a hydroxyl group, a cyano group and the like.

The alkyl group represented by $R_A$ or $R_B$ may be in the form of a linear or branched chain. This alkyl group preferably has 1 to 50 carbon atoms, more preferably 1 to 30 carbon atoms and further more preferably 1 to 20 carbon atoms. As such an alkyl group, there can be mentioned, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a 2-ethylhexyl group or the like.

The cycloalkyl group represented $R_A$ or $R_B$ may be monocyclic or polycyclic. This cycloalkyl group is preferably a monocycloalkyl group having 3 to 8 carbon atoms, such as a cyclopropyl group, a cyclopentyl group or a cyclohexyl group, or the like.

The alkenyl group represented by $R_A$ or $R_B$ may be in the form of a linear or branched chain. This alkenyl group preferably has 2 to 50 carbon atoms, more preferably 2 to 30 carbon atoms and further more preferably 3 to 20 carbon atoms. As such an alkyl group, there can be mentioned, for example, a vinyl group, an allyl group, a styryl group or the like.

The aryl group represented $R_A$ or $R_B$ preferably has 6 to 14 carbon atoms. As such a group, there can be mentioned, for example, a phenyl group, a naphthyl group or the like.

The heterocyclic hydrocarbon group represented $R_A$ or $R_B$ preferably has 5 to 20 carbon atoms, more preferably 6 to 15 carbon atoms. The heterocyclic hydrocarbon group may be aromatic or non-aromatic. It is preferred for the heterocyclic hydrocarbon group to be aromatic.

The heterocycle contained in this group may be monocyclic or polycyclic. As the heterocycle, there can be mentioned, for example, an imidazole ring, a pyridine ring, a pyrazine ring, a pyrimidine ring, a pyridazine ring, a 2H-pyrrole ring, a 3H-indole ring, 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isooxazole ring or a benzothiazole ring.

The lactone group represented by $R_A$ or $R_B$ is, for example, a lactone group of 5 to 7-membered ring, which may be one resulting from the condensation of a lactone group of 5 to 7-membered ring with another cyclic structure effected in a fashion to form a bicyclo structure or spiro structure. In particular, the groups with the following structures are preferred.

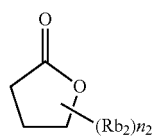

LC1-1

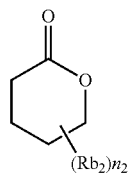

LC1-2

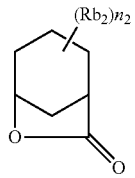

LC1-3

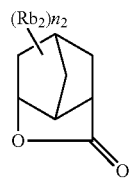

LC1-4

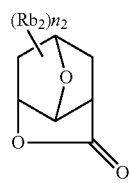

LC1-5

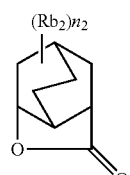

LC1-6

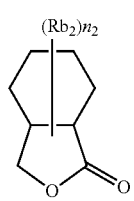

LC1-7

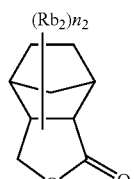

LC1-8

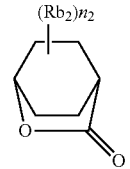

LC1-9

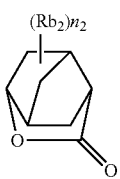
LC1-10

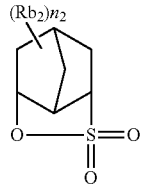
SL1-1

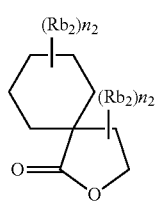
LC1-11

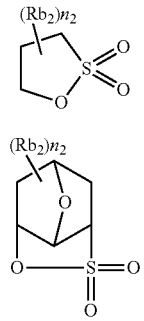
SL1-2

SL1-3

LC1-12

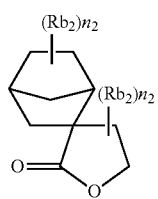
LC1-13

A substituent (Rb$_2$) is optionally introduced in the lactone group. As preferred substituents (Rb$_2$), there can be mentioned those set forth above as the substituents introducible in R$_A$ and R$_B$. When n$_2$ is 2 or greater, the plurality of introduced substituents (Rb$_2$) may be identical to or different from each other. Further, the plurality of introduced substituents (Rb$_2$) may be bonded to each other to thereby form a ring.

As the connecting group represented by X, there can be mentioned, for example, a linear or branched-chain alkylene group, a cycloalkylene group, an ether bond, an ester bond, an amide bond, a urethane bond, a urea bond, a group comprised of a combination of two or more of these, or the like. X is preferably a single bond, an alkylene group, a group comprised of a combination of an alkylene group and an ether bond, or a group comprised of a combination of an alkylene group and an ester bond. The number of atoms constructing the connecting group represented by X is preferably 20 or less, more preferably 15 or less. Each of the above linear or branched-chain alkylene group and cycloalkylene group preferably has 8 or less carbon atoms, and a substituent may be introduced therein. The substituent is preferably one having 8 or less carbon atoms. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like.

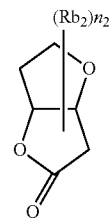
LC1-14

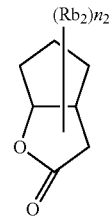
LC1-15

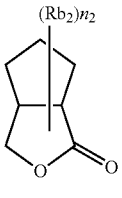
LC1-16

At least two of R$_A$, R$_B$ and X may be bonded to each other to thereby form a ring. The number of carbon atoms constructing the ring is preferably 4 to 20, and the ring may be monocyclic or polycyclic. This ring within the same may contain an oxygen atom, a sulfur atom, a nitrogen atom, an ester bond, an amide bond or a carbonyl group

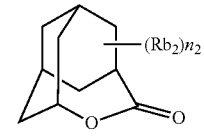

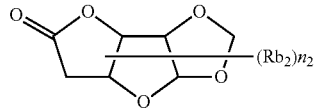
LC1-17

When the cation moiety of compound (A) contains a nitrogen-containing heterocyclic group, the nitrogen-containing heterocyclic group may be one exhibiting aromaticity, or one exhibiting no aromaticity. The nitrogen-containing heterocyclic group may be monocyclic or polycyclic. The nitrogen-containing heterocyclic group is preferably a group containing a piperidine ring, a morpholine ring, a pyridine ring, an imidazole ring, a pyrazine ring, a pyrrole ring or a pyrimidine ring.

Onium salt compound (A) is preferably expressed by general formula (N-II) below.

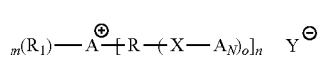 (N-II)

In the formula,

A represents a sulfur atom or an iodine atom.

$R_1$ represents a hydrogen atom or an organic group, provided that when there are a plurality of $R_1$s, they may be identical or different from each other.

R represents a (o+1)-valent organic group, provided that when there are a plurality of R's, they may be identical or different from each other.

X represents a single bond or a connecting group, provided that when there are a plurality of X's, they may be identical or different from each other.

$A_N$ represents a basic moiety containing a nitrogen atom, provided that when there are a plurality of $A_N$s, they may be identical or different from each other.

When A is a sulfur atom, n is an integer of 1 to 3 and m is an integer satisfying the relationship m+n=3.

When A is an iodine atom, n is 1 or 2 and m is an integer satisfying the relationship m+n=2.

In the formula, o is an integer of 1 to 10.

$Y^-$ represents an anion (details thereof will be described hereinafter as the anion moiety of compound (A)).

At least two of $R_1$, X, R and $A_N$ may be bonded to each other to thereby form a ring.

As the (o+1)-valent organic group represented by R, there can be mentioned, for example, a chain (linear or branched) or cyclic aliphatic hydrocarbon group, a heterocyclic hydrocarbon group or an aromatic hydrocarbon group. An aromatic hydrocarbon group is preferred. When R is an aromatic hydrocarbon group, bonding is preferably effected at the p-position (1,4-position) of the aromatic hydrocarbon group.

The connecting group represented by X is the same as that represented by X of general formula (N-I) above. Particular examples thereof are also the same.

The basic moiety represented by $A_N$ is the same as the "basic moiety" contained in the cation moiety of compound (A) mentioned above. For example, the basic moiety may comprise an amino group or a nitrogen-containing heterocyclic group. When the basic moiety comprises an amino group, the amino group is, for example, any of —N($R_A$)($R_B$) groups appearing in general formula (N-I) above.

The organic group represented by $R_1$ is, for example, an alkyl group, an alkenyl group, an alicyclic group, an aromatic hydrocarbon group or a heterocyclic hydrocarbon group. When m=2, two $R_1$s may be bonded to each other to thereby form a ring. A substituent may further be introduced in each of these groups and ring.

The alkyl group represented by $R_1$ may be in the form of a linear or branched chain. This alkyl group preferably has 1 to 50 carbon atoms, more preferably 1 to 30 carbon atoms and further more preferably 1 to 20 carbon atoms. As such an alkyl group, there can be mentioned, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group or a 2-ethylhexyl group.

The alkenyl group represented by $R_1$ may be in the form of a linear or branched chain. This alkenyl group preferably has 2 to 50 carbon atoms, more preferably 2 to 30 carbon atoms and further more preferably 3 to 20 carbon atoms. As such an alkenyl group, there can be mentioned, for example, a vinyl group, an allyl group or a styryl group.

The alicyclic group represented by $R_1$ is, for example, a cycloalkyl group. The cycloalkyl group may be monocyclic or polycyclic. This alicyclic group is preferably a monocycloalkyl group having 3 to 8 carbon atoms, such as a cyclopropyl group, a cyclopentyl group or a cyclohexyl group.

The aromatic hydrocarbon group represented by $R_1$ is preferably one having 6 to 14 carbon atoms. As such a group, there can be mentioned, for example, an aryl group, such as a phenyl group or a naphthyl group. It is preferred for the aromatic hydrocarbon group represented by $R_1$ to be a phenyl group.

The heterocyclic hydrocarbon group represented by $R_1$ may have or may not have aromaticity. It is preferred for the heterocyclic hydrocarbon group to have aromaticity.

The heterocycle contained in this group may be monocyclic or polycyclic. As the heterocycle, there can be mentioned, for example, an imidazole ring, a pyridine ring, a pyrazine ring, a pyrimidine ring, a pyridazine ring, a 2H-pyrrole ring, a 3H-indole ring, 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isooxazole ring or a benzothiazole ring.

Preferably, $R_1$ is an aromatic hydrocarbon group, or two $R_1$s are bonded to each other to thereby form a ring.

The ring that may be formed by the mutual bonding of at least two of $R_1$, X, R and $A_N$ is preferably a 4 to 7-membered ring, more preferably a 5 or 6-membered ring, and most preferably a 5-membered ring. The ring within its skeleton may contain a heteroatom, such as an oxygen atom, a sulfur atom or a nitrogen atom.

When substituents are further introduced in the groups represented by $R_1$ and the rings formed by the mutual bonding of two $R_1$s, the substituents are, for example, as follows. Namely, as the substituents, there can be mentioned, for example, a halogen atom (—F, —Br, —Cl or —I), a hydroxyl group, an alkoxy group, an aryloxy group, a mercapto group, an alkylthio group, an arylthio group, an amino group, an acyloxy group, a carbamoyloxy group, an alkylsulfoxy group, an arylsulfoxy group, an acylthio group, an acylamino group, a ureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, a carbamoyl group, an alkylsulfinyl group, an arylsulfinyl group, an alkylsulfonyl group, an arylsulfonyl group, a sulfo group (—$SO_3H$) or its conjugated base group (referred to as a sulfonato group), an alkoxysulfonyl group, an aryloxysulfonyl group, a sulfinamoyl group, a phosphono group (—$PO_3H_2$) or its conjugated base group (referred to as a phosphonato group), a phosphonooxy group (—$OPO_3H_2$) or its conjugated base group (referred to as a phosphonatooxy group), a cyano group, a nitro group, an aryl group, an alkenyl group, an alkynyl group, a heterocyclic group, a silyl group and an alkyl group.

Among these substituents, a hydroxyl group, an alkoxy group, a cyano group, an aryl group, an alkenyl group, an alkynyl group, an alkyl group and the like are preferred.

In general formula (N-II), o is preferably an integer of 1 to 4, more preferably 1 or 2, and further more preferably 1.

With respect to compound (A) expressed by general formula (N-II), in its one form, it is preferred for at least one of n R's in the formula to be an aromatic hydrocarbon group. Preferably, X in at least one of o —(X-$A_N$) groups bonded to at least one of the aromatic hydrocarbon groups is a connecting group whose portion of bonding to the aromatic hydrocarbon group is a carbon atom.

Namely, in compound (A) in this form, the basic moiety represented by $A_N$ is bonded via the carbon atom directly bonded to the aromatic hydrocarbon group represented by R to the aromatic hydrocarbon group.

The aromatic hydrocarbon group represented by R may contain a heterocycle as the aromatic ring in the aromatic hydrocarbon group. This aromatic ring may be monocyclic or polycyclic.

This aromatic ring group preferably has 6 to 14 carbon atoms. As such a group, there can be mentioned, for example, an aryl group, such as a phenyl group, a naphthyl group or an anthryl group. When the aromatic ring group contains a heterocycle, as the heterocycle, there can be mentioned, for example, a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring or a triazole ring.

The aromatic hydrocarbon group represented by R is preferably a phenyl group or a naphthyl group, most preferably a phenyl group.

A substituent other than the groups of formula: —(X-$A_N$) to be described hereinafter may further be introduced in the aromatic hydrocarbon group represented by R. As the substituent, use can be made of, for example, any of those set forth above in connection with $R_1$.

In this form, the connecting group represented by X appearing in at least one —(X-$A_N$) group as a substituent in the aromatic ring R is not particularly limited as long as the portion of bonding to the aromatic hydrocarbon group represented by R is a carbon atom. This connecting group comprises, for example, an alkylene group, a cycloalkylene group, an arylene group, —COO—, —CO— or a combination of these. This connecting group may comprise a combination of any of these groups with at least one member selected from the group consisting of —O—, —S—, —OCO—, —S(=O)—, —S(=O)$_2$—, —OS(=O)$_2$— and —NR'—. In the —NR'—, R' represents, for example, a hydrogen atom, an alkyl group, a cycloalkyl group or an aryl group.

The alkylene group that can be contained in the connecting group represented by X may be in the form of a linear or branched chain. The alkylene group preferably has 1 to 20 carbon atoms, more preferably 1 to 10 carbon atoms. As such an alkylene group, there can be mentioned, for example, a methylene group, an ethylene group, a propylene group or a butylene group.

The cycloalkylene group that can be contained in the connecting group represented by X may be monocyclic or polycyclic. The cycloalkylene group preferably has 3 to 20 carbon atoms, more preferably 3 to 10 carbon atoms. As such a cycloalkylene group, there can be mentioned, for example, a 1,4-cyclohexylene group.

The arylene group that can be contained in the connecting group represented by X preferably has 6 to 20 carbon atoms, more preferably 6 to 10 carbon atoms. As such an arylene group, there can be mentioned, for example, a phenylene group or a naphthylene group.

Preferably, at least one of X's is expressed by general formula (N-III) or (N-IV) below.

In the formula, each of $R_2$ and $R_3$ represents a hydrogen atom, an alkyl group, an alkenyl group, an alicyclic group, an aromatic hydrocarbon group or a heterocyclic hydrocarbon group. $R_2$ and $R_3$ may be bonded to each other to thereby form a ring. At least one of $R_2$ and $R_3$ may be bonded to E to thereby form a ring.

E represents a connecting group or a single bond.

In the formula,

J represents an oxygen atom or a sulfur atom.

E represents a connecting group or a single bond.

The groups represented by $R_2$ and $R_3$ and substituents that may further be introduced in the groups are, for example, the same as mentioned above in connection with $R_1$. Each of the ring formed by the bonding of $R_2$ and $R_3$ and the ring formed by the bonding of at least one of $R_2$ and $R_3$ to E is preferably a 4- to 7-membered ring, more preferably a 5- or 6-membered ring. Preferably, each of $R_2$ and $R_3$ independently is a hydrogen atom or an alkyl group.

The connecting group represented by E comprises, for example, an alkylene group, a cycloalkylene group, an arylene group, —COO—, —CO—, —O—, —S—, —OCO—, —S(=O)—, —S(=O)$_2$—, —OS(=O)$_2$—, —NR— or a combination of these. The above R represents, for example, a hydrogen atom, an alkyl group, a cycloalkyl group or an aryl group.

It is preferred for the connecting group represented by E to be at least one member selected from the group consisting of an alkylene bond, an ester bond, an ether bond, a thioether bond, a urethane bond

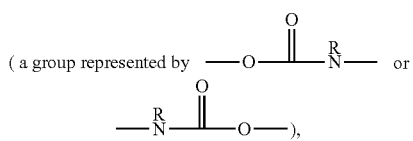

a urea bond

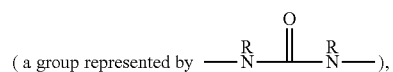

an amide bond and a sulfonamide bond. The connecting group represented by E is more preferably an alkylene bond, an ester bond or an ether bond.

Compound (A) may be a compound comprising a plurality of moieties each containing a nitrogen atom. For example, compound (A) may be a compound with the structure of general formula (N-II) in which at least one of $R_1$'s is expressed by general formula (N-I).

Compounds (A) of general formula (N-II) in one form thereof are expressed by general formula (N-V) below.

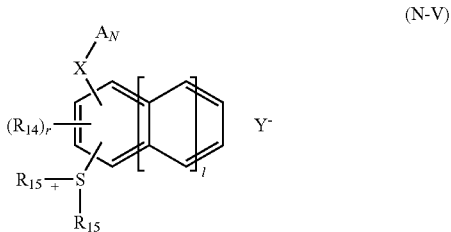

(N-V)

In the formula, X, $A_N$ and $Y^-$ are as defined above in connection with general formula (N-II). Particular examples and preferred examples thereof are also the same as set forth there.

$R_{14}$, $R_{15}$, r and l have the same meanings as those of the groups and indexes in general formula (ZI-4) expressing one form of photoacid generator (B) to be described hereinbelow. Particular examples and preferred examples thereof are also the same as set forth there.

Compounds (A) of general formula (N-II) in one form thereof are expressed by general formula (N-VI) below.

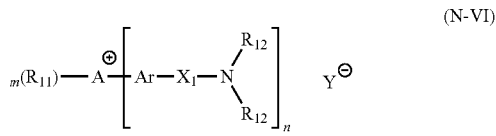

(N-VI)

In general formula (N-VI),

A represents a sulfur atom or an iodine atom.

$R_{11}$, or each of $R_{11}$s independently, represents an alkyl group, an alkenyl group, an alicyclic group, an aromatic hydrocarbon group or a heterocyclic hydrocarbon group. When m=2, two $R_{11}$s may be bonded to each other to thereby form a ring.

Ar, or each of Ar's independently, represents an aromatic hydrocarbon group.

$X_1$, or each of $X_1$s independently, represents a bivalent connecting group.

$R_{12}$, or each of $R_{12}$s independently, represents a hydrogen atom or an organic group.

When A is a sulfur atom, m is an integer of 1 to 3 and n is an integer satisfying the relationship m+n=3.

When A is an iodine atom, m is an integer of 1 or 2 and n is an integer satisfying the relationship m+n=2.

$Y^-$ represents an anion (details thereof will be described hereinafter as the anion moiety of compound (A)).

Particular examples and preferred examples of the alkyl group, alkenyl group, alicyclic group, aromatic hydrocarbon group and heterocyclic hydrocarbon group represented by $R_{11}$ are the same as set forth above in connection with $R_1$ in general formula (N-II).

Particular examples and preferred examples of the aromatic hydrocarbon groups represented by Ar are the same as set forth above in connection with R in general formula (N-II).

Particular examples and preferred examples of the bivalent connecting groups represented by $X_1$ are the same as set forth above in connection with X in general formula (N-II).

Particular examples and preferred examples of the organic groups represented by $R_{12}$ are the same as set forth above in connection with $R_A$ and $R_B$ in general formula (N-I).

A form in which X is an alkylene group (for example, a methylene group) and in which two $R_{12}$s are bonded to each other to thereby form a ring is especially preferred from the viewpoint of dependence on post-exposure bake (PEB) temperature and post-exposure line width (PED) stability.

The anion moiety of compound (A) is not particularly limited. It is preferred for the anion contained in compound (A) to be a nonnucleophilic anion. Herein, the nonnucleophilic anion refers to an anion whose capability of inducing a nucleophilic reaction is markedly low, which anion is capable of suppressing any decomposition over time by an intramolecular nucleophilic reaction. The nonnucleophilic anion enhances the temporal stability of the composition of the present invention.

As the nonnucleophilic anion, there can be mentioned, for example, a sulfonate anion, a carboxylate anion, a sulfonylimide anion, a bis(alkylsulfonyl)imide anion, a tris(alkylsulfonyl)methyl anion or the like.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety in the aliphatic sulfonate anion may be an alkyl group or a cycloalkyl group, being preferably an alkyl group having 1 to 30 carbon atoms or a cycloalkyl group having 3 to 30 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, a bornyl group or the like.

As a preferred aromatic group in the aromatic sulfonate anion, there can be mentioned an aryl group having 6 to 14 carbon atoms, for example, a phenyl group, a tolyl group, a naphthyl group or the like.

Substituents may be introduced in the alkyl group, cycloalkyl group and aryl group in the aliphatic sulfonate anion and aromatic sulfonate anion. As the substituents introducible in the alkyl group, cycloalkyl group and aryl group in the aliphatic sulfonate anion and aromatic sulfonate anion, there can be mentioned, for example, a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), a cycloalkylalkyloxyalkyloxy group (preferably having 8 to 20 carbon atoms) and the like. With respect to the aryl group or ring structure of each of these groups, as its substituent, there can further be mentioned an alkyl group (preferably having 1 to 15 carbon atoms).

As the aliphatic moiety in the aliphatic carboxylate anion, there can be mentioned any of the same alkyl groups and cycloalkyl groups as mentioned above with respect to the aliphatic sulfonate anion.

As the aromatic group in the aromatic carboxylate anion, there can be mentioned any of the same aryl groups as mentioned above with respect to the aromatic sulfonate anion.

As a preferred aralkyl group in the aralkyl carboxylate anion, there can be mentioned an aralkyl group having 6 to 12 carbon atoms, for example, a benzyl group, a phenethyl group, a naphthylmethyl group, a naphthylethyl group, a naphthylbutyl group or the like.

Substituents may be introduced in the alkyl group, cycloalkyl group, aryl group and aralkyl group in the aliphatic carboxylate anion, aromatic carboxylate anion and aralkyl carboxylate anion. As the substituents introducible in the alkyl group, cycloalkyl group, aryl group and aralkyl group in the aliphatic carboxylate anion, aromatic carboxylate anion and aralkyl carboxylate anion, there can be mentioned, for example, the same halogen atoms, alkyl groups, cycloalkyl groups, alkoxy groups, alkylthio groups, etc., as mentioned above with respect to the aromatic sulfonate anion.

As the sulfonylimide anion, there can be mentioned, for example, a saccharin anion.

The alkyl group in the bis(alkylsulfonyl)imide anion and tris(alkylsulfonyl)methyl anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As substituents introducible in these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group and the like. An alkyl group substituted with a fluorine atom is preferred. In a preferred form, two alkyl groups in the bis(alkylsulfonyl) imide anion are bonded to each other to thereby form a ring structure. In that instance, the formed ring structure is preferably a 5- to 7-membered ring.

As other nonnucleophilic anions, there can be mentioned, for example, phosphorus fluoride, boron fluoride, antimony fluoride and the like.

The nonnucleophilic anion is preferably an aliphatic sulfonate anion substituted at its α-position of sulfonic acid with a fluorine atom, an aromatic sulfonate anion substituted with a fluorine atom or a group containing a fluorine atom, a bis(alkylsulfonyl)imide anion whose alkyl group is substituted with a fluorine atom or a tris(alkylsulfonyl)methide anion whose alkyl group is substituted with a fluorine atom. More preferably, the nonnucleophilic anion is a perfluorinated aliphatic sulfonate anion having 4 to 8 carbon atoms or a benzenesulfonate anion containing a fluorine atom.

Further more preferably, the nonnucleophilic anion is a nonafluorobutanesulfonate anion, a perfluorooctanesulfonate anion, a pentafluorobenzenesulfonate anion or a 3,5-bis(trifluoromethyl)benzenesulfonate anion.

The nonnucleophilic anion is also preferably expressed by, for example, general formula (LD1) below:

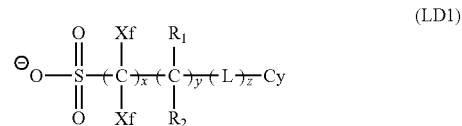

(LD1)

In the formula, each of Xf's independently represents a fluorine atom or an alkyl group substituted with at least one fluorine atom.

Each of $R_1$ and $R_2$ independently represents a hydrogen atom, a fluorine atom or an alkyl group.

L, or each of L's independently, represents a bivalent connecting group.

Cy represents a cyclic organic group;

x is an integer of 1 to 20;

y is an integer of 0 to 10; and z is an integer of 0 to 10.

Xf represents a fluorine atom or an alkyl group substituted with at least one fluorine atom. This alkyl group preferably has 1 to 10 carbon atoms, more preferably 1 to 4 carbon atoms. The alkyl group substituted with at least one fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$.

Each of $R_1$ and $R_2$ independently represents a hydrogen atom, a fluorine atom or an alkyl group. A substituent (preferably a fluorine atom) may be introduced in this alkyl group. The alkyl group preferably has 1 to 4 carbon atoms. More preferably, each of $R_1$ and $R_2$ is a perfluoroalkyl group having 1 to 4 carbon atoms. Particular examples of the substituted alkyl groups represented by $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Of these, $CF_3$ is preferred.

L represents a bivalent connecting group. As the bivalent connecting group, there can be mentioned, for example, —COO—, —OCO—, —CONH—, —CO—, —O—, —S—, —SO—, —SO$_2$—, an alkylene group, a cycloalkylene group or an alkenylene group. Of these, —CONH—, —CO— and —SO$_2$— are preferred. —CONH— and —SO$_2$— are more preferred.

Cy represents a cyclic organic group. As the cyclic organic group, there can be mentioned, for example, an alicyclic group, an aryl group or a heterocyclic group.

The alicyclic group may be monocyclic or polycyclic. As the alicyclic group that is monocyclic, there can be mentioned, for example, a monocycloalkyl group, such as a cyclopentyl group, a cyclohexyl group or a cyclooctyl group. As the alicyclic group that is polycyclic, there can be mentioned, for example, a polycycloalkyl group, such as a norbornyl group, a tricyclodecanyl group, a tetracyclodecanyl group, a tetracyclododecanyl group or an adamantyl group. Among the mentioned groups, alicyclic groups each with a bulky structure having at least 7 carbon atoms, such as a norbornyl group, a tricyclodecanyl group, a tetracyclodecanyl group, a tetracyclododecanyl group and an adamantyl group, are preferred from the viewpoint of inhibition of any in-film diffusion in the PEB (post-exposure bake) operation and enhancement of MEEF (Mask Error Enhancement Factor).

The aryl group may be monocyclic or polycyclic. As the aryl group, there can be mentioned, for example, a phenyl group, a naphthyl group, a phenanthryl group or an anthryl group. Of these, a naphthyl group exhibiting a relatively low light absorbance at 193 nm is preferred.

The heterocyclic group may be monocyclic or polycyclic. The polycyclic structure is superior in the inhibition of any acid diffusion. It is optional for the heterocyclic group to have aromaticity. As the heterocycle having aromaticity, there can be mentioned, for example, a furan ring, a thiophene ring, a benzofuran ring, a benzothiophene ring, a dibenzofuran ring, a dibenzothiophene ring or a pyridine ring. As the heterocycle having no aromaticity, there can be mentioned, for example, a tetrahydropyran ring, a lactone ring or a decahydroisoquinoline ring. It is especially preferred for the heterocycle in the heterocyclic group to be a furan ring, a thiophene ring, a pyridine ring or a decahydroisoquinoline ring. As examples of the lactone rings, there can be mentioned those set forth above by way of example in connection with $R_A$ and $R_B$ in general formula (N-1).

A substituent may be introduced in the above cyclic organic group. As the substituent, there can be mentioned, for example, an alkyl group, a cycloalkyl group, an aryl group, a hydroxyl group, an alkoxy group, an ester group, an amido group, a urethane group, a ureido group, a thioether group, a sulfonamido group or a sulfonic ester group. The alkyl group may be in the form of a linear or branched chain. It is preferred for the alkyl group to have 1 to 12 carbon atoms. The cycloalkyl group may be monocyclic or polycyclic. It is preferred for the cycloalkyl group to have 3 to 12 carbon atoms. The aryl group preferably has 6 to 14 carbon atoms.

In the formula, x is preferably 1 to 8, more preferably 1 to 4 and most preferably 1; y is preferably 0 to 4, more preferably 0; and z is preferably 0 to 8, more preferably 0 to 4.

Also, the nonnucleophilic anion is preferably expressed by, for example, general formula (LD2) below.

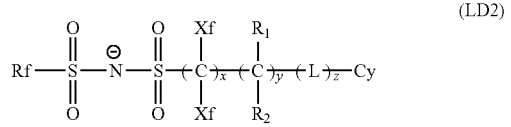

(LD2)

In general formula (LD2), Xf, $R_1$, $R_2$, L, Cy, x, y and z are as defined above in connection with general formula (LD1). Rf is a group containing a fluorine atom.

As the group containing a fluorine atom represented by Rf, there can be mentioned, for example, an alkyl group containing at least one fluorine atom, a cycloalkyl group containing at least one fluorine atom or an aryl group containing at least one fluorine atom.

These alkyl group, cycloalkyl group and aryl group may be substituted with a fluorine atom, or may be substituted with another substituent containing a fluorine atom. When Rf is a cycloalkyl group containing at least one fluorine atom or an aryl group containing at least one fluorine atom, the other substituent containing a fluorine atom can be, for example, an alkyl group substituted with at least one fluorine atom.

Further, these alkyl group, cycloalkyl group and aryl group may further be substituted with a substituent containing no fluorine atom. As this substituent, there can be mentioned, for example, any of those mentioned above with respect to Cy wherein no fluorine atom is contained.

As the alkyl group containing at least one fluorine atom represented by Rf, there can be mentioned, for example, any of those mentioned hereinbefore as the alkyl group substituted with at least one fluorine atom, represented by Xf. As the cycloalkyl group containing at least one fluorine atom represented by Rf, there can be mentioned, for example, a perfluorocyclopentyl group or a perfluorocyclohexyl group. As the aryl group containing at least one fluorine atom represented by Rf, there can be mentioned, for example, a perfluorophenyl group.

As a preferred form of the anion moiety of compound (A), there can be mentioned any of structures to be set forth hereinafter as examples of preferred anion structures of photoacid generator (B), other than the above structures of general formulae (LD1) and (LD2).

In compound (A), the fluorine content expressed by (sum of the masses of all fluorine atoms contained in the compound)/(sum of the masses of all atoms contained in the compound) is preferably 0.30 or less, more preferably 0.25 or less, further more preferably 0.20 or less, still further preferably 0.15 or less and most preferably 0.10 or less.

Nonlimiting specific examples of compounds (A) are shown below.

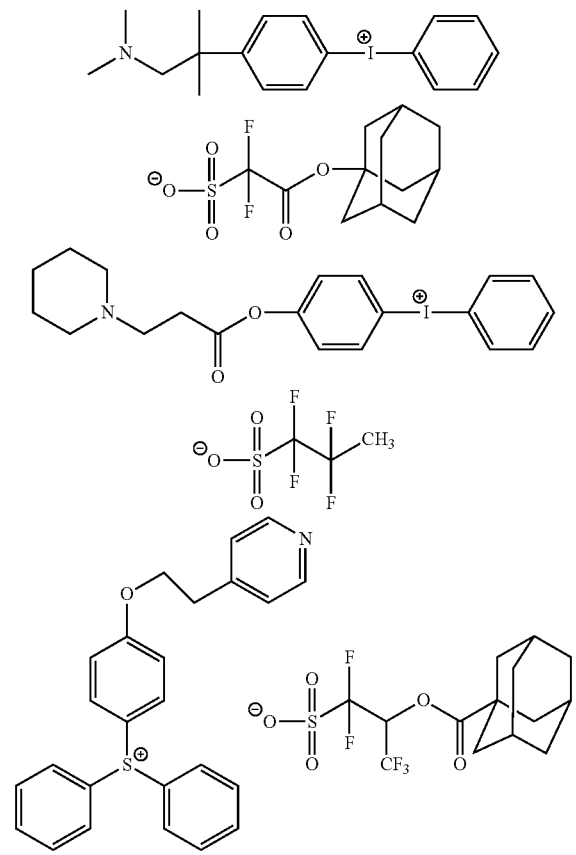

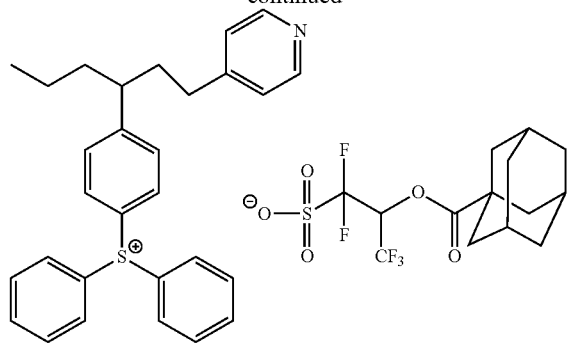
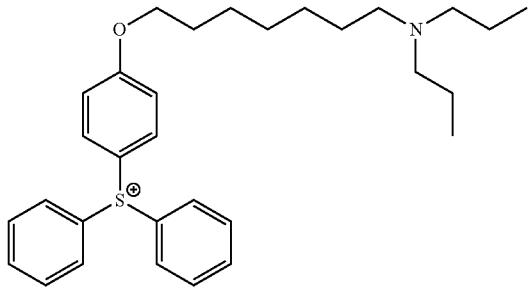
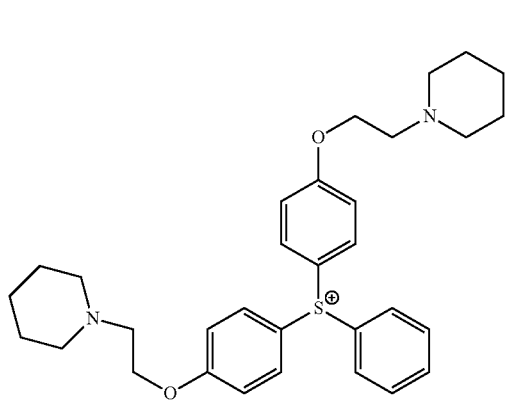
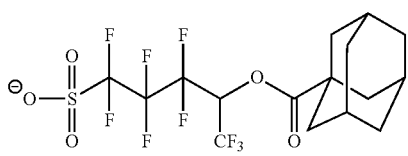
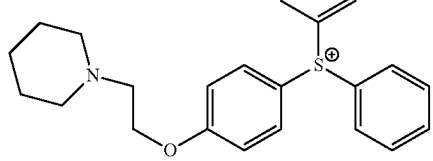
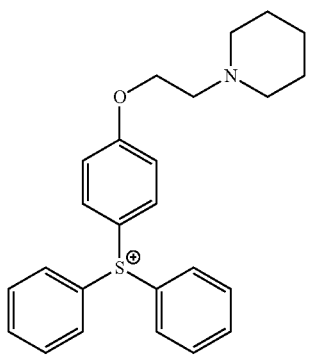
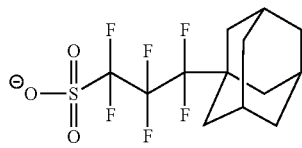
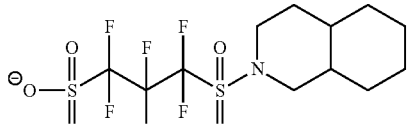
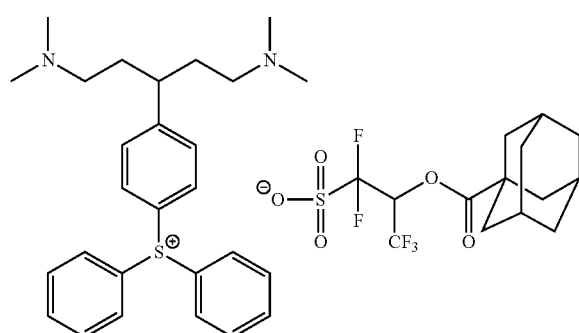
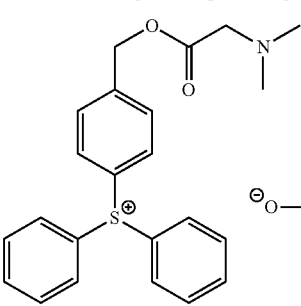
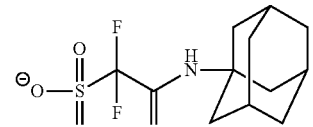
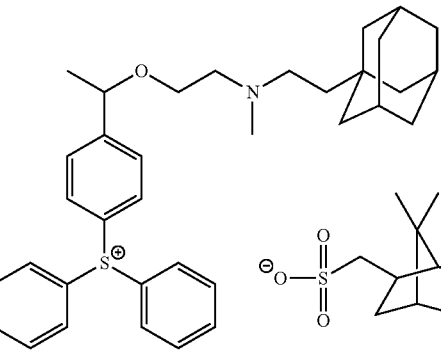
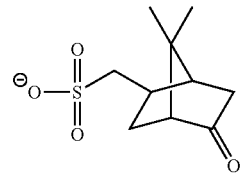

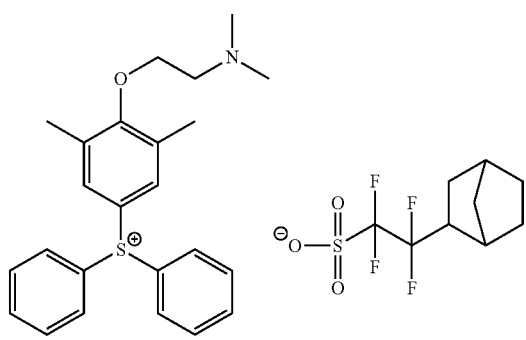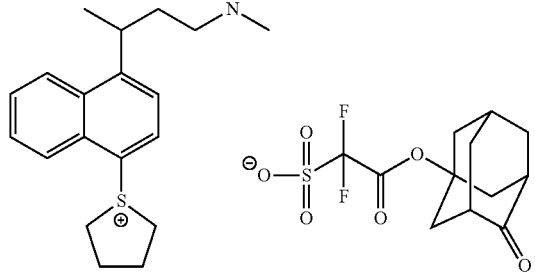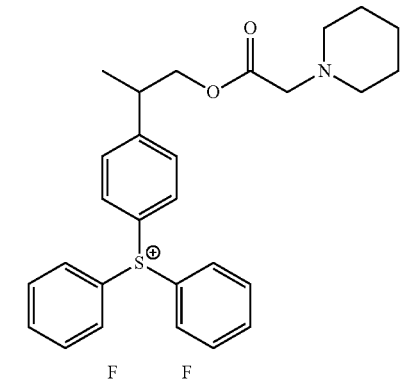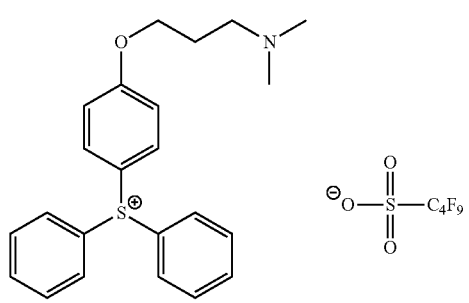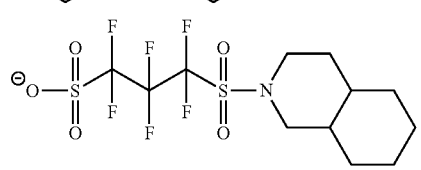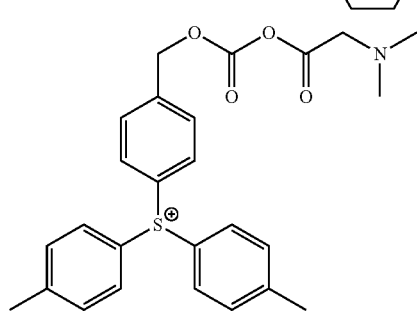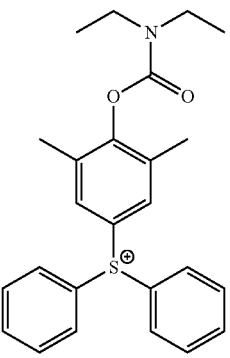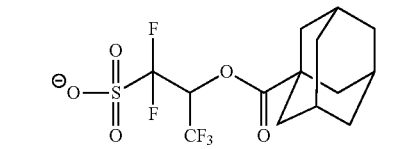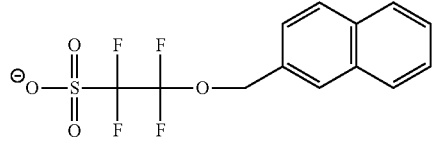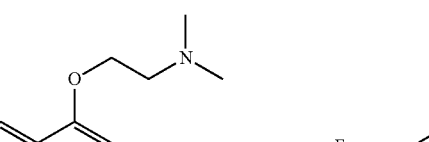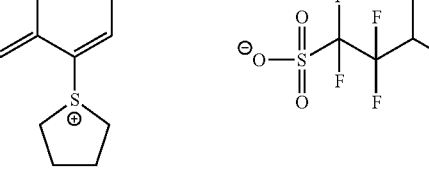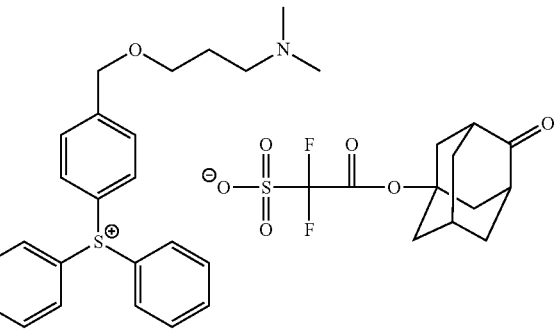

25
-continued
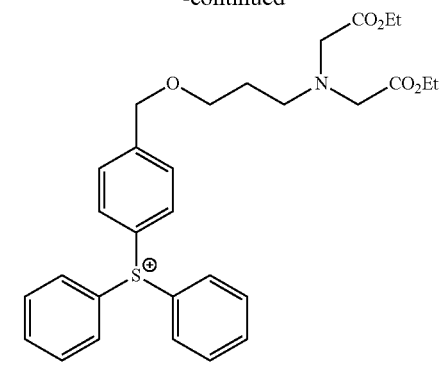
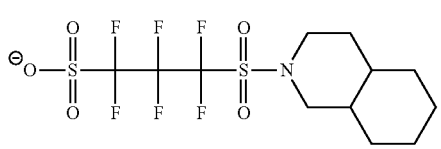
26
-continued
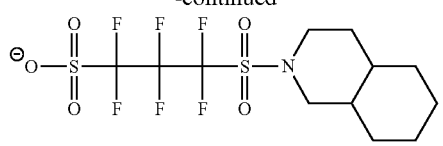
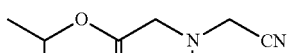
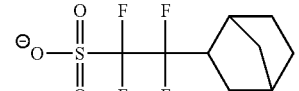
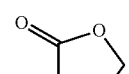
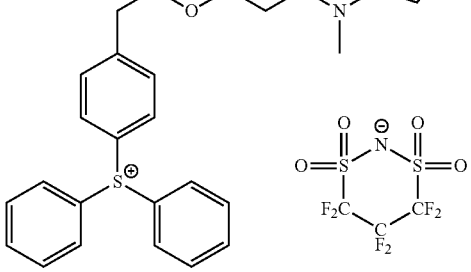
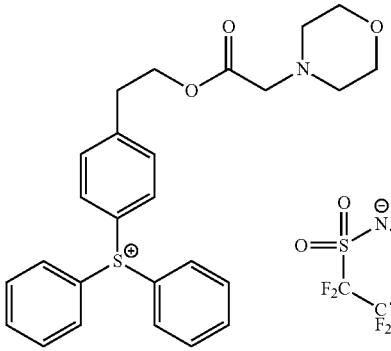
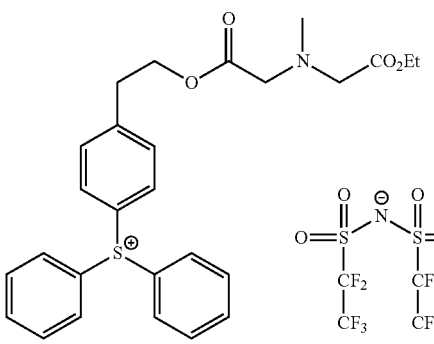

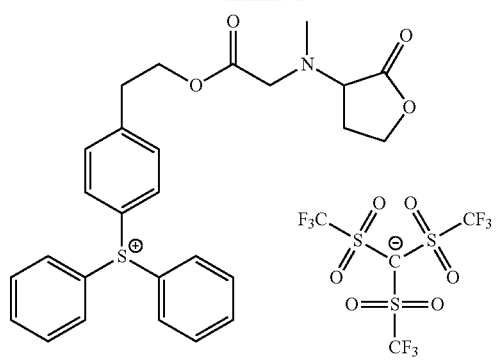
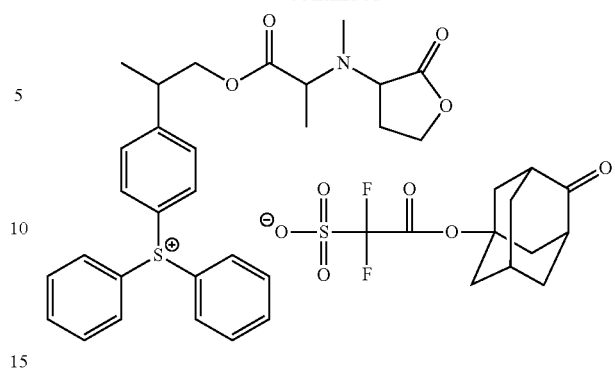
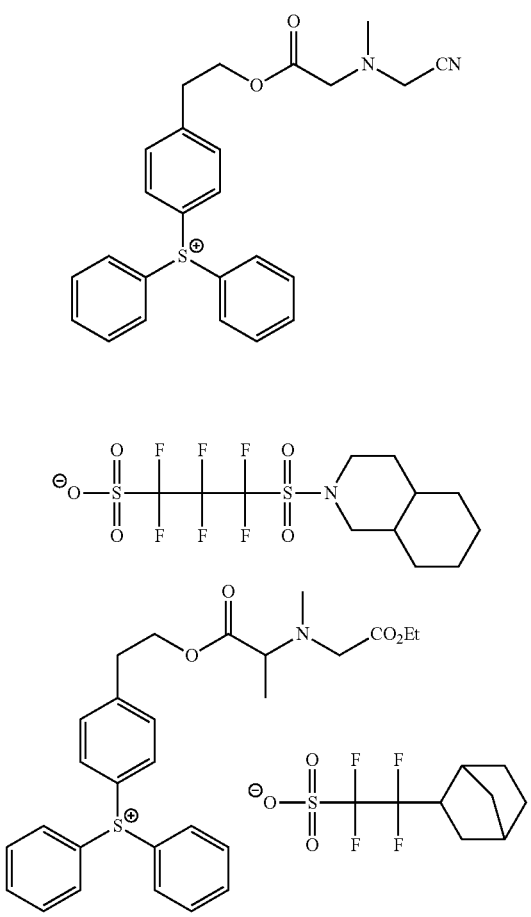
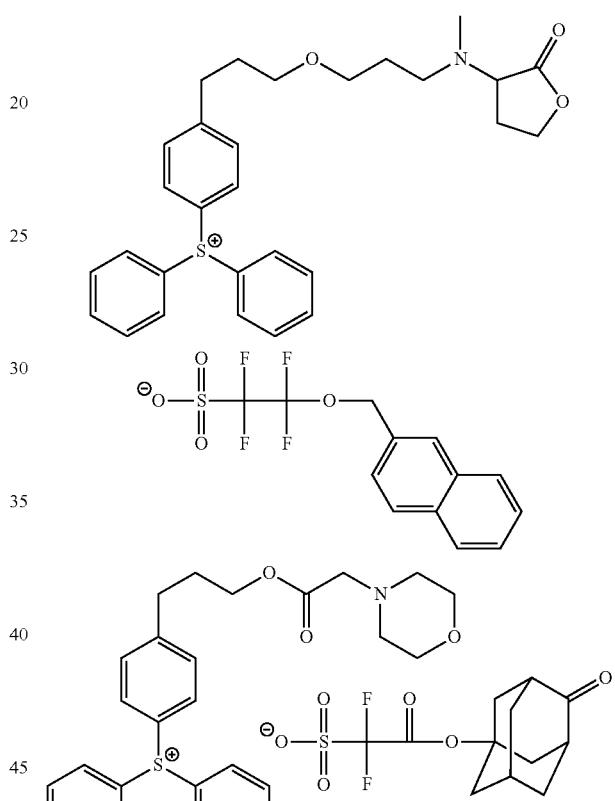
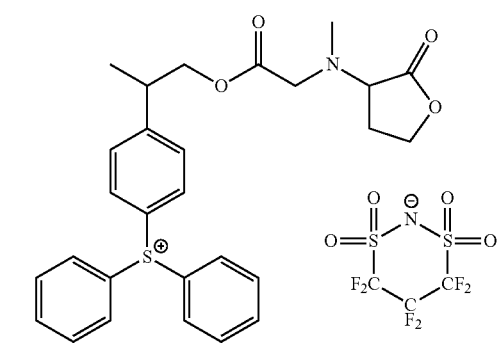
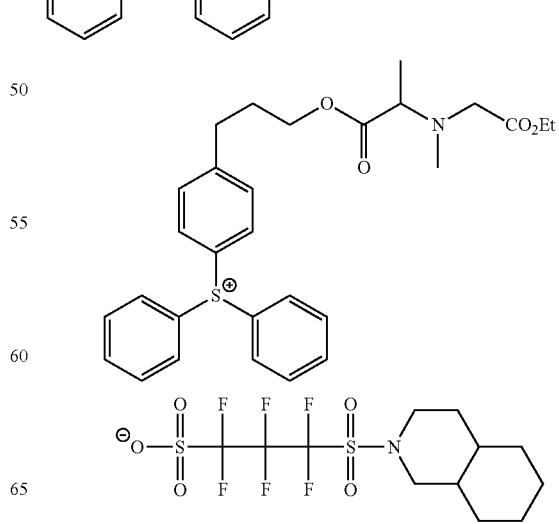

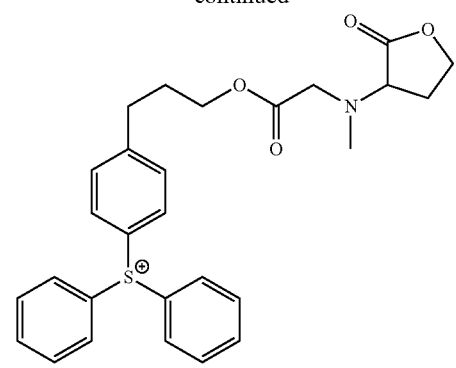
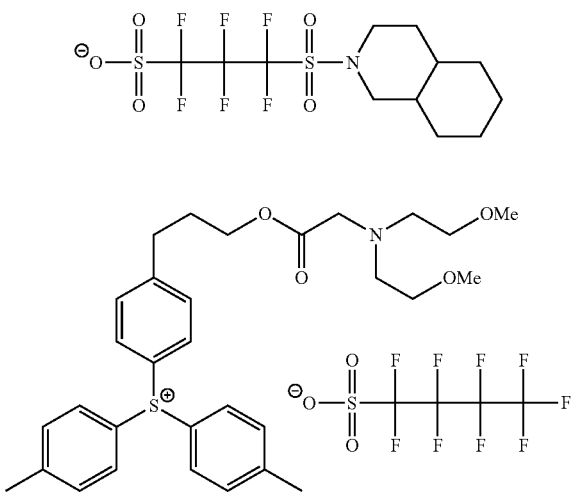
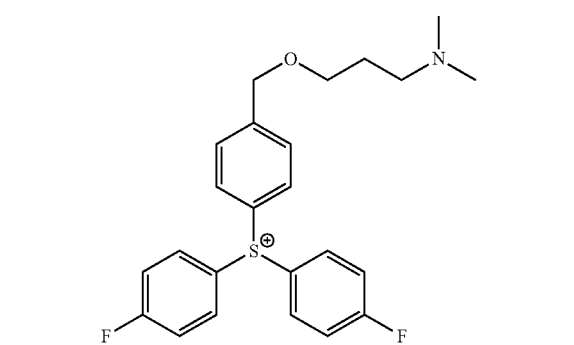
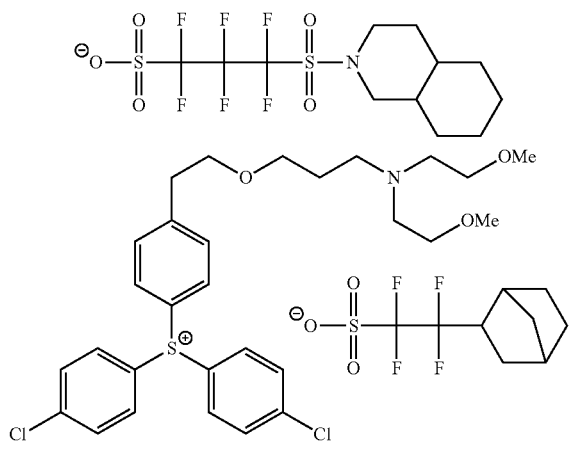
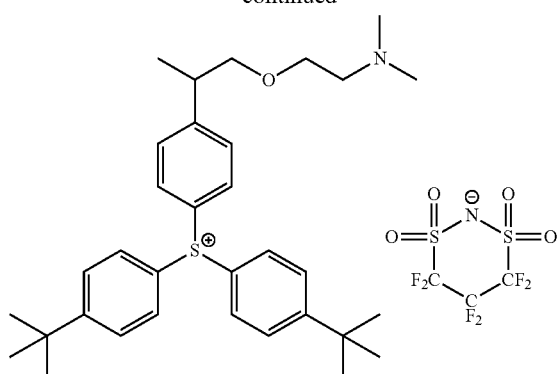
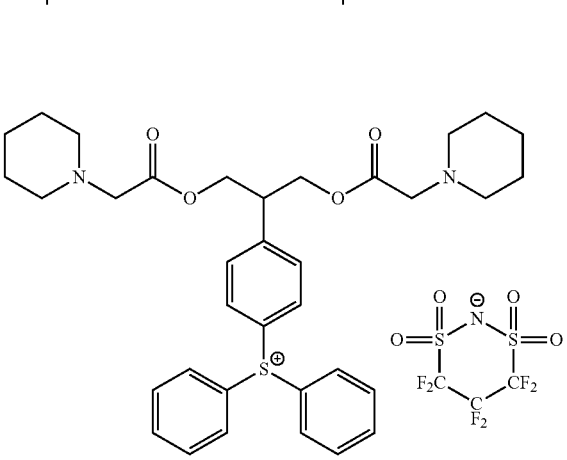
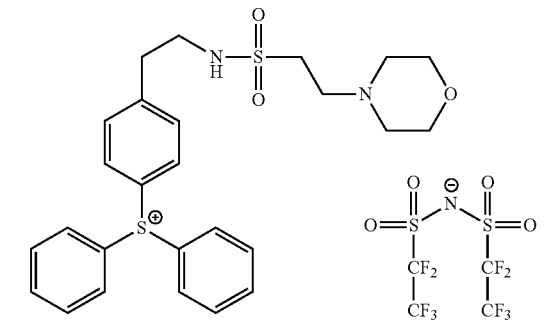
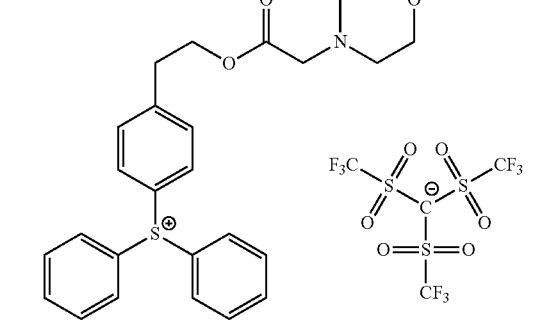

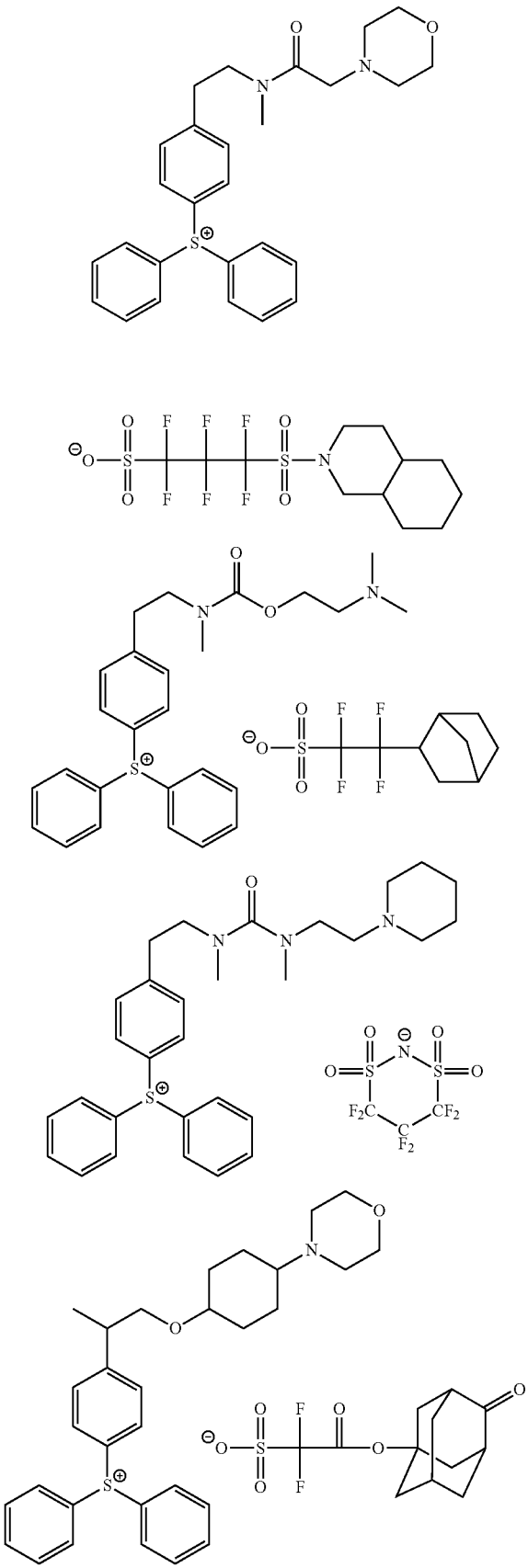
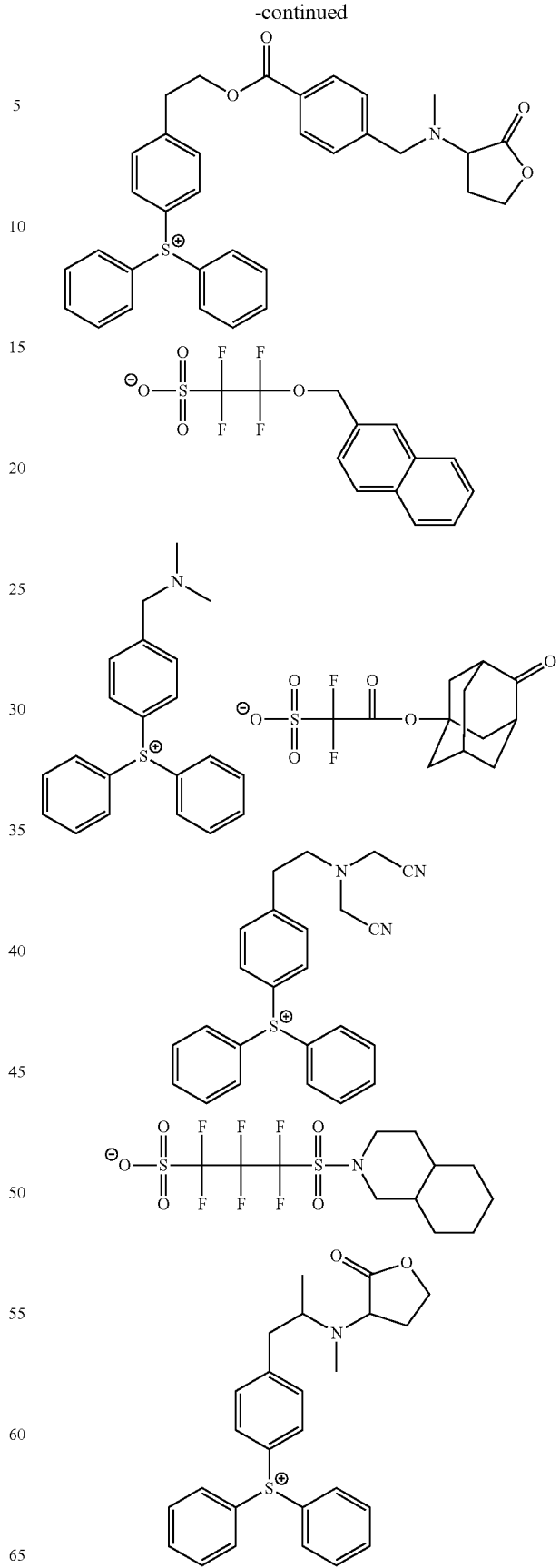

33
-continued
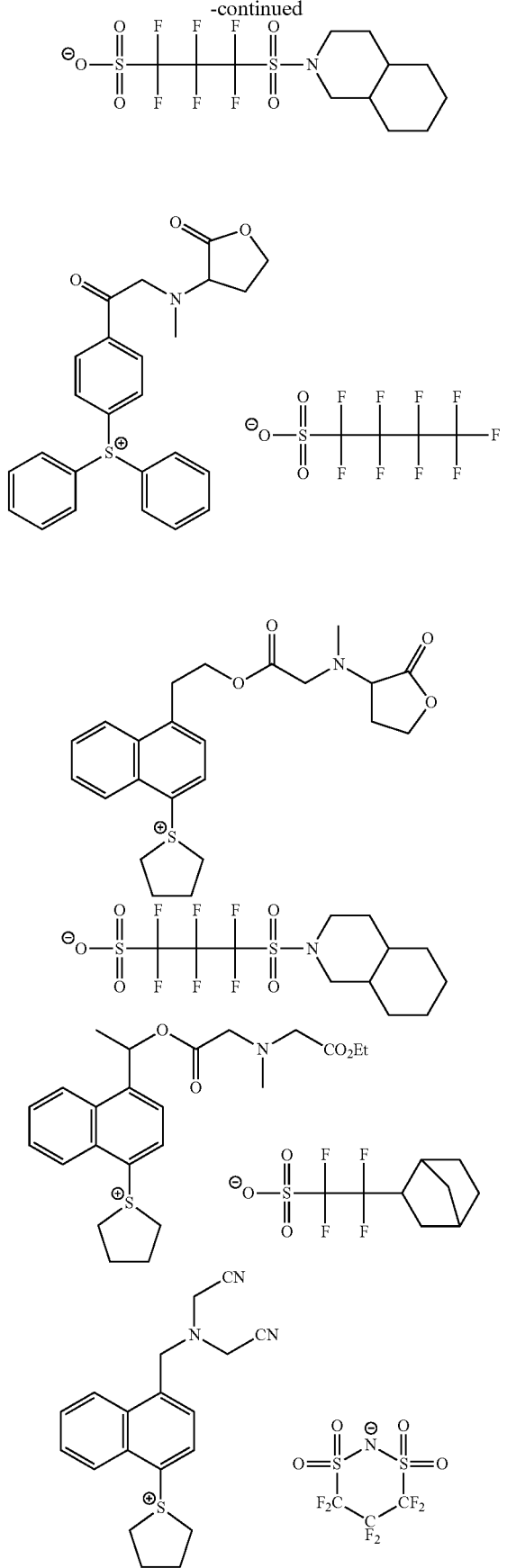
34
-continued
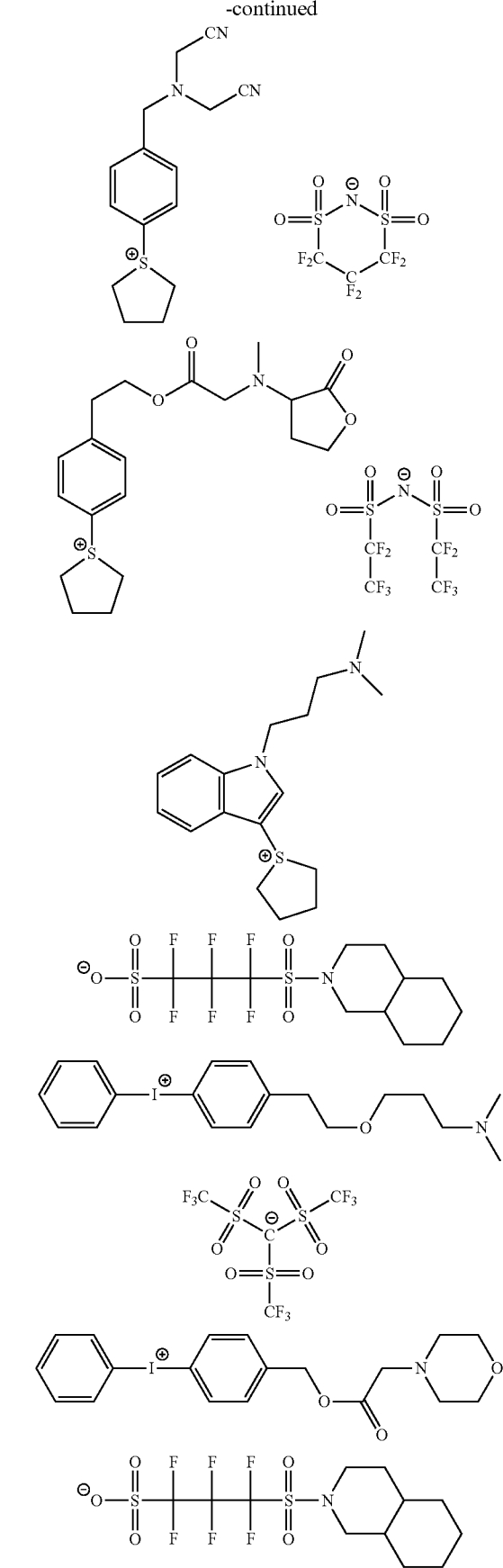

35
-continued
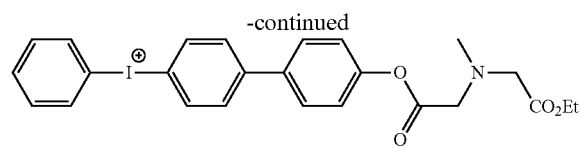
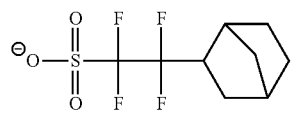
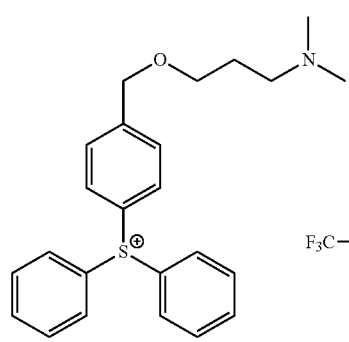
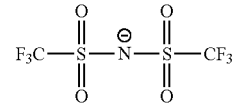
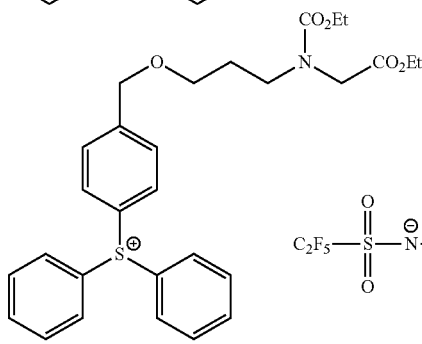
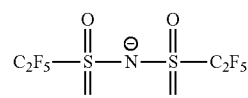
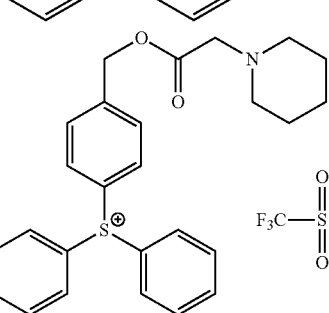
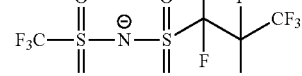
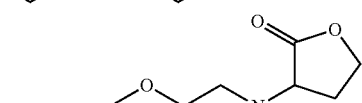
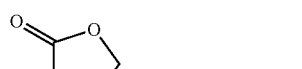
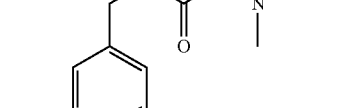
36
-continued
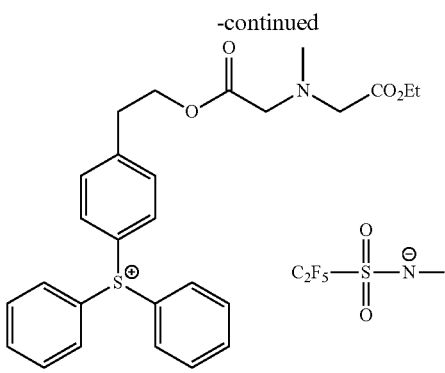
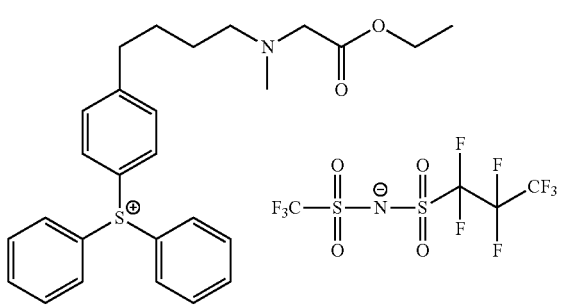
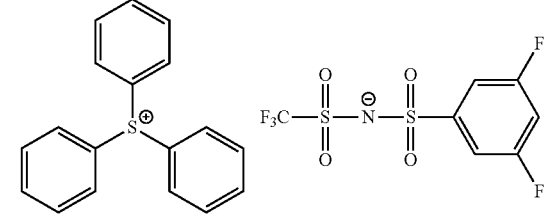
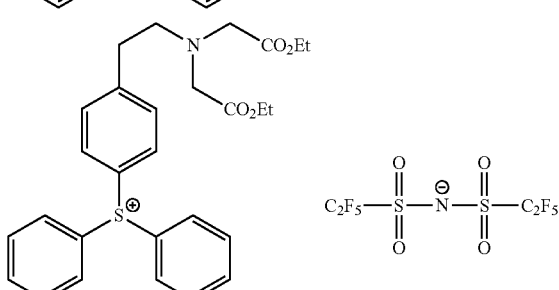
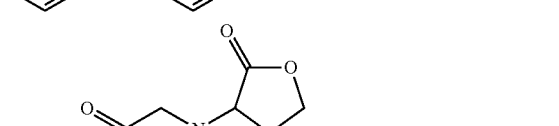
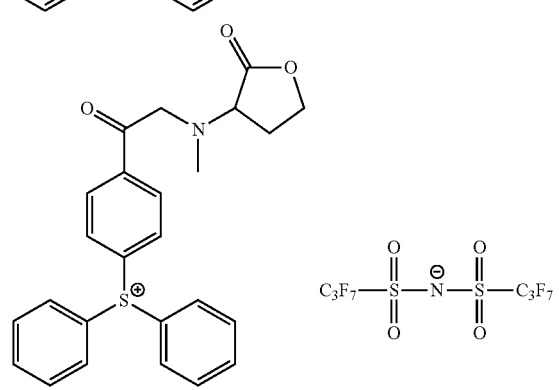

37
-continued
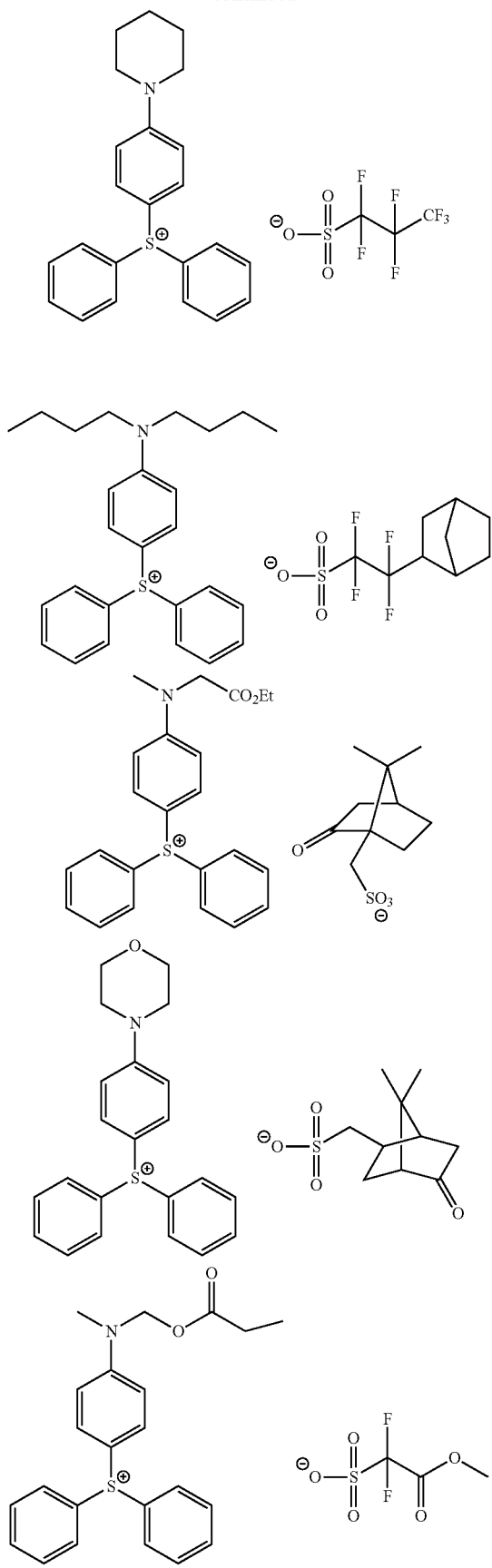
38
-continued
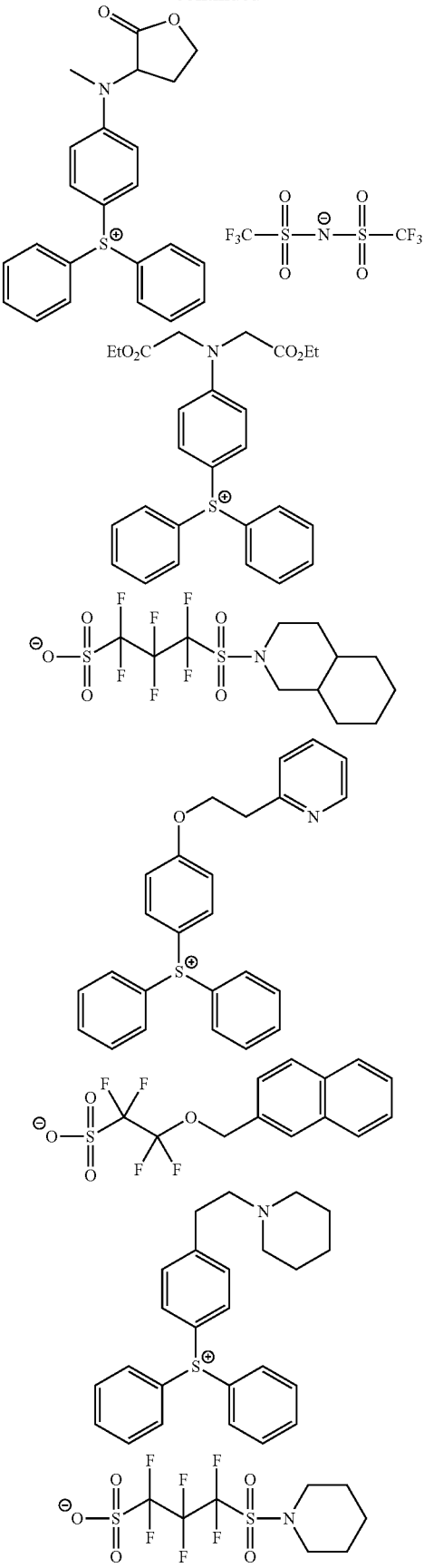

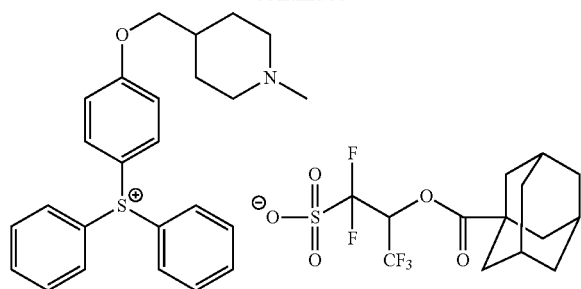
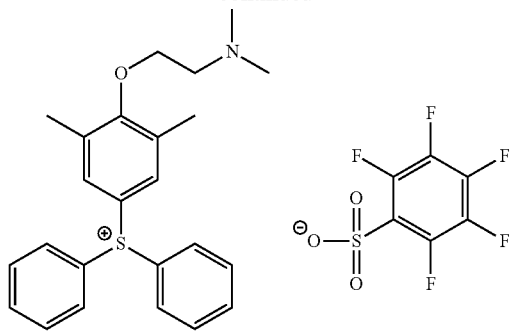
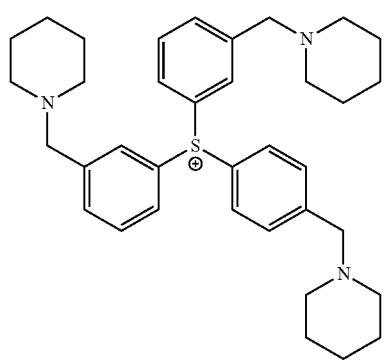
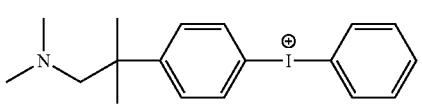
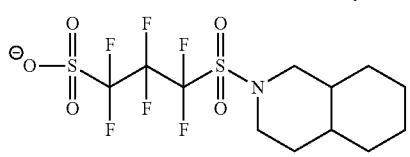
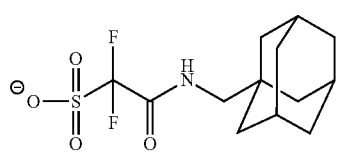
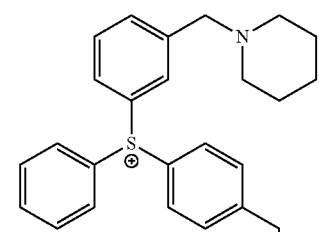
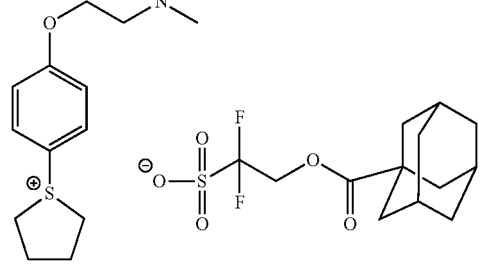
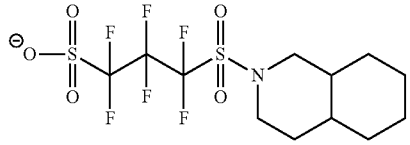
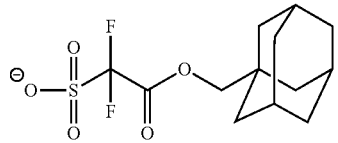
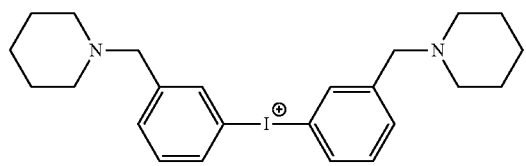
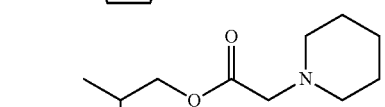
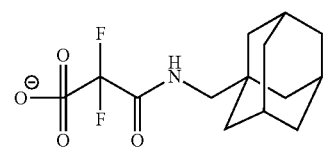
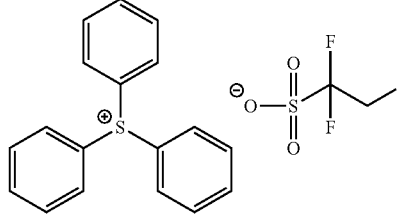

-continued

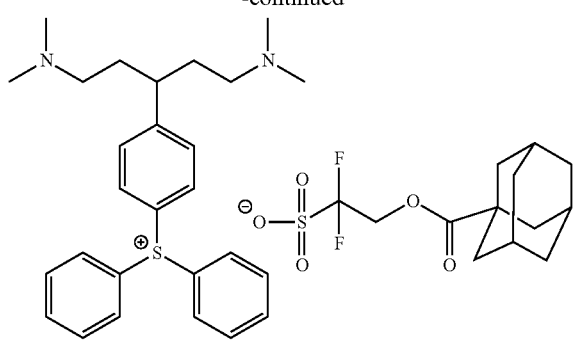
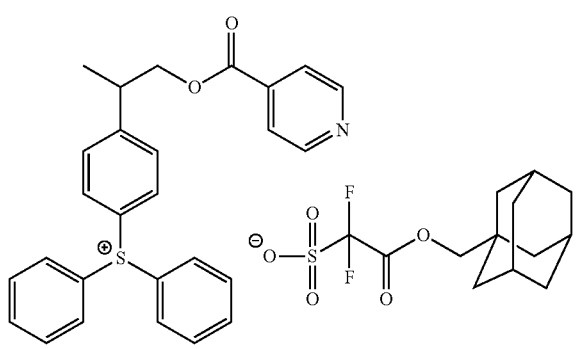
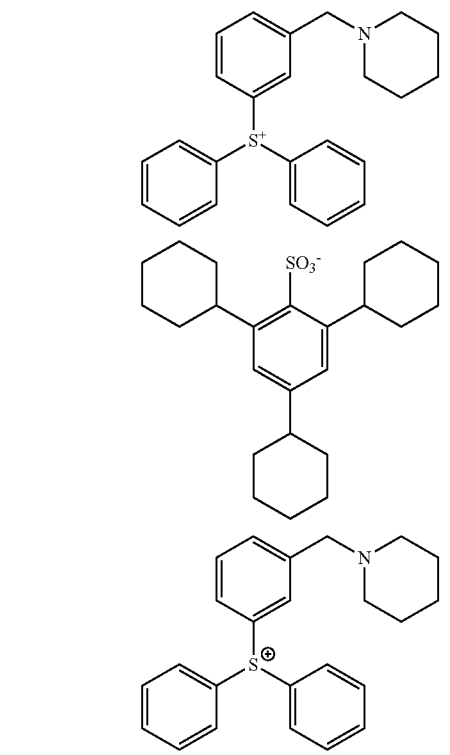
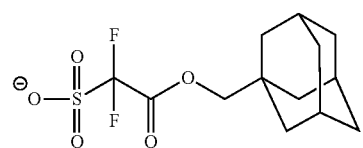

-continued

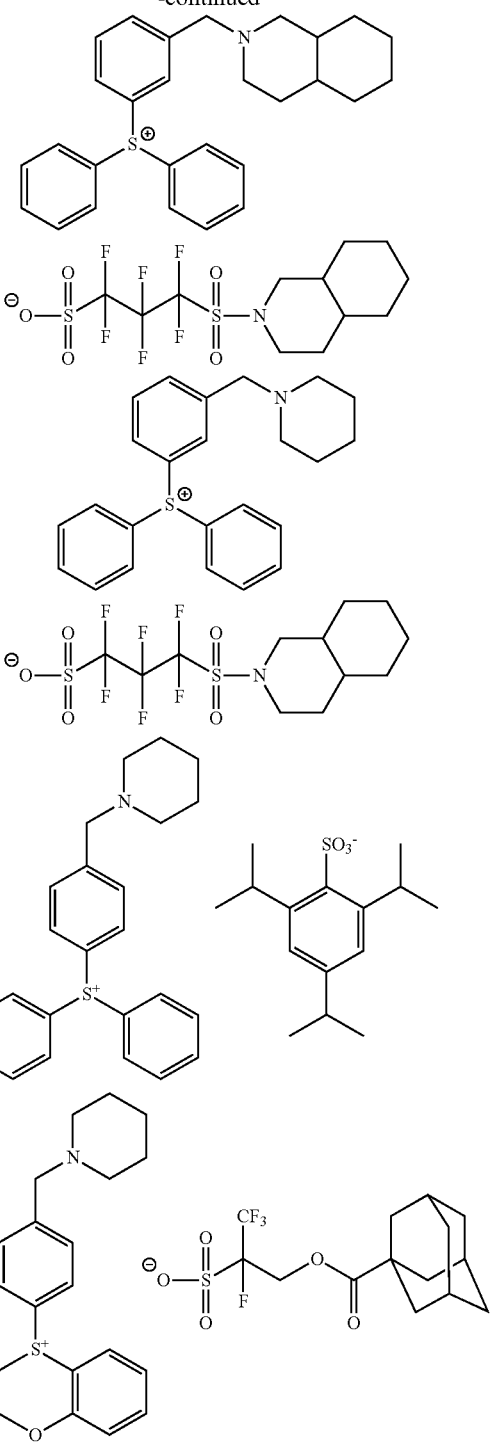

One of compounds (A) may be used alone, or two or more thereof may be used in combination.

The content of compound (A) based on the total solids of the composition is generally in the range of 0.001 to 10 mass %, preferably 0.1 to 10 mass % and more preferably 1 to 10 mass %.

From the viewpoint of resolution enhancement, it is preferred for the volume of an acid produced from compound (A) to be large.

[2] Compound (B) Configured to Produce Acid when Exposed to Actinic Rays or Radiation The composition of the present invention comprises not only the onium salt compound (A) containing a nitrogen atom in its cation moiety but also a compound (B) that is configured to produce an acid when exposed to actinic rays or radiation (hereinafter also referred to as "compound (B)" or "acid generator" or "photoacid generator").

As a preferred form of the acid generator, there can be mentioned an onium salt compound. As the onium salt compound, there can be mentioned, for example, a sulfonium salt, an iodonium salt, a phosphonium salt or the like.

Further, as another preferred form of the acid generator, there can be mentioned a compound that when exposed to actinic rays or radiation, generates a sulfonic acid, an imidic acid or a methide acid. As the acid generator in this form, there can be mentioned, for example, a sulfonium salt, an iodonium salt, a phosphonium salt, an oxime sulfonate, an imide sulfonate or the like.

The acid generator that can be used in the present invention is not limited to low-molecular compounds. Use can be made of a polymeric compound in which a group that when exposed to actinic rays or radiation, generates an acid is introduced in the principal chain or a side chain thereof.

It is preferred for the acid generator to be a compound that when exposed to electron beams or extreme ultraviolet, generates an acid.

As onium salt compounds preferred in the present invention, there can be mentioned sulfonium compounds of general formula (7) below and iodonium compounds of general formula (8) below.

(7)

(8)

In general formula (7) and general formula (8), each of $R_{a1}$, $R_{a2}$, $R_{a3}$, $R_{a4}$ and $R_{a5}$ independently represents an organic group.

$X^-$ represents an organic anion.

Sulfonium compounds of general formula (7) and iodonium compounds of general formula (8) will be described in detail below.

Each of $R_{a1}$, $R_{a2}$ and $R_{a3}$ in general formula (7) and $R_{a4}$ and $R_{a5}$ in general formula (8), as mentioned above, independently represents an organic group. Preferably, at least one of $R_{a1}$, $R_{a2}$ and $R_{a3}$, and at least either $R_{a4}$ or $R_{a5}$, is an aryl group. The aryl group is preferably a phenyl group or a naphthyl group, more preferably a phenyl group.

As the organic anion represented by $X^-$ in general formulae (7) and (8), there can be mentioned, for example, a sulfonate anion, a carboxylate anion, a bis(alkylsulfonyl) amide anion, a tris(alkylsulfonyl)methide anion or the like. The organic anion is preferably any of those of general formulae (9), (10) and (11) below, more preferably any of those of general formula (9) below.

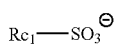

(9)

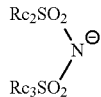

(10)

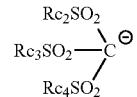

(11)

In general formulae (9), (10) and (11), each of $R_{c1}$, $R_{c2}$, $R_{c3}$ and $R_{c4}$ independently represents an organic group.

The above organic anions represented by $X^-$ correspond to a sulfonic acid, an imidic acid, a methide acid and the like that are acids generated upon exposure to actinic rays or radiation, such as electron beams or extreme ultraviolet.

As the organic groups represented by $R_{c1}$, $R_{c2}$, $R_{c3}$ and $R_{c4}$ above, there can be mentioned, for example, an alkyl group, an aryl group and a group comprised of a plurality of these connected to each other. Among these organic groups, an alkyl group substituted at its 1-position with a fluorine atom or a fluoroalkyl group and a phenyl group substituted with a fluorine atom or a fluoroalkyl group are preferred. The incorporation of a fluorine atom or a fluoroalkyl group increases the acidity of an acid generated upon exposure to light, thereby realizing a sensitivity enhancement. However, it is preferred for the end groups to contain no fluorine atom as a substituent.

In the present invention, from the viewpoint of inhibiting the diffusion of an acid after exposure into nonexposed areas to thereby attain resolution and pattern shape enhancements, it is preferred for compound (B) to be a compound capable of generating an acid (more preferably sulfonic acid) whose volume is 130 Å$^3$ or greater. More preferably, compound (B) is a compound capable of generating an acid (more preferably sulfonic acid) whose volume is 190 Å$^3$ or greater. Further more preferably, compound (B) is a compound capable of generating an acid (more preferably sulfonic acid) whose volume is 270 Å$^3$ or greater. Most preferably, compound (B) is a compound capable of generating an acid (more preferably sulfonic acid) whose volume is 400 Å$^3$ or greater. However, from the viewpoint of sensitivity and coating solvent solubility, the above volume is preferably up to 2000 Å$^3$, more preferably up to 1500 Å$^3$. The value of each of these volumes was determined by means of the software "WinMOPAC" compiled by Fujitsu Limited. Namely, first, the chemical structure of the acid generated by each of the compounds was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each of the acids was calculated.

Acid generators especially preferred in the present invention are shown below. Calculated volume values (unit Å$^3$) are noted in some of acid generator examples. Each of the calculated values means the value of the volume of an acid comprised of an anion moiety and proton bonded thereto.

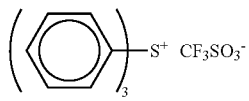

(z1)

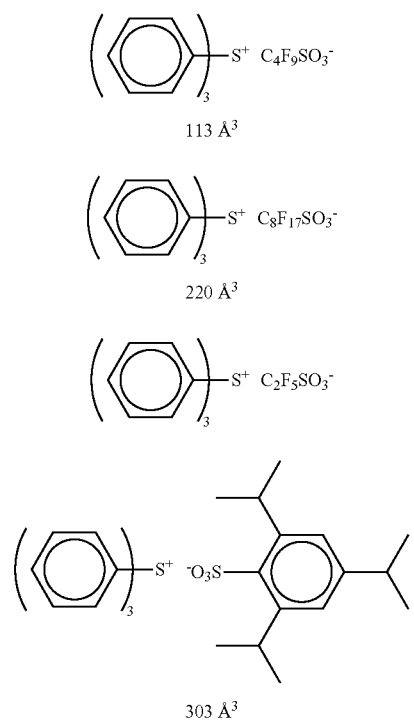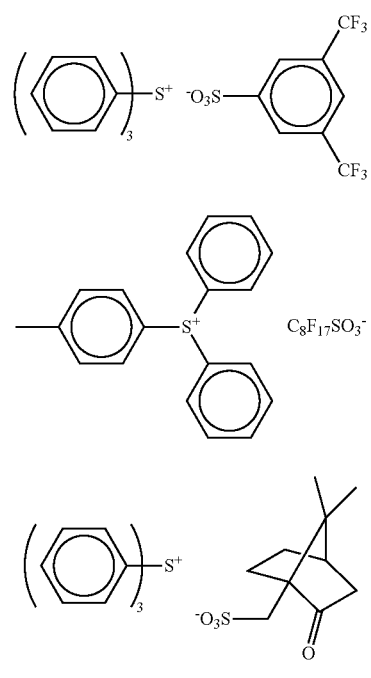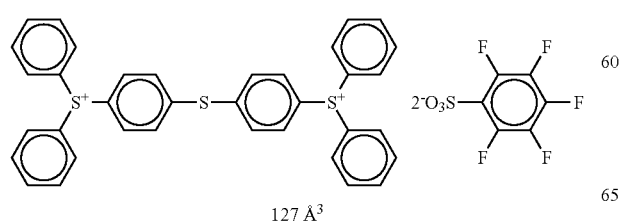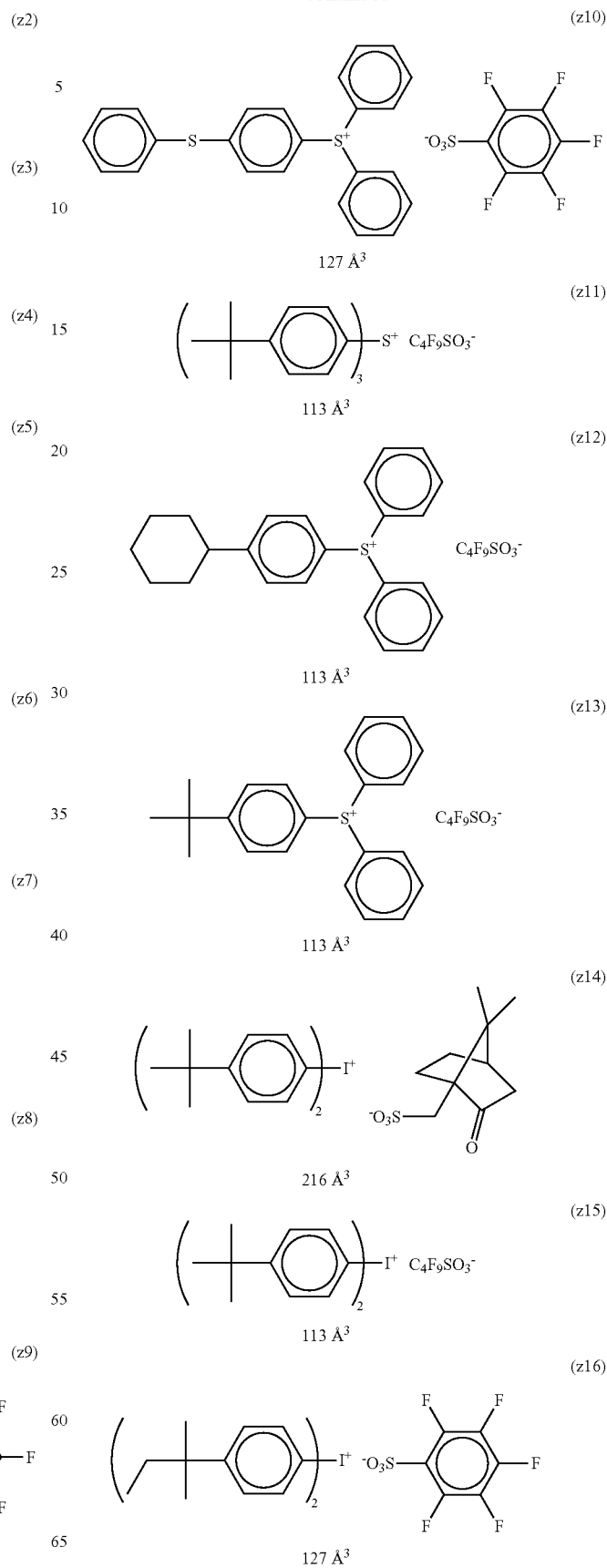

-continued
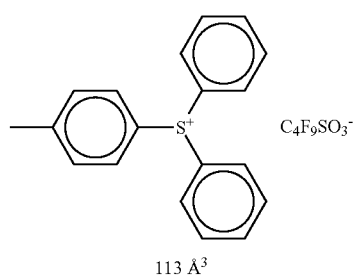
(z17)
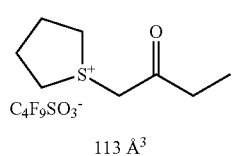
(z18)
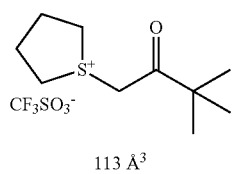
(z19)
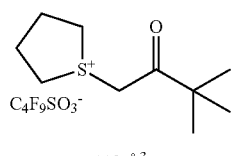
(z20)
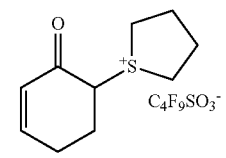
(z21)
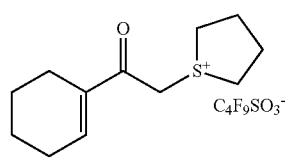
(z22)
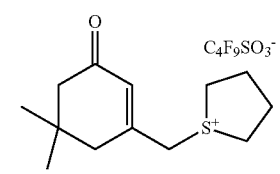
(z23)
-continued
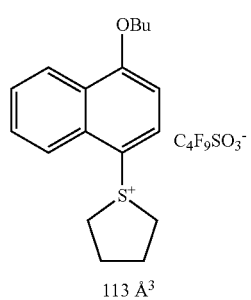
(z24)
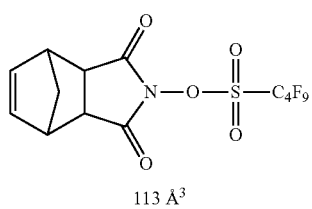
(z25)
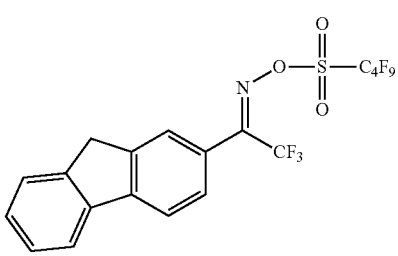
(z26)
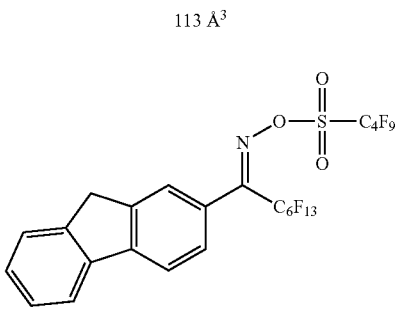
(z27)
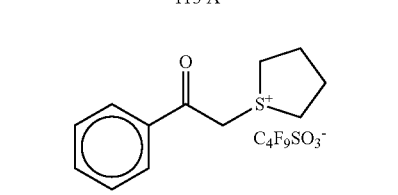
(z28)
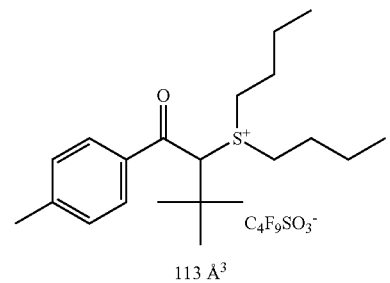
(z29)

(z30) 113 Å³

(z31) 113 Å³

(z32) 113 Å³

(z33) 113 Å³

(z34) 113 Å³

(z35) 113 Å³

(z36) 393 Å³

(z37) 136 Å³

(z38) 136 Å³

(z40) 173 Å³

(z42) 244 Å³

(z43) 133 Å³

(z44) 347 Å³

(z45)
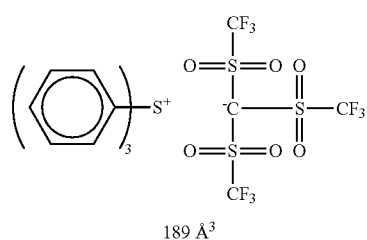
189 Å³
(z46)
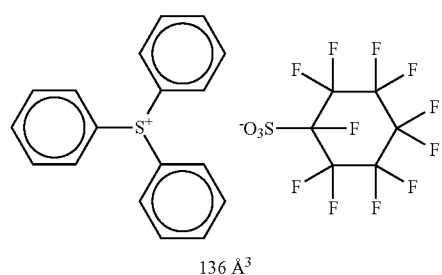
136 Å³
(z47)
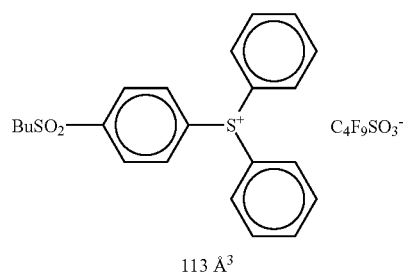
113 Å³
(z48)
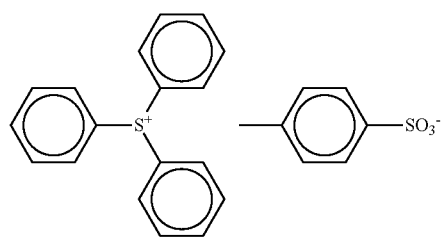
186 Å³
(z49)
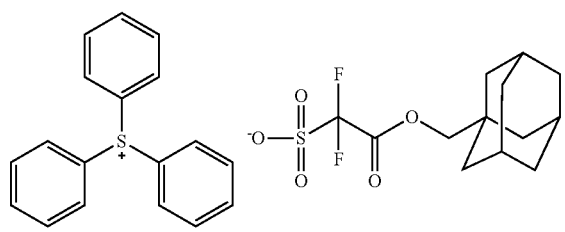
271 Å³
(z50)
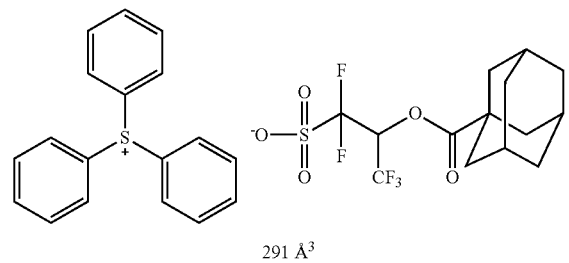
291 Å³
(z51)
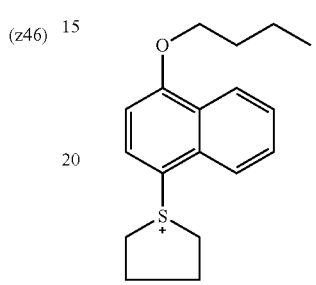
271 Å³
(z52)
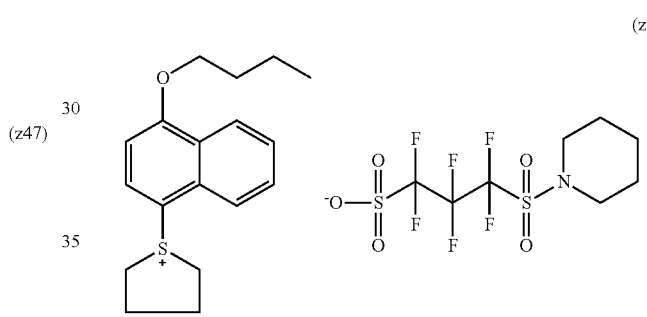
244 Å³
(z53)
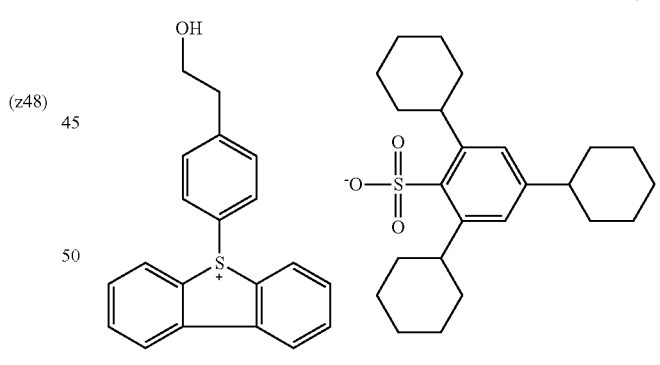
437 Å³
(z54)
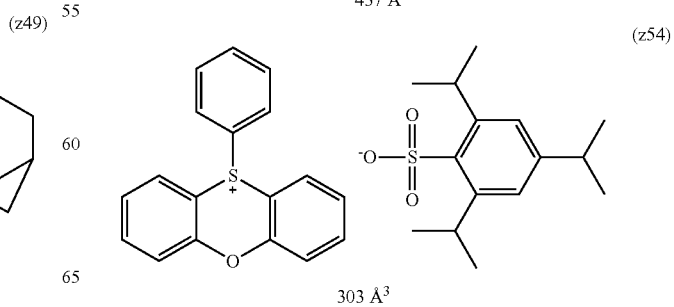
303 Å³

(z55)
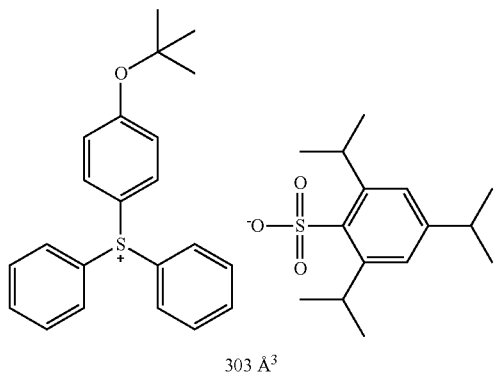
303 Å³
(z56)
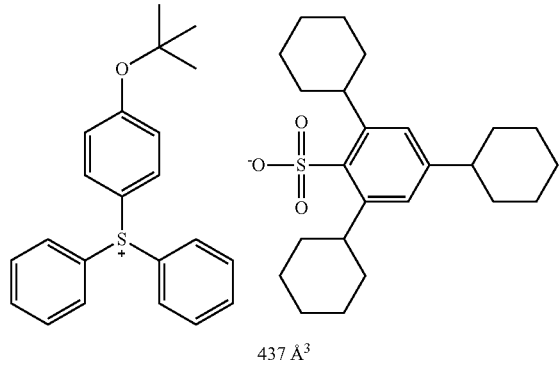
437 Å³
(z57)
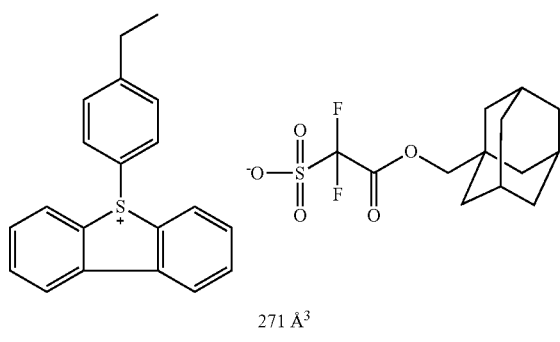
271 Å³
(z58)
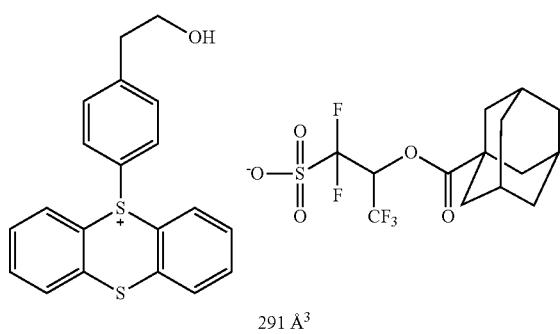
291 Å³
(z59)
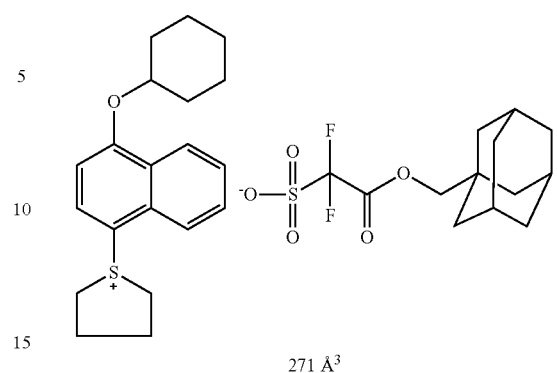
271 Å³
(z60)
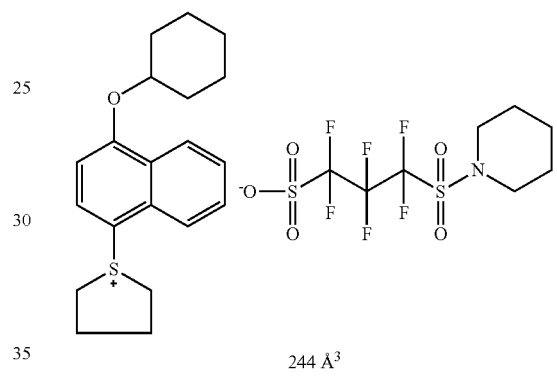
244 Å³
(z61)
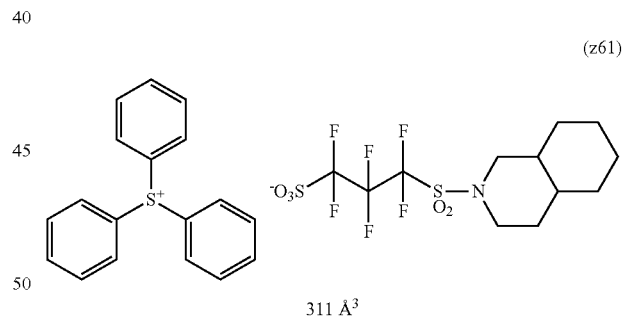
311 Å³
(z62)
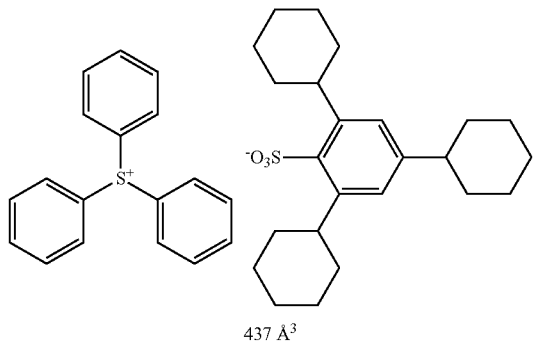
437 Å³

-continued (z63)
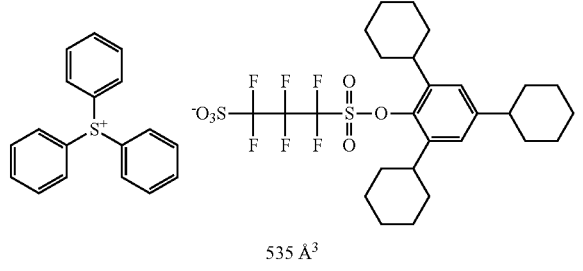
535 Å³

(z64)
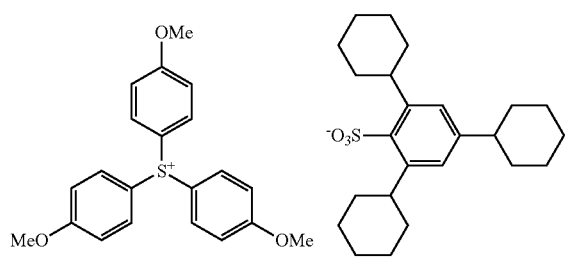
437 Å³

(z65)
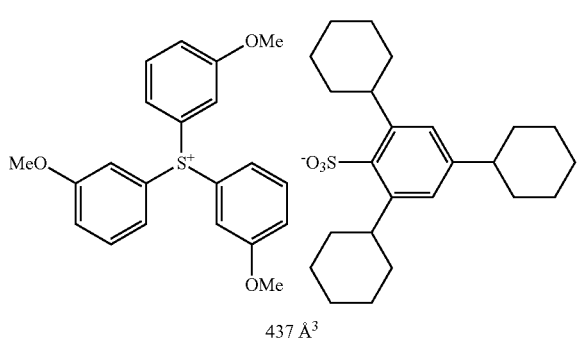
437 Å³

(z66)
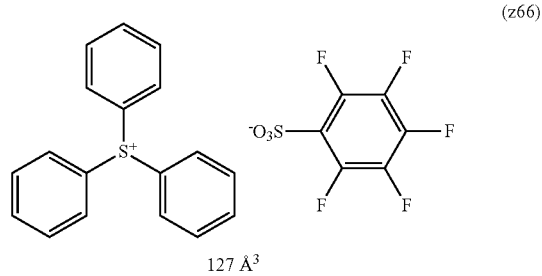
127 Å³

(z67)
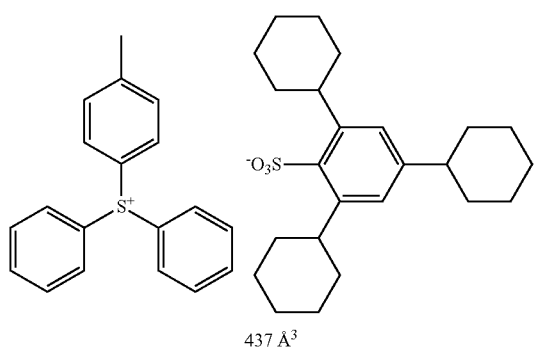
437 Å³

-continued (z68)
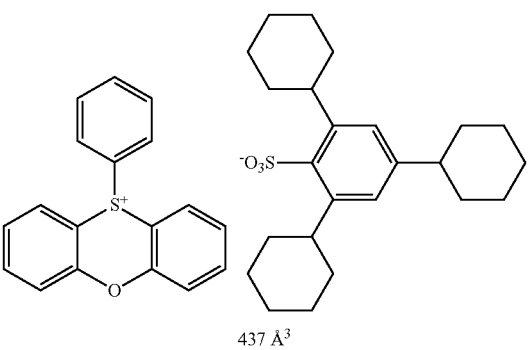
437 Å³

As the acid generator (preferably, onium compound) for use in the present invention, use can be made of a polymeric acid generator in which a group (photoacid generating group) that when exposed to actinic rays or radiation, generates an acid is introduced in the principal chain or a side chain of the polymeric compound.

The content of acid generator in the composition, based on the total solids of the composition, is preferably in the range of 0.1 to 25 mass %, more preferably 0.5 to 20 mass % and further more preferably 1 to 18 mass %.

One of these acid generators may be used alone, or two or more thereof may be used in combination.

[3] Compound (C) Containing Acid-Crosslinkable Group

The composition of the present invention comprises a compound (C) (hereinafter also referred to as "compound (C)" or "crosslinking agent") containing an acid-crosslinkable group. It is preferred for compound (C) to be a compound containing two or more hydroxymethyl groups or alkoxymethyl groups in its molecule. From the viewpoint of LER enhancement, it is preferred for compound (C) to contain methylol groups.

First, compound (C) (hereinafter referred to as compound (C')) whose molecular weight is low will be described below. Compound (C') is preferably any of a hydroxymethylated or alkoxymethylated phenol compound, an alkoxymethylated melamine compound, an alkoxymethylglycoluril compound and an alkoxymethylated urea compound. Especially preferred compound (C') is an alkoxymethylglycoluril derivative or phenol derivative of 1200 or less molecular weight containing 3 to 5 benzene rings in each molecule and further containing two or more hydroxymethyl groups or alkoxymethyl groups in total.

It is preferred for the alkoxymethyl group to be a methoxymethyl group or an ethoxymethyl group.

Among these examples of compounds (C'), a phenol derivative containing a hydroxymethyl group can be obtained by reacting a corresponding phenol compound containing no hydroxymethyl group with formaldehyde in the presence of a base catalyst. Further, a phenol derivative containing an alkoxymethyl group can be obtained by reacting a corresponding phenol derivative containing a hydroxymethyl group with an alcohol in the presence of an acid catalyst.

As other preferred examples of compounds (C'), there can be mentioned compounds each containing an N-hydroxymethyl group or an N-alkoxymethyl group, such as an alkoxymethylated melamine compound, an alkoxymethylglycoluril compound and an alkoxymethylated urea compound.

These compounds include hexamethoxymethylmelamine, hexaethoxymethylmelamine, tetramethoxymethylglycoluril, 1,3-bismethoxymethyl-4,5-bismethoxyethyleneurea, bis-methoxymethylurea and the like. These are disclosed in EP 0,133,216 A, West German Patent Nos. 3,634,671 and 3,711,264 and EP 0,212,482 A.
Among particular examples of compounds (C'), those especially preferred are shown below.
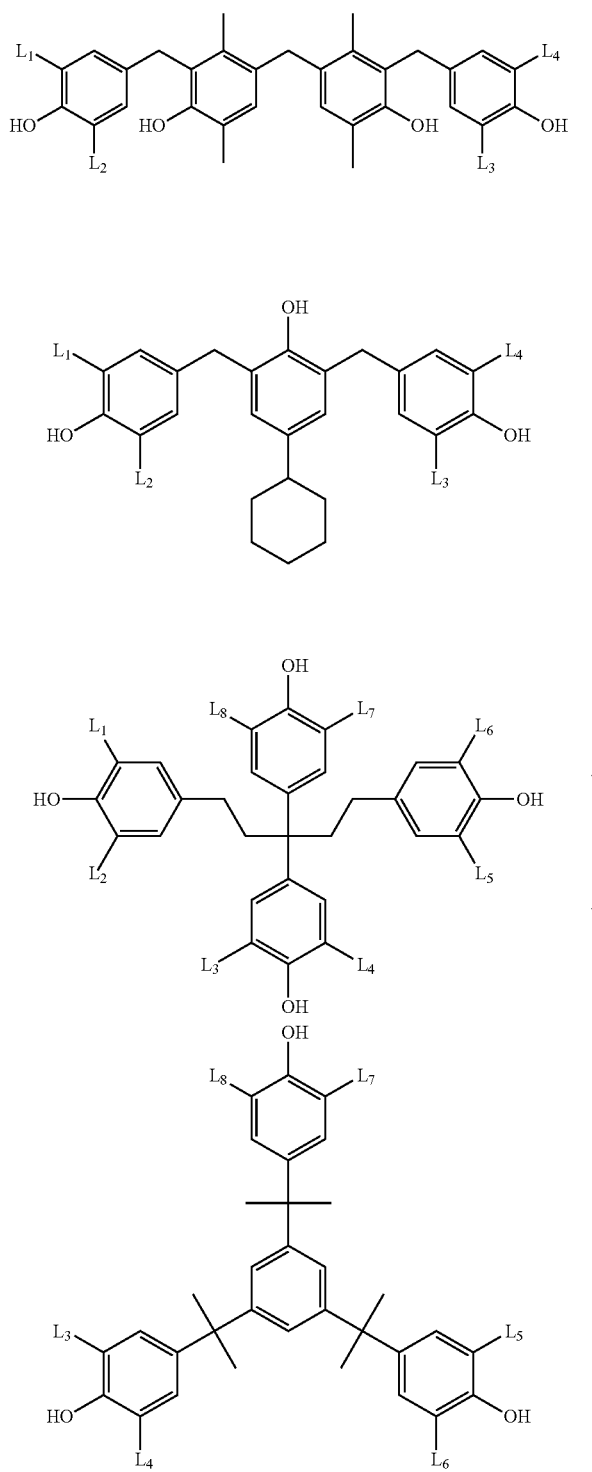
-continued
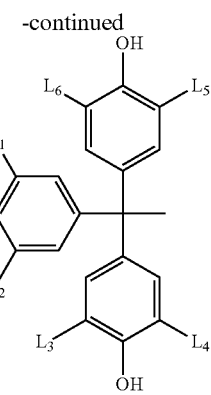
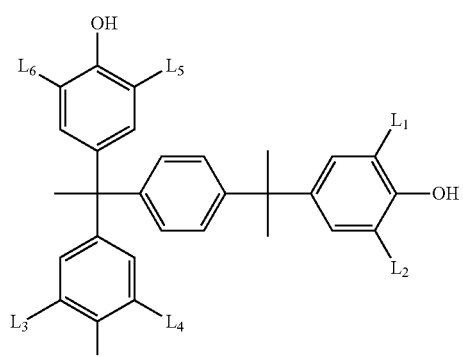
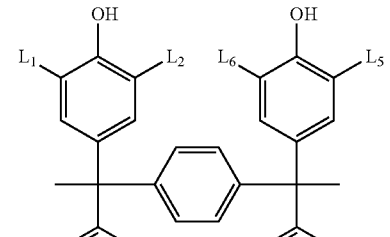
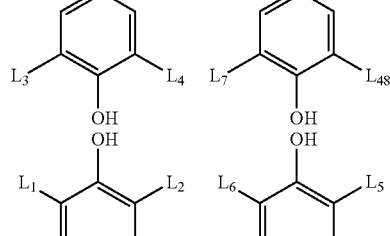
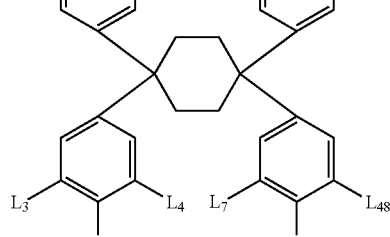
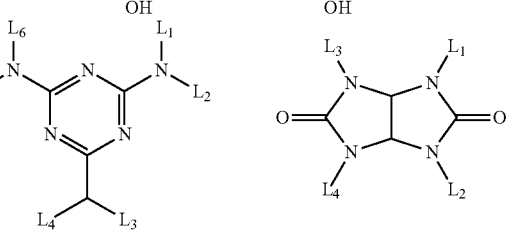

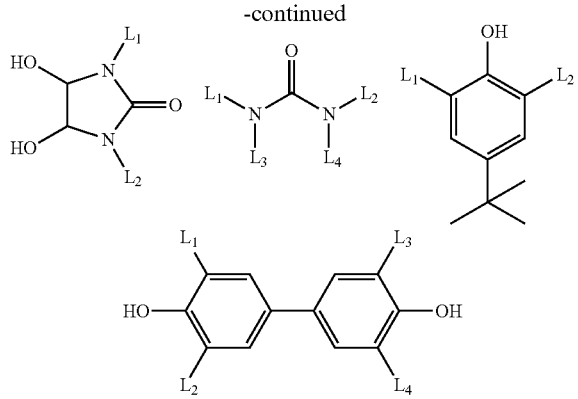

In the formulae, each of $L_1$ to $L_8$ independently represents a hydrogen atom, a hydroxymethyl group, a methoxymethyl group, an ethoxymethyl group or an alkyl group having 1 to 6 carbon atoms.

In the present invention, the content of compound (C'), based on the total solids of the negative resist composition, is preferably in the range of 3 to 65 mass %, more preferably 5 to 50 mass %. When the content of compound (C') falls within the range of 3 to 65 mass %, not only can any deteriorations of remaining film ratio and resolving power be prevented but also the storage stability of the composition of the present invention can be favorably maintained.

In the present invention, one of these compounds (C') may be used alone, or two or more thereof may be used in combination. Using two or more of compounds (C') in combination is preferred from the viewpoint of favorable pattern shape.

For example, when the above phenol derivative is used in combination with the other compound (C'), e.g., the above compound containing an N-alkoxymethyl group, the ratio of phenol derivative/other compound (C') in terms of molar ratio is generally in the range of 90/10 to 20/80, preferably 85/15 to 40/60 and more preferably 80/20 to 50/50.

Compound (C) containing an acid-crosslinkable group in its one form may be a resin (hereinafter also referred to as compound (C'')) containing a repeating unit containing an acid-crosslinkable group. In this form, as a crosslinking group is contained in a molecular unit of the repeating unit, the crosslinking reactivity is higher than in the ordinary system of a resin plus a crosslinking agent. Accordingly, a hard film can be formed, thereby permitting the controls of acid diffusion and dry etching resistance. As a result, any diffusion of acids in areas exposed to actinic rays or radiation, such as electron beams or extreme violet, can be effectively inhibited, thereby enhancing the resolving power, pattern shape and LER with respect to micropatterns. Moreover, when a reaction site of resin is in the vicinity of a reaction site of crosslinking group as in the repeating units of general formula (1) below, a composition realizing an enhanced sensitivity in pattern formation can be provided.

As compound (C''), there can be mentioned, for example, a resin containing any of the repeating units of general formula (1) below. Each of the repeating units of general formula (1) has a structure containing at least one optionally substituted methylol group.

Herein, the "methylol group" is any of the groups of general formula (M) below. In an aspect of the present invention, the methylol group is preferably a hydroxymethyl group or an alkoxymethyl group.

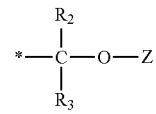

In the formula, $R_2$, $R_3$ and Z are as defined below in connection with general formula (1).

First, general formula (1) will be described.

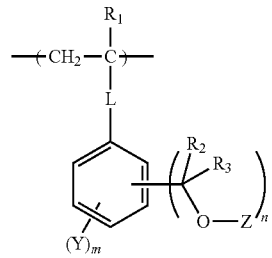

In general formula (1), $R_1$ represents a hydrogen atom, a methyl group or a halogen atom.

Each of $R_2$ and $R_3$ represents a hydrogen atom, an alkyl group or a cycloalkyl group.

L represents a bivalent connecting group or a single bond.

Y represents a non-methylol substituent.

Z represents a hydrogen atom or a substituent;

m is an integer of 0 to 4;

n is an integer of 1 to 5; and m+n is 5 or less.

When m is 2 or greater, a plurality of Y's may be identical to or different from each other.

When n is 2 or greater, a plurality of $R_2$s, $R_3$s and Z's may be identical to or different from each other.

Two or more of Y, $R_2$, $R_3$ and Z may be bonded to each other to thereby form a cyclic structure.

Substituents may be introduced in $R_1$, $R_2$, $R_3$, L and Y.

When m is 2 or greater, a plurality of Y's may be bonded via a single bond or a connecting group to each other to thereby form a cyclic structure.

The repeating units of general formula (1) are preferably expressed by general formula (2) or (3) below.

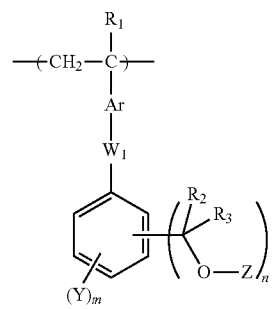

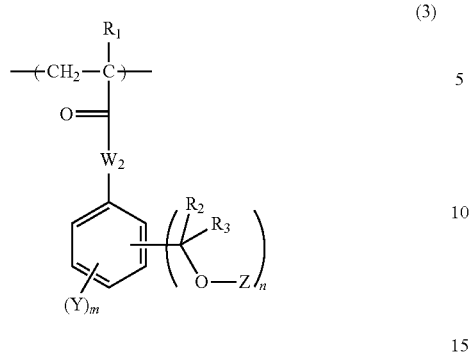

(3)

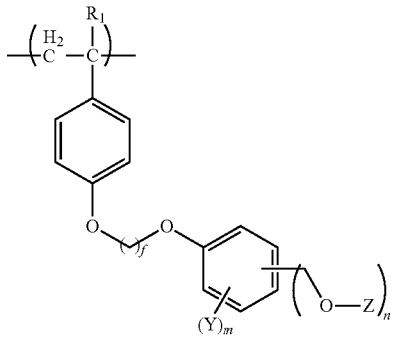

(1-a)

In general formulae (2) and (3), $R_1$, $R_2$, $R_3$, Y, Z, m and n are as defined above in connection with general formula (1).

Ar represents an aromatic ring.

Each of $W_1$ and $W_2$ represents a bivalent connecting group or a single bond.

The repeating units of general formula (1) are more preferably expressed by general formula (2') or (3') below.

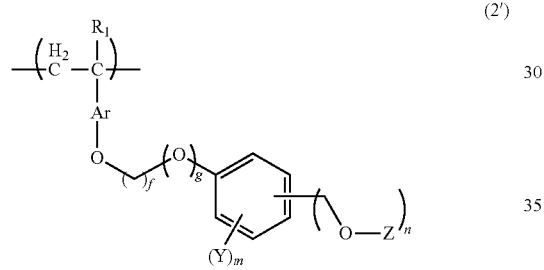

(2')

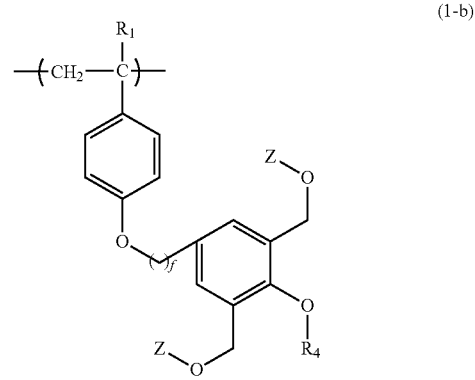

(1-b)

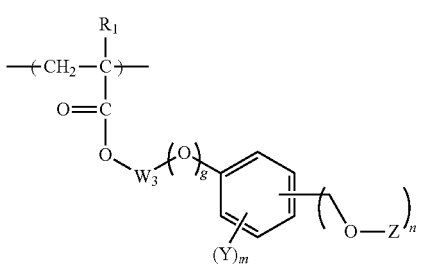

(3')

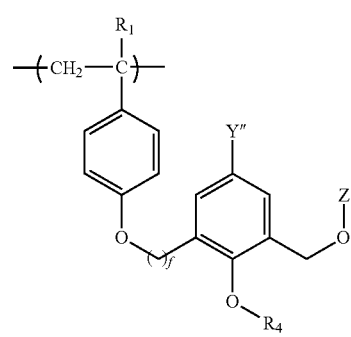

(1-c)

In general formulae (2') and (3') above, $R_1$, Y, Z, m and n are as defined above in connection with general formula (1). In general formula (2') above, Ar is as defined above in connection with general formula (2).

In general formula (3') above, $W_3$ represents a bivalent connecting group.

In general formulae (2') and (3') above, f is an integer of 0 to 6.

In general formulae (2') and (3') above, g is 0 or 1.

General formula (2') is most preferably expressed by any of general formulae (1-a) to (1-c) below. It is especially preferred for compound (C″) to contain any of repeating units of general formulae (1-a) to (1-c) below or any of repeating units of general formula (3') above.

In general formulae (1-a) to (1-c) above, $R_1$, Y and Z are as defined above in connection with general formula (1).

In general formulae (1-b) and (1-c) above, Y″ represents a hydrogen atom or a monovalent substituent, provided that Y″ may be a methylol group.

$R_4$ represents a hydrogen atom or a monovalent substituent;

f is an integer of 1 to 6;

m is 0 or 1, and n is an integer of 1 to 3.

The content of repeating unit containing an acid-crosslinkable group in compound (C″), based on all the repeating units of compound (C″), is preferably in the range of 3 to 40 mol %, more preferably 5 to 30 mol %.

The content of compound (C″), based on the total solids of the negative resist composition, is preferably in the range of 5 to 50 mol %, more preferably 10 to 40 mol %.

Compound (C″) may contain two types of repeating units each containing an acid-crosslinkable group, and two types of compounds (C″) may be used in combination. Further, compound (C′) can be used in combination with compound (C″).

Particular examples of the repeating units each containing an acid-crosslinkable group contained in compounds (C″) include the following structures.

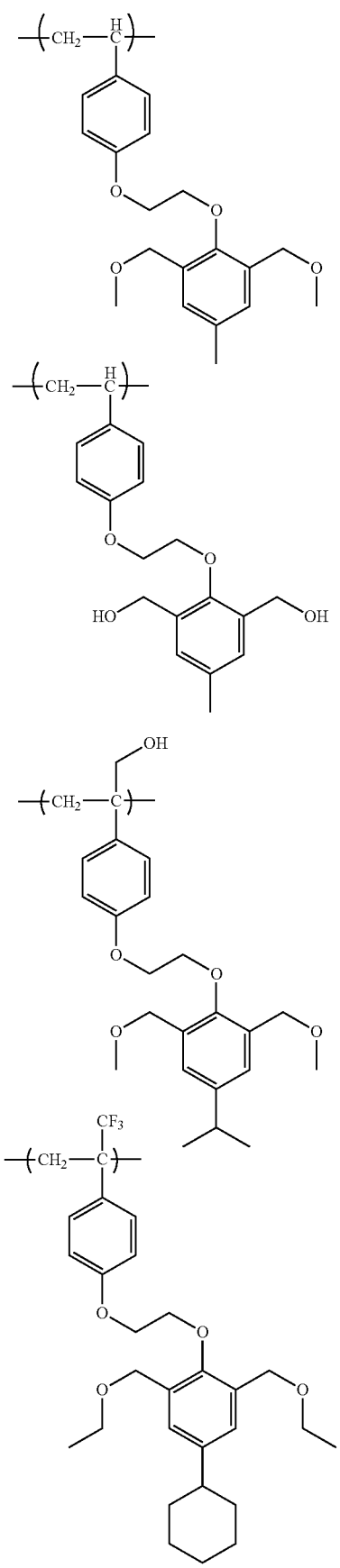
(Q-1)
(Q-2)
(Q-3)
(Q-4)
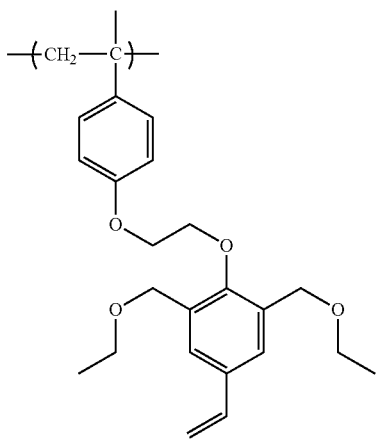
(Q-5)
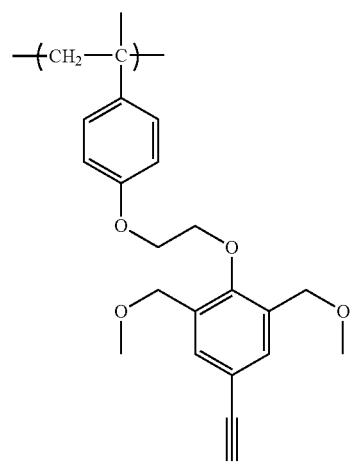
(Q-6)
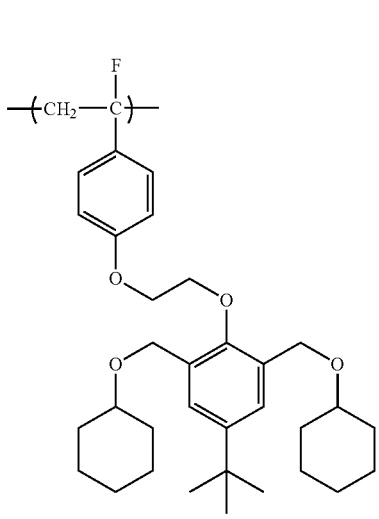
(Q-7)

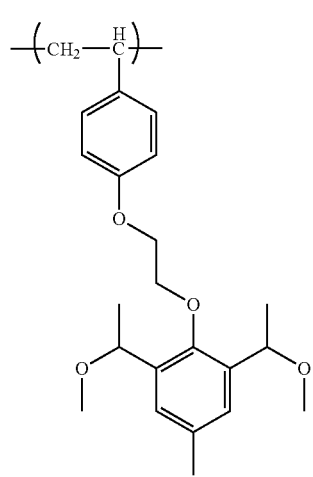 (Q-8)
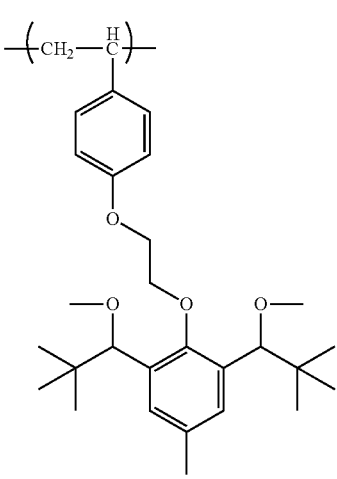 (Q-11)
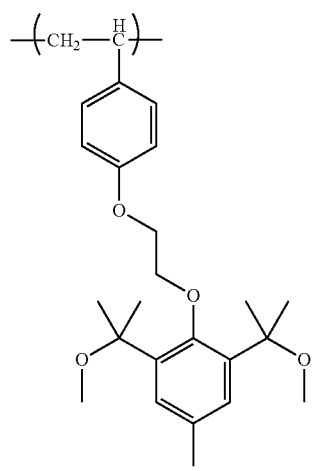 (Q-9)
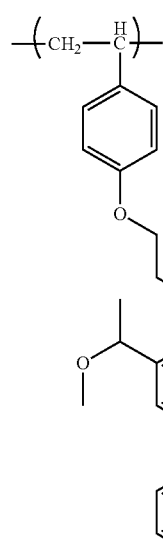 (Q-12)
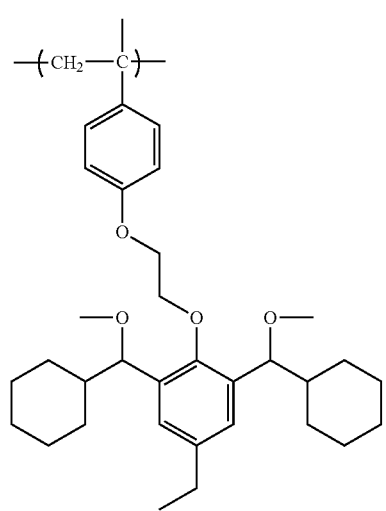 (Q-10)
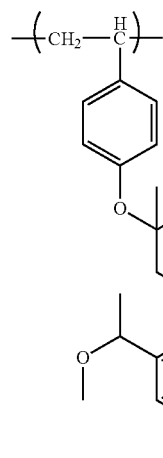 (Q-13)

(Q-14) 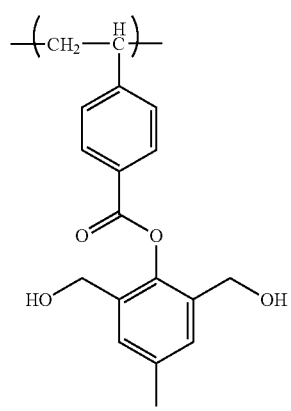
(Q-15) 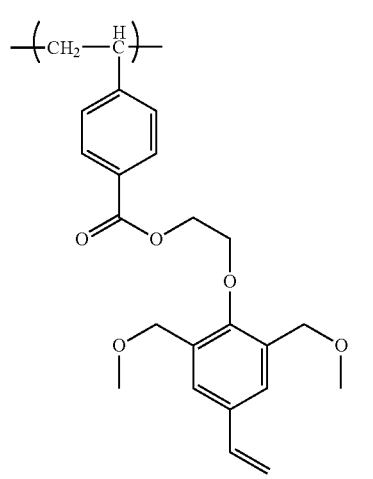
(Q-16) 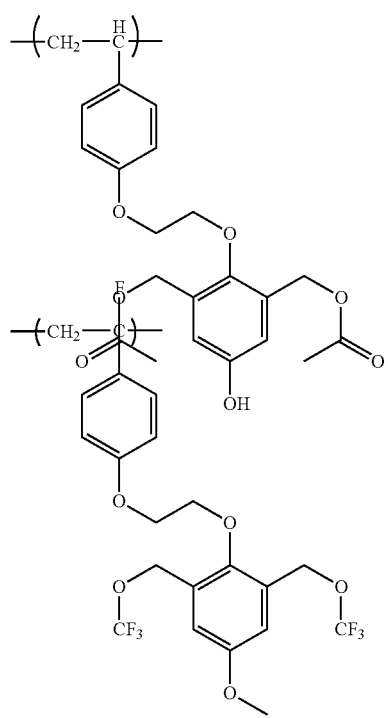
(Q-17)
(Q-18) 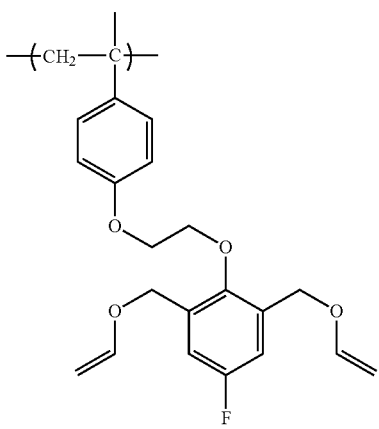
(Q-19) 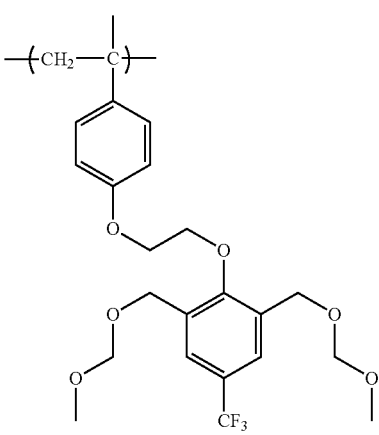
(Q-20) 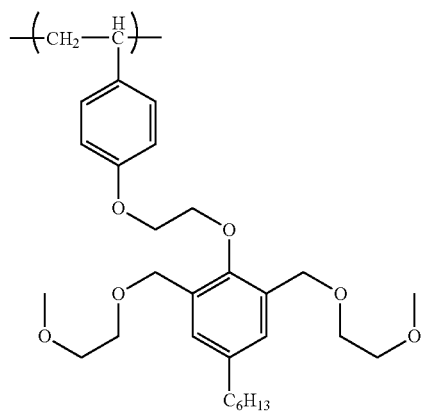

(Q-21) 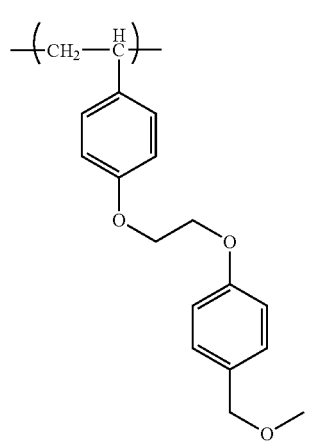
(Q-22) 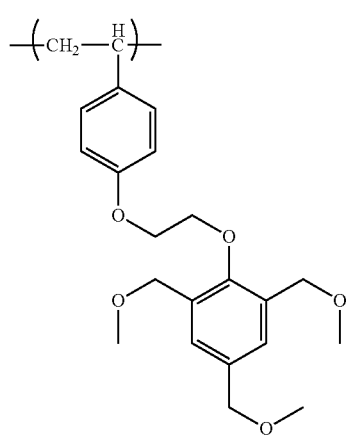
(Q-23) 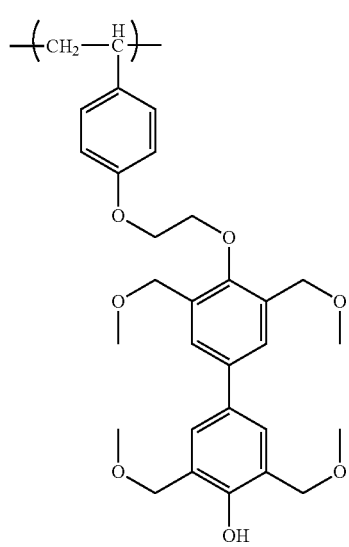
(Q-24) 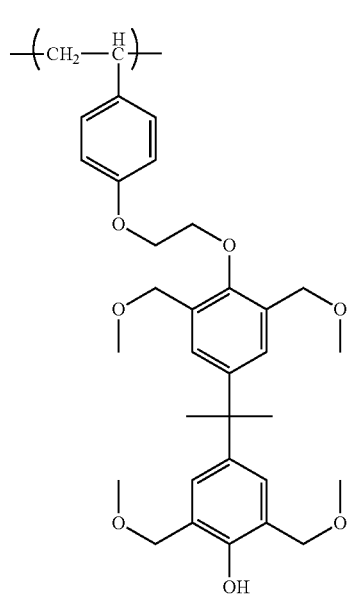
(Q-25) 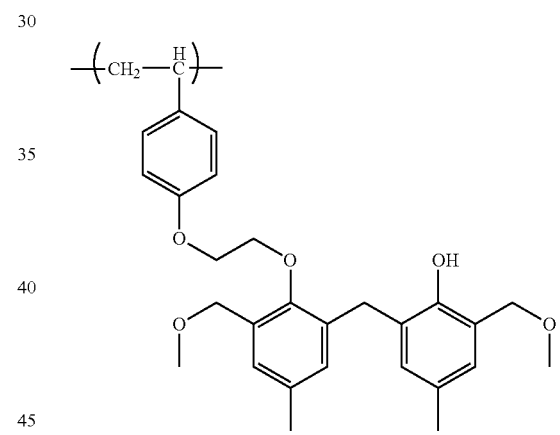
(Q-26) 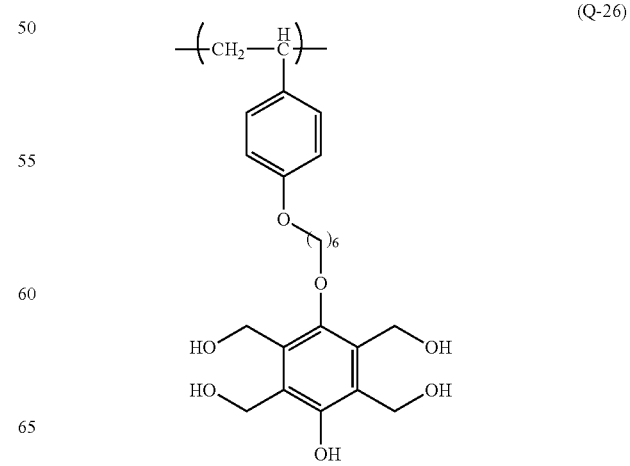

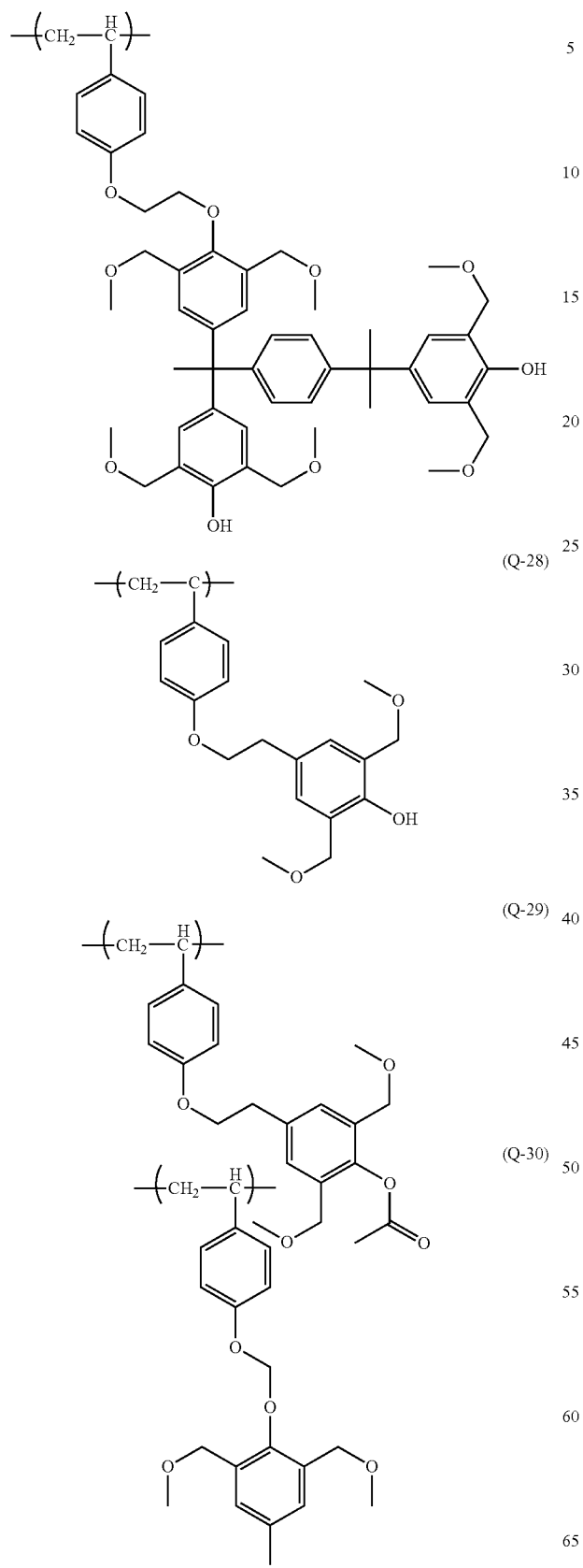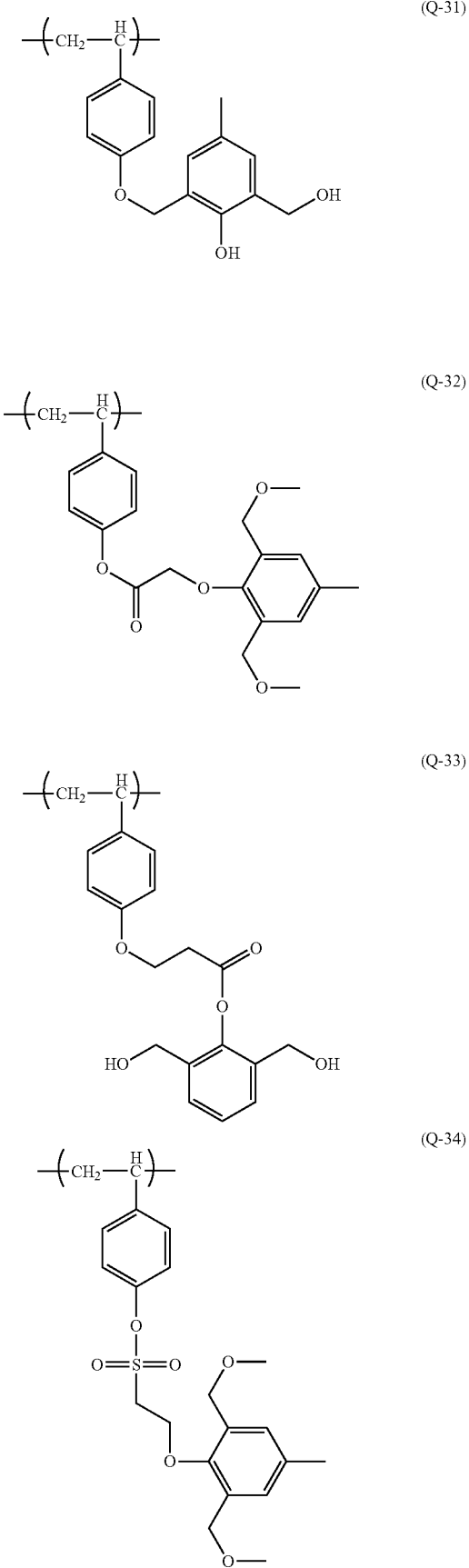

(Q-35) 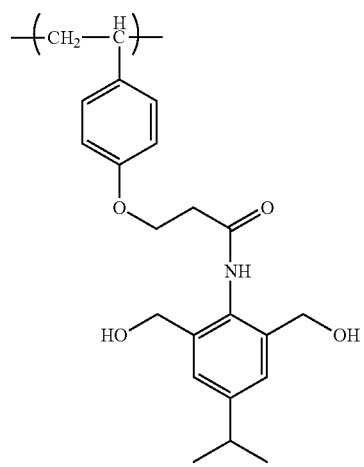
(Q-36) 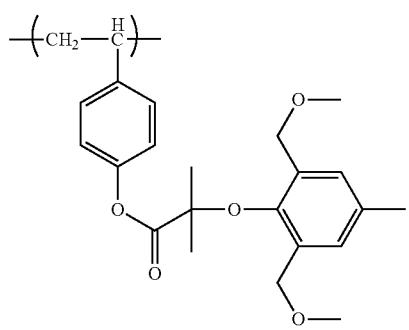
(Q-37) 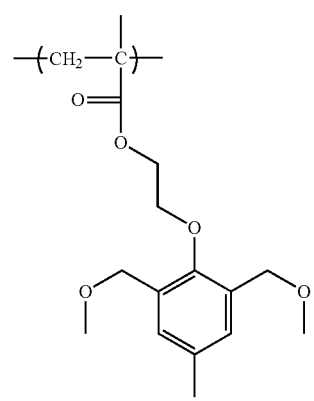
(Q-38) 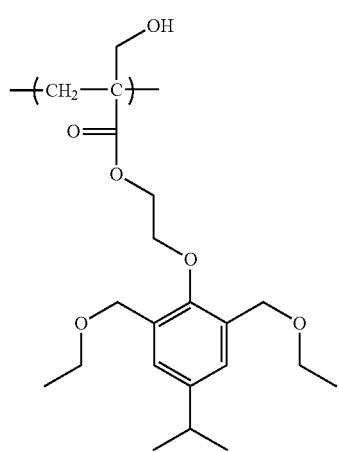
(Q-39) 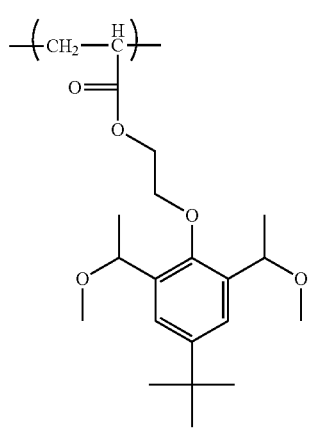
(Q-40) 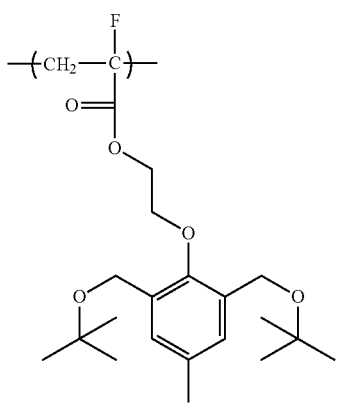
(Q-41) 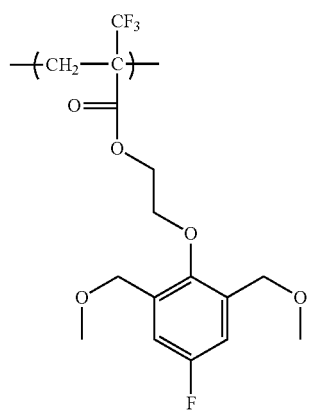
(Q-42) 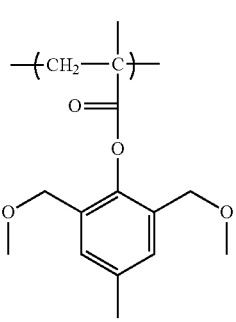

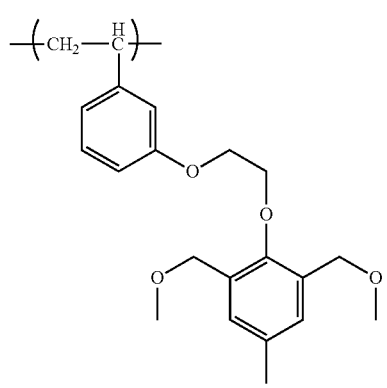
(Q-43)
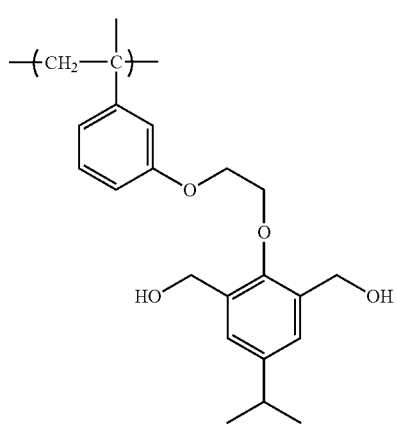
(Q-44)
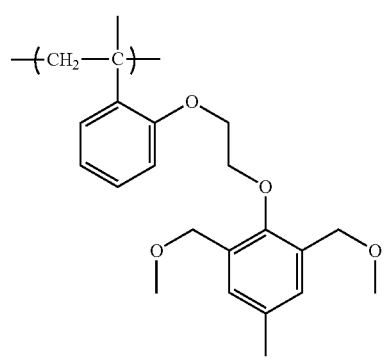
(Q-45)
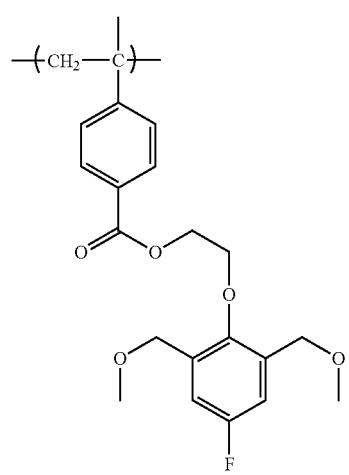
(Q-46)
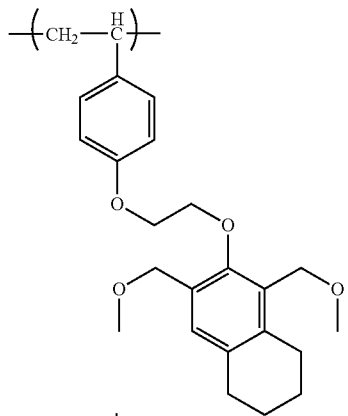
(Q-47)
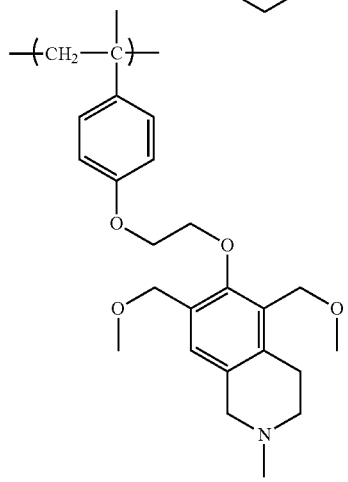
(Q-48)
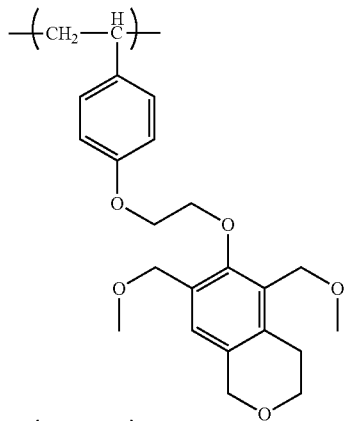
(Q-49)
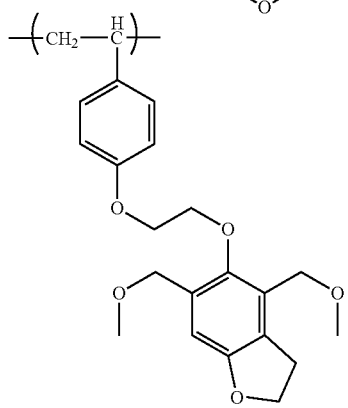
(Q-50)

(Q-51)
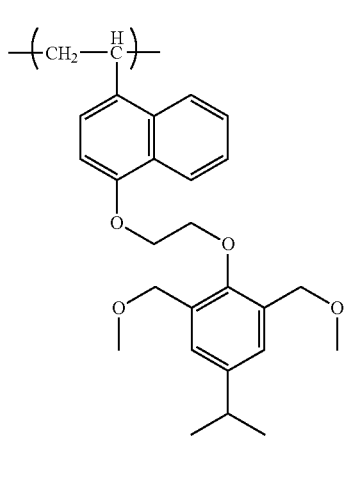
(Q-54)
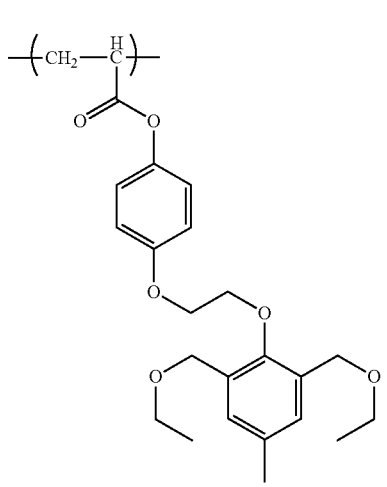
(Q-52)
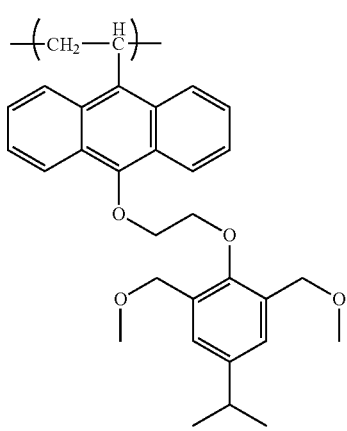
(Q-55)
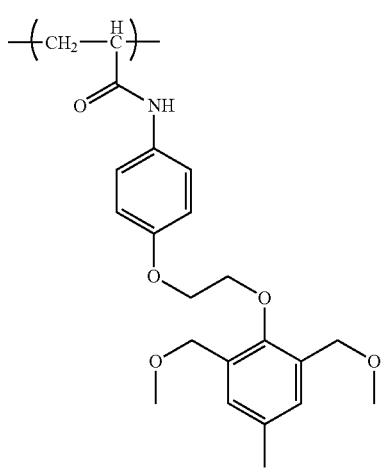
(Q-53)
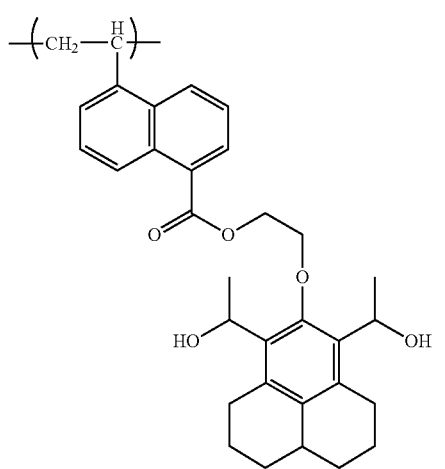
(Q-56)
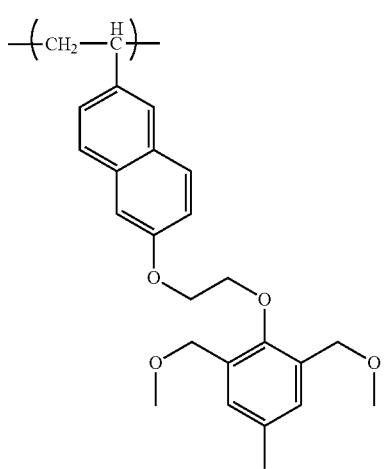

(Q-57) 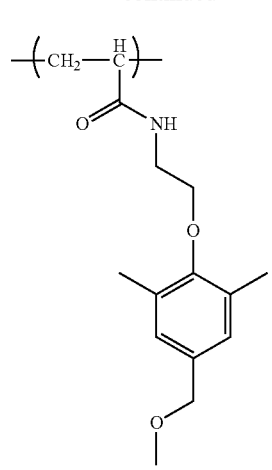
(Q-58) 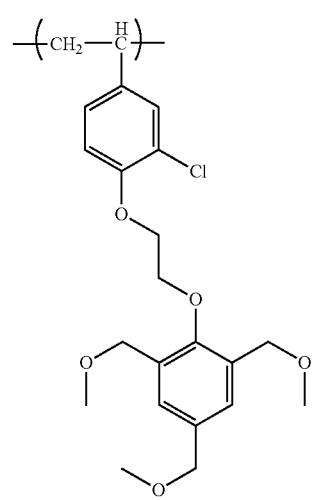
(Q-59) 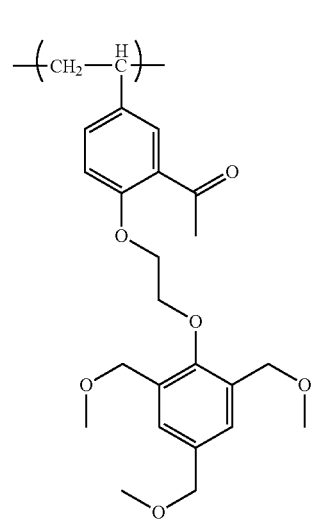
(Q-60) 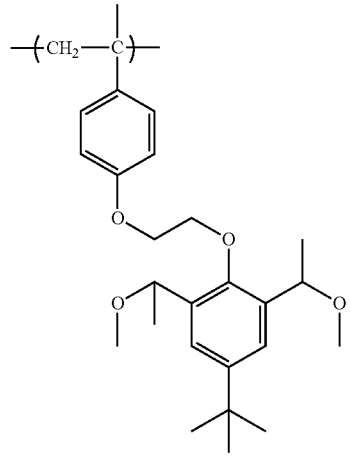
(Q-61) 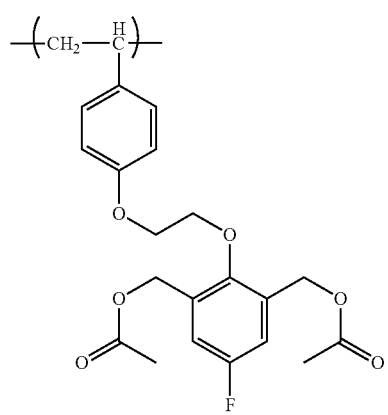
(Q-62) 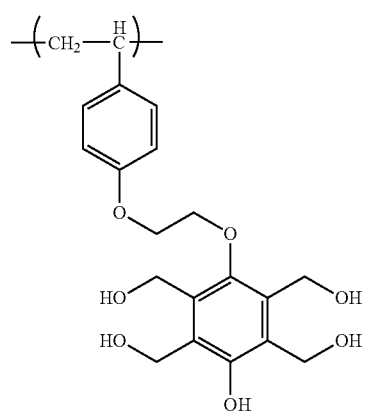

(Q-63)
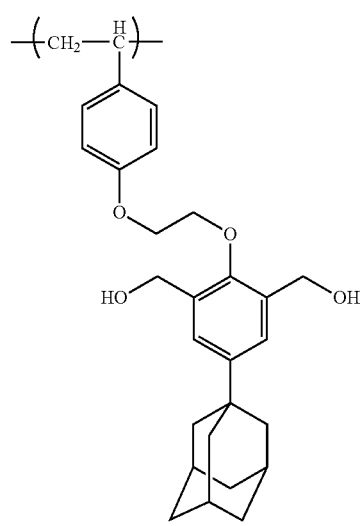
(Q-66)
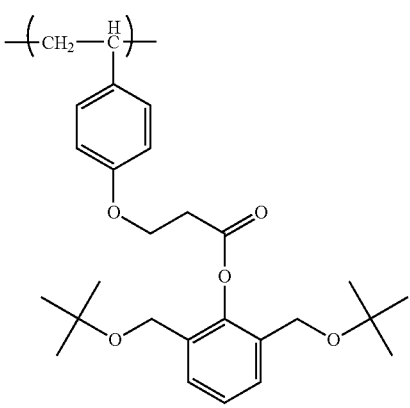
(Q-64)
(Q-67)
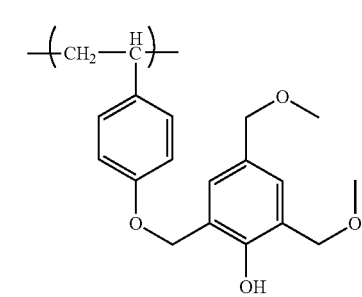
(Q-68)
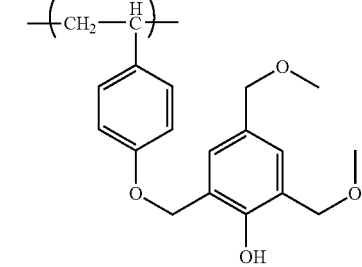
(Q-65)
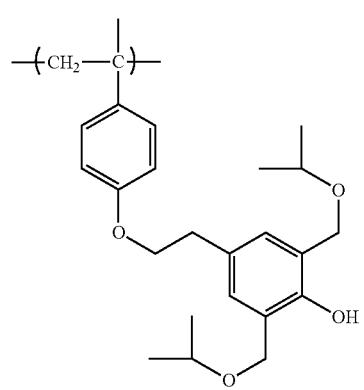

(Q-69)
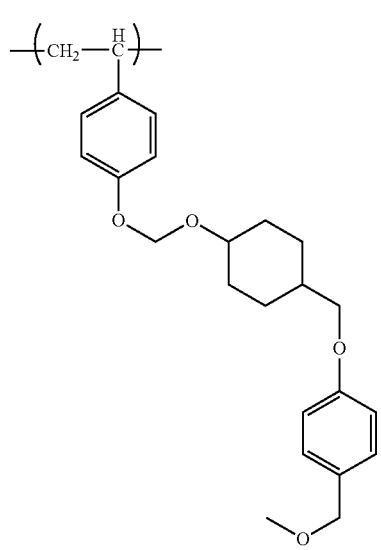
(Q-69)
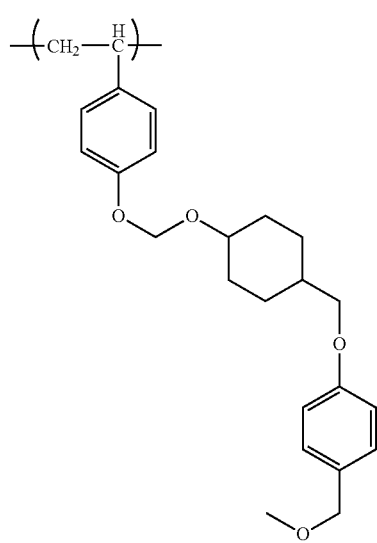
(Q-70)
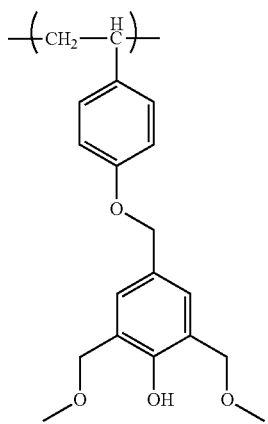
(Q-71)
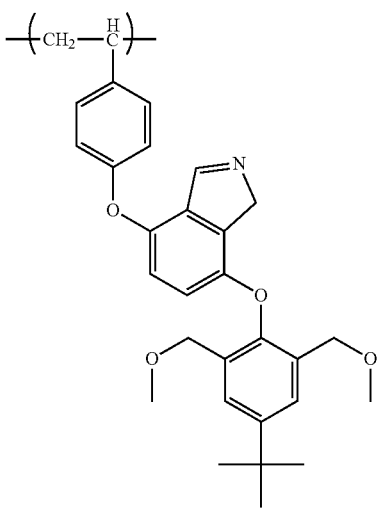
(Q-72)
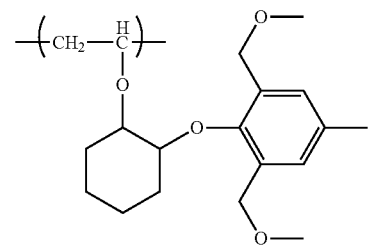
(Q-73)
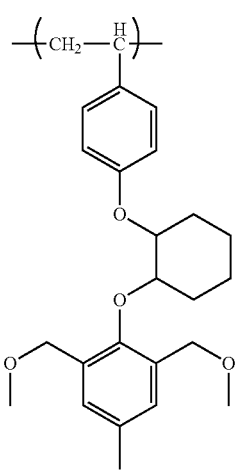

(Q-74) 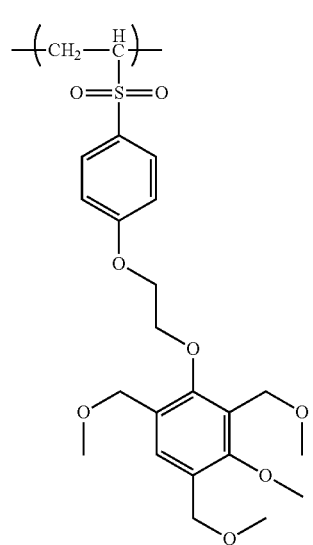
(Q-78) 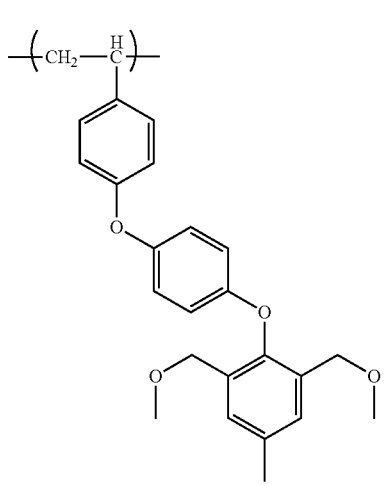
(Q-75) 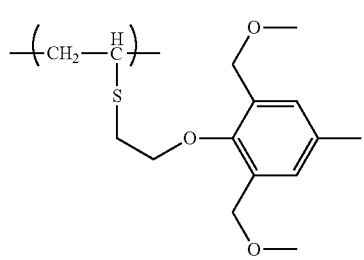
(Q-79) 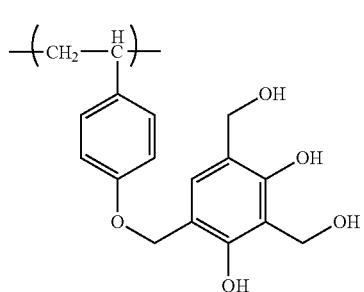
(Q-76) 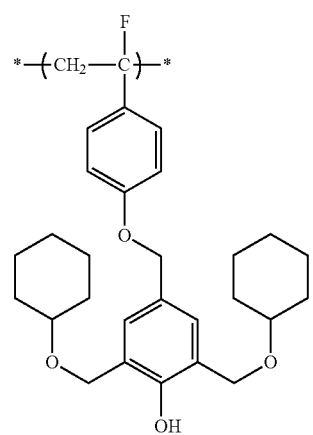
(Q-80) 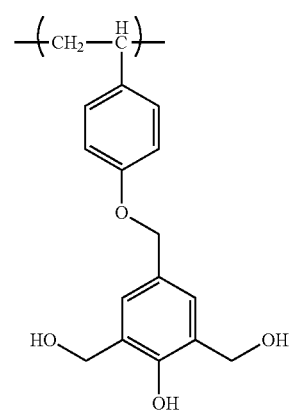
(Q-77) 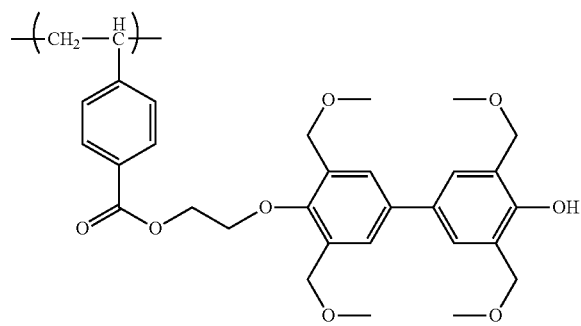
(Q-81) 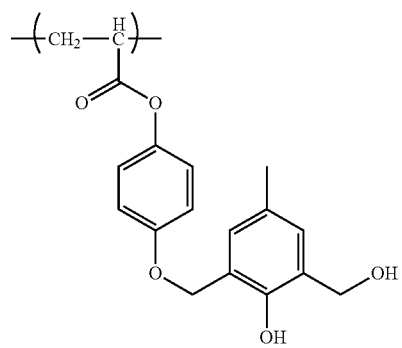

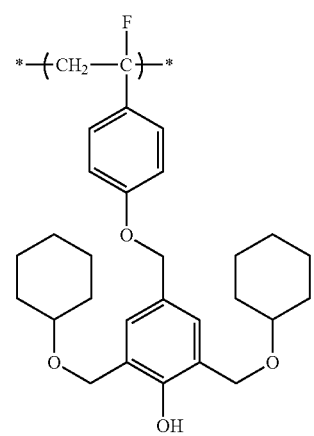 (Q-76)
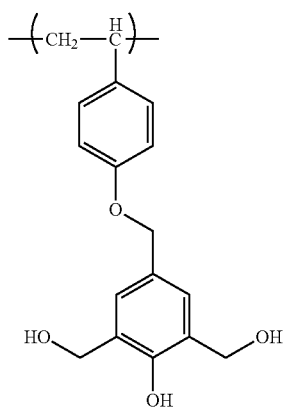 (Q-80)
 (Q-77)
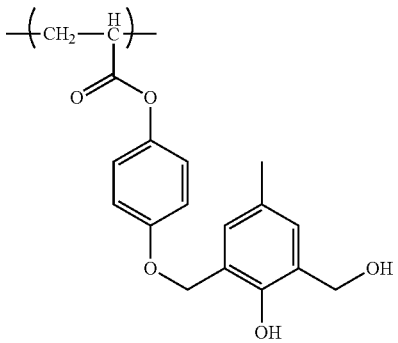 (Q-81)
(Q-78)
(Q-89)
(Q-79)
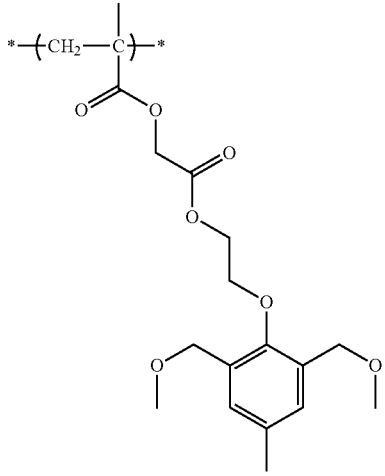
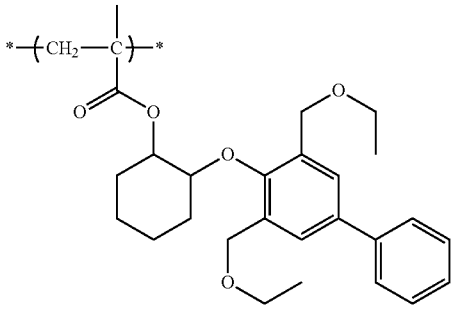 (Q-90)

(Q-91) 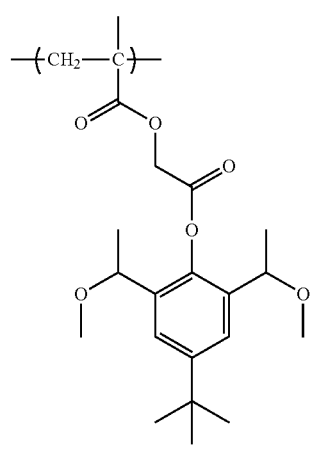
(Q-92) 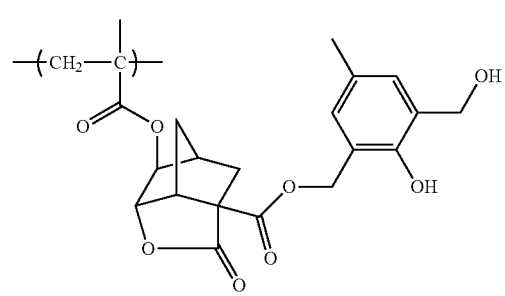
(Q-93) 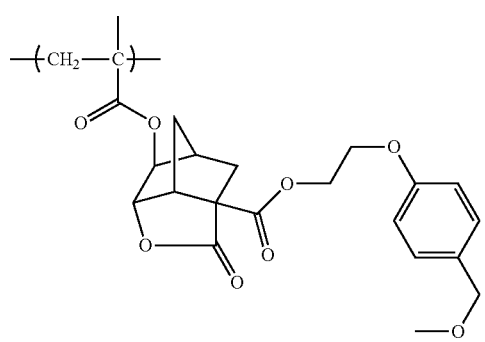
(Q-94) 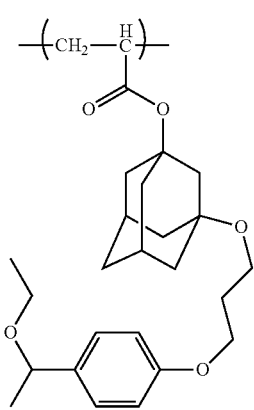
(Q-95) 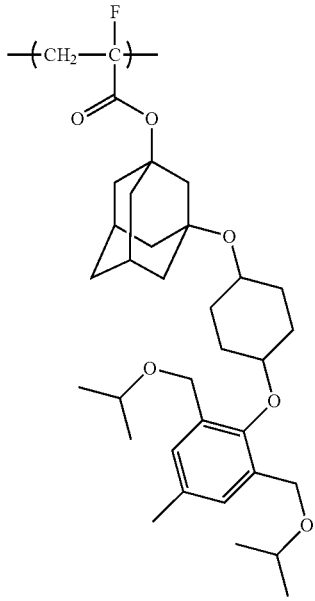
(Q-96) 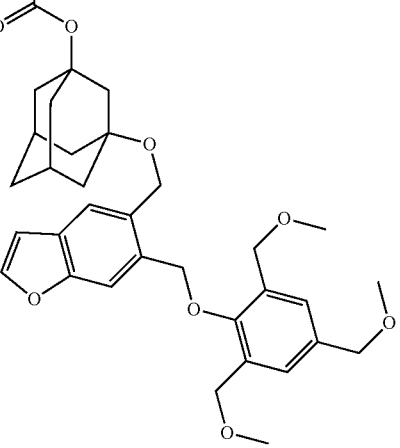
(Q-97) 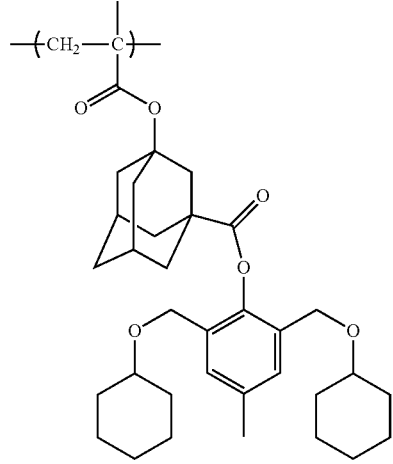

(Q-98)
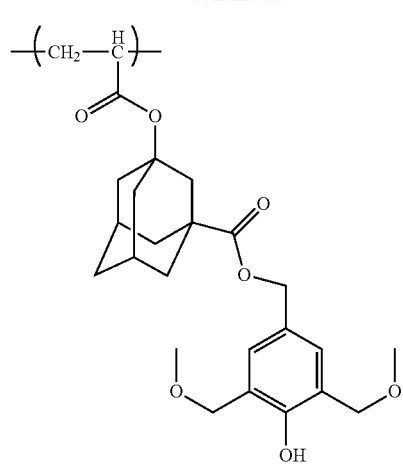
(Q-99)
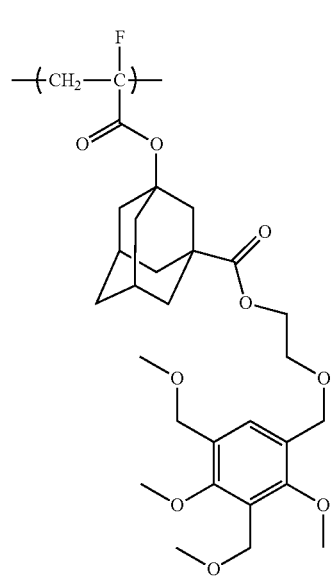
(Q-100)
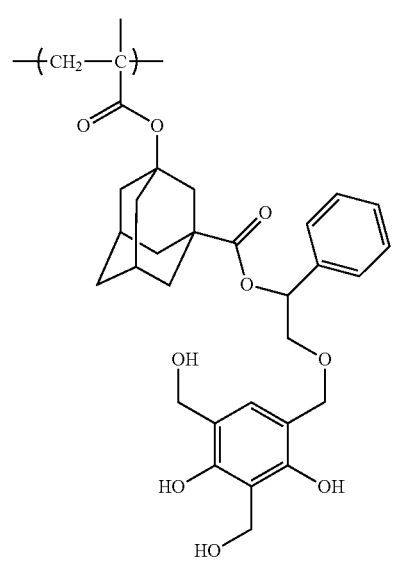
(Q-101)
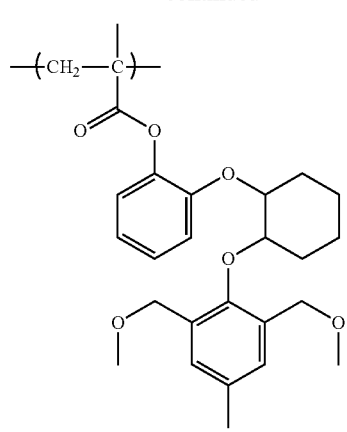
(Q-102)
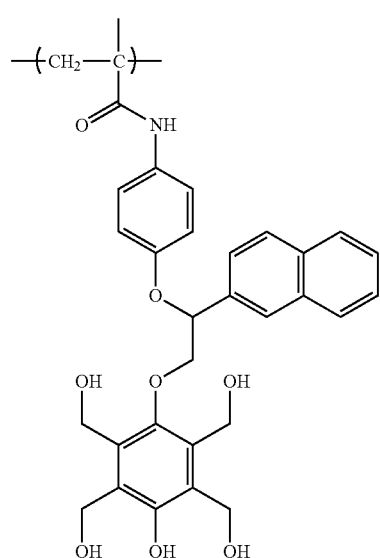
(Q-103)
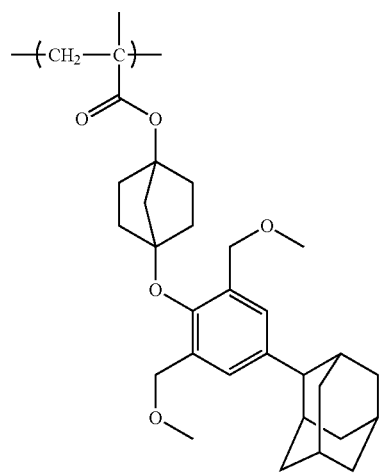

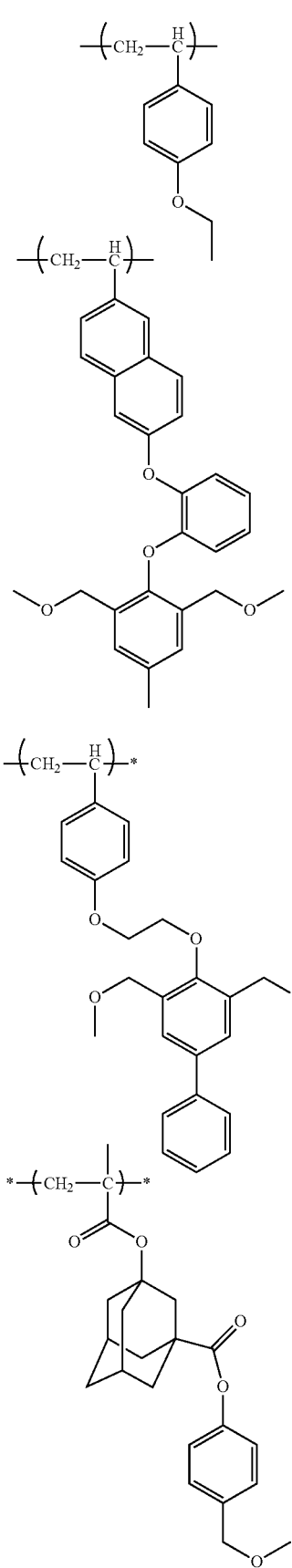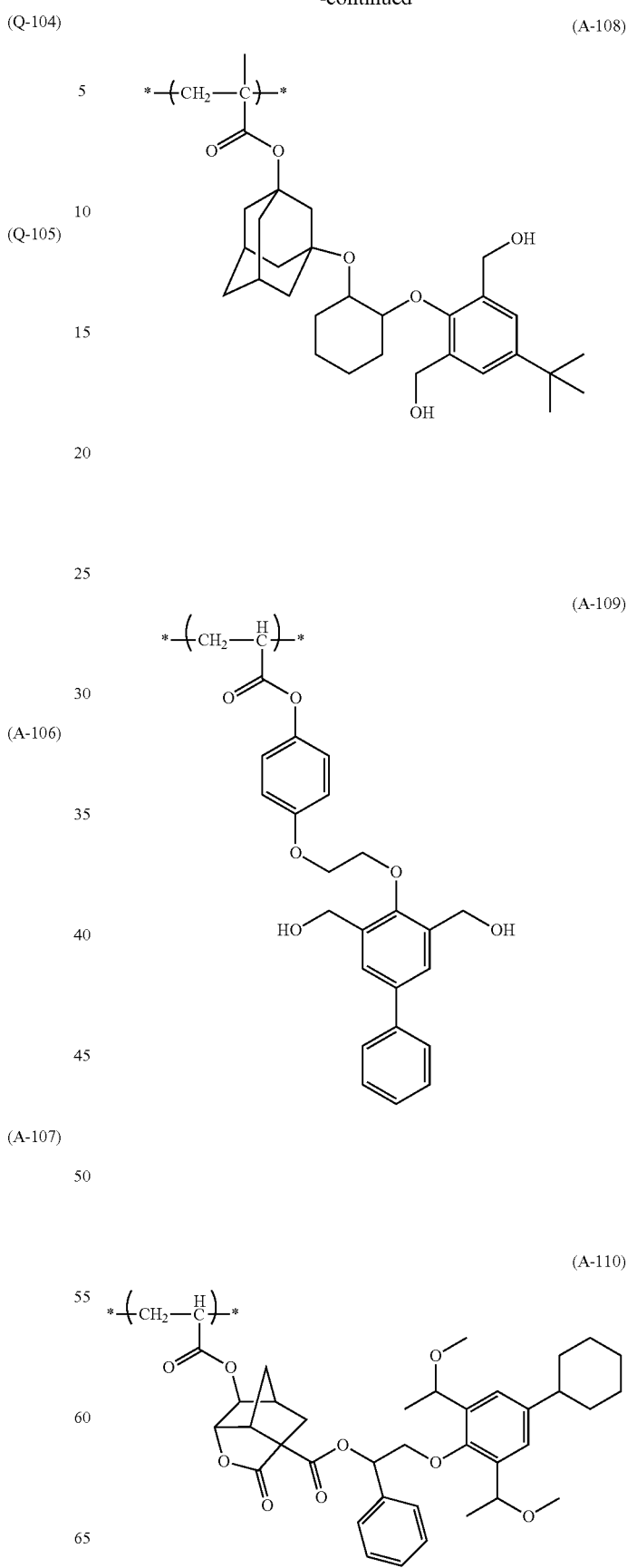

(A-111)

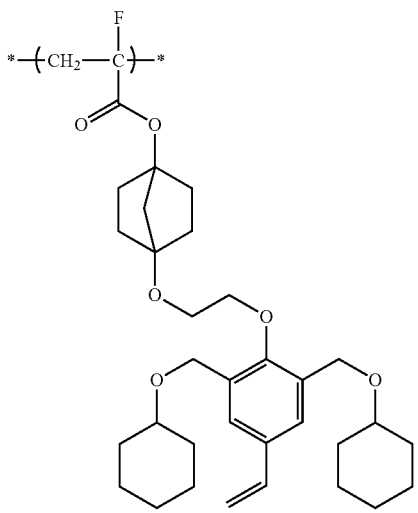

[4] Compound (D) Containing Phenolic Hydroxyl Group

It is preferred for the composition of the present invention in its one form to comprise a compound (D) containing a phenolic hydroxyl group (hereinafter also referred to as compound (D)).

The term "phenolic hydroxyl group" used in the present invention refers to a group resulting from the replacement of a hydrogen atom of an aromatic ring group by a hydroxyl group. The aromatic ring in the aromatic ring group is a mono- or polycyclic aromatic ring. As the aromatic ring, there can be mentioned a benzene ring, a naphthalene ring or the like.

In the composition of the present invention comprising compound (D), at exposed areas, a crosslinking reaction between compound (D) containing a phenolic hydroxyl group and the above-mentioned compound (C) containing an acid-crosslinkable group progresses under the action of an acid generated from acid generator (B) upon exposure to actinic rays or radiation, thereby forming a negative pattern. In particular, when acid generator (B) produces an acid with a structure in which two or more methylol groups are contained in its molecule, not only the crosslinking reaction between compound (D) and compound (C) but also the contribution of a plurality of methylol groups contained in acid generator (B) to the crosslinking reaction can further enhance the dry etching resistance, sensitivity and resolving power.

Compound (D) containing a phenolic hydroxyl group is not particularly limited as long as a phenolic hydroxyl group is contained. It may be a relatively low molecular compound, such as a molecular resist, and may be a polymeric compound. As the molecular resist, use can be made of, for example, any of low-molecular-weight cyclic polyphenol compounds described in JP-A's 2009-173623 and 2009-173625.

It is preferred for compound (D) containing a phenolic hydroxyl group to be a polymeric compound from the viewpoint of reactivity and sensitivity.

When compound (D) containing a phenolic hydroxyl group according to the present invention is a polymeric compound, the polymeric compound comprises a repeating unit containing at least one phenolic hydroxyl group. The repeating unit containing a phenolic hydroxyl group is not particularly limited, which is however preferably any of repeating units of general formula (II) below.

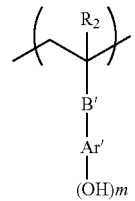

(II)

In the formula, $R_2$ represents a hydrogen atom, an optionally substituted methyl group or a halogen atom;

B' represents a single bond or a bivalent connecting group;

Ar' represents an aromatic ring group; and m is an integer of 1 or greater.

As the optionally substituted methyl group represented by $R_2$, there can be mentioned a trifluoromethyl group, a hydroxymethyl group or the like.

$R_2$ is preferably a hydrogen atom or a methyl group. A hydrogen atom is more preferred from the viewpoint of developability.

The bivalent connecting group represented by B' is preferably a carbonyl group, an alkylene group (preferably having 1 to 10 carbon atoms, more preferably 1 to 5 carbon atoms), a sulfonyl group (—S(=O)$_2$—), —O—, —NH—, or a bivalent connecting group comprised of a combination of these.

B' is more preferably a single bond, a carbonyloxy group (—C(=O)—O—) or —C(=O)—NH—, further more preferably a single bond or a carbonyloxy group (—C(=O)—O—). A single bond is most preferred from the viewpoint of dry etching resistance.

The aromatic ring represented by Ar' is a monocyclic or polycyclic aromatic ring. As such, there can be mentioned an optionally substituted aromatic hydrocarbon ring having 6 to 18 carbon atoms, such as a benzene ring, a naphthalene ring, an anthracene ring, a fluorene ring or a phenanthrene ring, or an aromatic ring heterocycle containing a heteroring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring or a triazole ring. Of these, a benzene ring and a naphthalene ring are preferred from the viewpoint of resolution. A benzene ring is most preferred from the viewpoint of sensitivity.

In the formula, m is preferably an integer of 1 to 5, most preferably 1. When m is 1 and Ar' is a benzene ring, the position of —OH substitution may be any of the para-, meta- and ortho-positions to the site of bonding to B' (when B' is a single bond, the principal chain of the polymer) in the benzene ring. However, from the viewpoint of crosslinking reactivity, the para- and meta-positions are preferred, and the para-position is more preferred.

A substituent other than the above —OH group may be introduced in the aromatic ring represented by Ar'. As such a substituent, there can be mentioned, for example, an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group or an arylcarbonyl group.

From the viewpoint of crosslinking reactivity, developability and dry etching resistance, it is preferred for the repeating unit containing a phenolic hydroxyl group to be any of repeating units of general formula (2) below.

$$\text{(2)}$$

In general formula (2), $R_{12}$ represents a hydrogen atom or a methyl group.

Ar represents an aromatic ring.

It is preferred for $R_{12}$ representing a hydrogen atom or a methyl group to be a hydrogen atom from the viewpoint of developability.

Ar in general formula (2) has the same meaning as that of Ar' in general formula (1I) above. Preferred ranges are also the same. From the viewpoint of sensitivity, it is preferred for the repeating units of general formula (2) to be repeating units derived from hydroxystyrene (namely, repeating units of general formula (2) in which $R_{12}$ is a hydrogen atom and Ar is a benzene ring).

Compound (D) as a polymeric compound may be comprised only of the above repeating unit containing a phenolic hydroxyl group. Compound (D) as a polymeric compound may comprise repeating units to be described below other than the above repeating units containing a phenolic hydroxyl group. In that instance, the content of repeating unit containing a phenolic hydroxyl group, based on all the repeating units of compound (D) as a polymeric compound, is preferably in the range of 10 to 98 mol %, more preferably 30 to 97 mol % and further more preferably 40 to 95 mol %. This highly reliably lowers, especially when the resist film is thin (for example, when the thickness of the resist film is in the range of 10 to 150 nm), the rate of dissolution, in alkali developers, of exposed areas of the resist film of the present invention formed using compound (D) (namely, the rate of dissolution of the resist film formed using compound (D) can be highly reliably controlled to the most appropriate rate). As a result, the sensitivity can be highly reliably enhanced.

Nonlimiting examples of repeating units each containing a phenolic hydroxyl group are shown below.

-continued

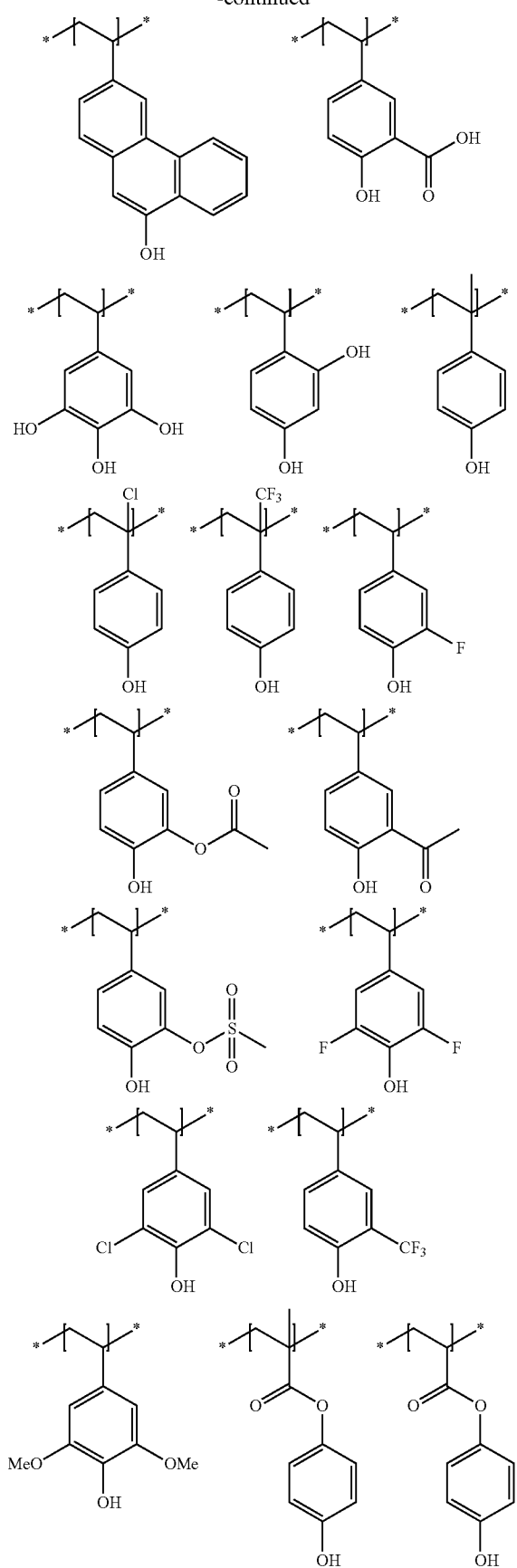

-continued

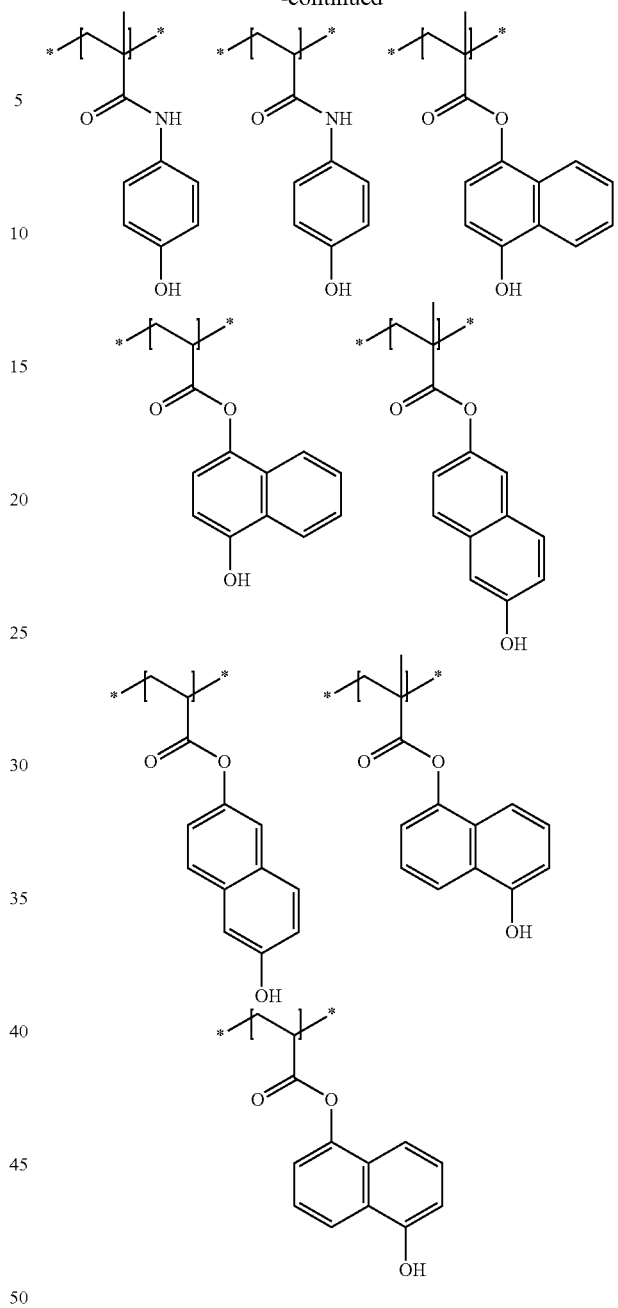

It is preferred for compound (D) to have a structure in which the hydrogen atom of the phenolic hydroxyl group is replaced by a group with a non-acid-decomposable polyalicyclic hydrocarbon structure from the viewpoint that high glass transition temperature (Tg) can be realized and that dry etching resistance can be enhanced.

When compound (D) has the above specified structure, the glass transition temperature (Tg) of compound (D) is increased, so that a very hard resist film can be formed, thereby permitting the controls of acid diffusion and dry etching resistance. Accordingly, the diffusion of acids in areas exposed to actinic rays or radiation, such as electron beams or extreme violet, can be effectively inhibited, thereby enhancing the resolving power, pattern shape and LER with respect to micropatterns. It can also be presumed that the introduction of the non-acid-decomposable polyalicyclic hydrocarbon structure in compound (D) contributes toward enhancement of dry etching resistance. Furthermore, although the detail is not apparent, the polyalicyclic hydrocarbon structure exhibits a high hydrogen radical donating capability, thereby providing a hydrogen source at the decomposition of a photoacid generator. Thus, it is presumed that the efficiency of decomposition of the photoacid generator is enhanced, thereby realizing an enhanced acid generating efficiency. It is assumed that this contributes toward an enhanced sensitivity.

In the above specified structure that may be introduced in compound (D) according to the present invention, the aromatic ring, such as a benzene ring, and the group with a non-acid-decomposable polyalicyclic hydrocarbon structure are connected to each other via the oxygen atom from the phenolic hydroxyl group. As mentioned above, this structure not only contributes toward high dry etching resistance but also can enhance the glass transition temperature (Tg) of compound (D). It is presumed that high resolving power is provided by the effect of a combination of these.

The term "non-acid-decomposable" used in the present invention means the property that no decomposition reaction is induced by acids generated by photoacid generators.

In particular, it is preferred for the group with a non-acid-decomposable polyalicyclic hydrocarbon structure to be a group that is stable in an acid and an alkali. The group that is stable in an acid and an alkali refers to a group exhibiting neither acid decomposability nor alkali decomposability. Herein, the acid decomposability refers to the property that a decomposition reaction is induced by the action of acids generated by photoacid generators.

The alkali decomposability refers to the property that a decomposition reaction is induced by the action of an alkali developer. As the group exhibiting alkali decomposability, there can be mentioned any of the heretofore known groups (for example, groups with lactone structures, etc.) that when acted on by an alkali developer, are decomposed to thereby increase the rate of dissolution in the alkali developer, which groups are contained in the resins appropriately used in positive chemically amplified resist compositions.

The group with a polyalicyclic hydrocarbon structure is not particularly limited as long as it is a monovalent group with a polyalicyclic hydrocarbon structure. The sum of carbon atoms thereof is preferably in the range of 5 to 40, more preferably 7 to 30. The polyalicyclic hydrocarbon structure within rings thereof may contain an unsaturated bond.

The polyalicyclic hydrocarbon structure in the group with a polyalicyclic hydrocarbon structure refers to a structure containing a plurality of monoalicyclic hydrocarbon groups, or a polycycle-containing alicyclic hydrocarbon structure, and may be a bridged one. The monoalicyclic hydrocarbon groups are preferably cycloalkyl groups each having 3 to 8 carbon atoms. As such, there can be mentioned, for example, a cyclopropyl group, a cyclopentyl group, a cyclohexyl group, a cyclobutyl group, a cyclooctyl group and the like. The structure containing a plurality of monoalicyclic hydrocarbon groups contains a plurality of these groups. The structure containing a plurality of monoalicyclic hydrocarbon groups preferably contains 2 to 4, most preferably 2, monoalicyclic hydrocarbon groups.

As the polycycle-containing alicyclic hydrocarbon structure, there can be mentioned, for example, a bicyclo, tricyclo or tetracyclo structure having 5 or more carbon atoms. A polycyclo structure having 6 to 30 carbon atoms is preferred. As such, there can be mentioned, for example, an adamantane structure, a decalin structure, a norbornane structure, a norbornene structure, a cedrol structure, an isobornane structure, a bornane structure, a dicyclopentane structure, an α-pinane structure, a tricyclodecane structure, a tetracyclododecane structure or an androstane structure. The carbon atoms of each of the mono- or polycycloalkyl groups may be partially replaced with a heteroatom, such as an oxygen atom.

As preferred examples of the above polyalicyclic hydrocarbon structures, there can be mentioned an adamantane structure, a decalin structure, a norbornane structure, a norbornene structure, a cedrol structure, a structure containing a plurality of cyclohexyl groups, a structure containing a plurality of cycloheptyl groups, a structure containing a plurality of cyclooctyl groups, a structure containing a plurality of cyclodecanyl groups, a structure containing a plurality of cyclododecanyl groups and a tricyclodecane structure. An adamantane structure is most preferred from the viewpoint of dry etching resistance (namely, it is most preferred for the above-mentioned group with a non-acid-decomposable polyalicyclic hydrocarbon structure to be a group with a non-acid-decomposable adamantane structure).

Chemical formulae of these polyalicyclic hydrocarbon structures (with respect to a structure containing a plurality of monoalicyclic hydrocarbon groups, the monoalicyclic hydrocarbon structure (for example, any of the structures of formulae (47) to (50) below) corresponding to the monoalicyclic hydrocarbon groups) are shown below.

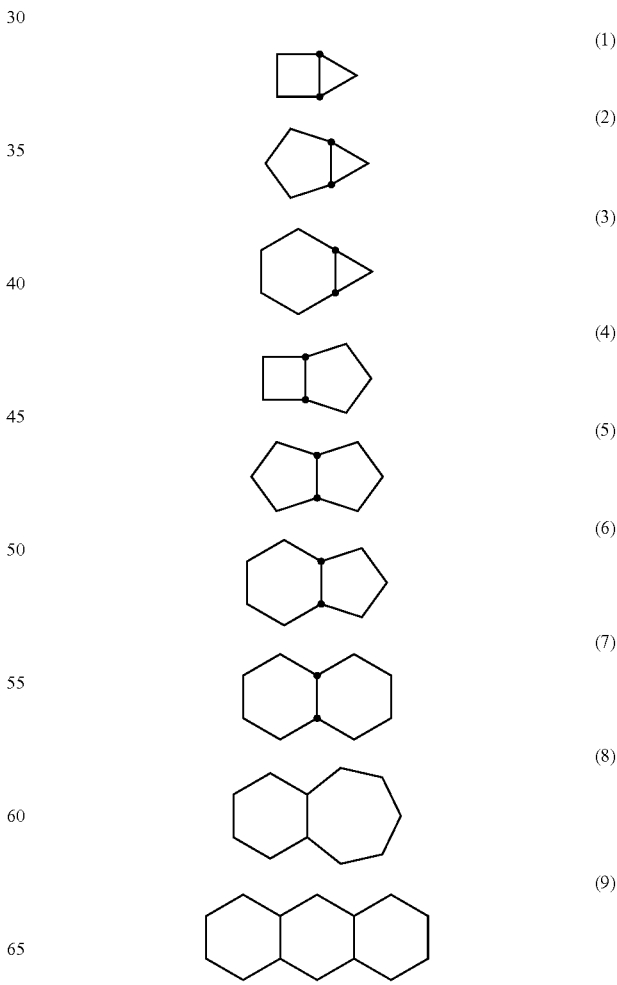

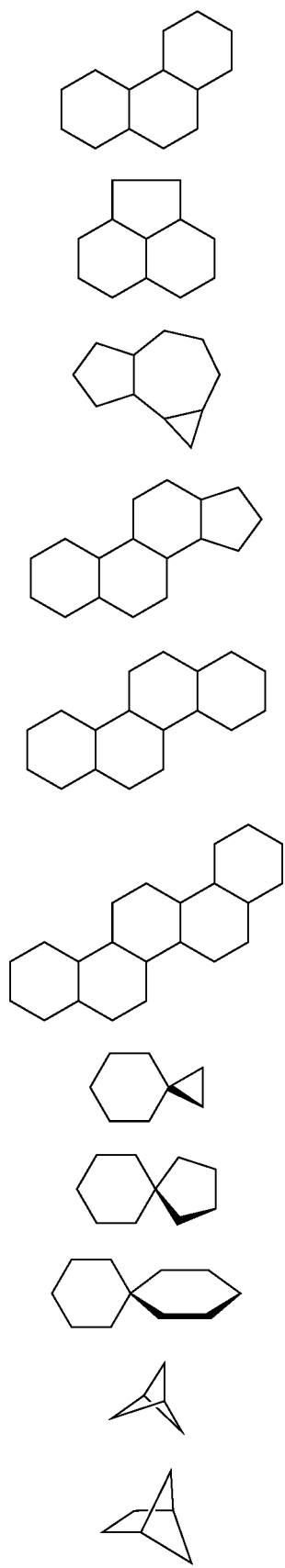
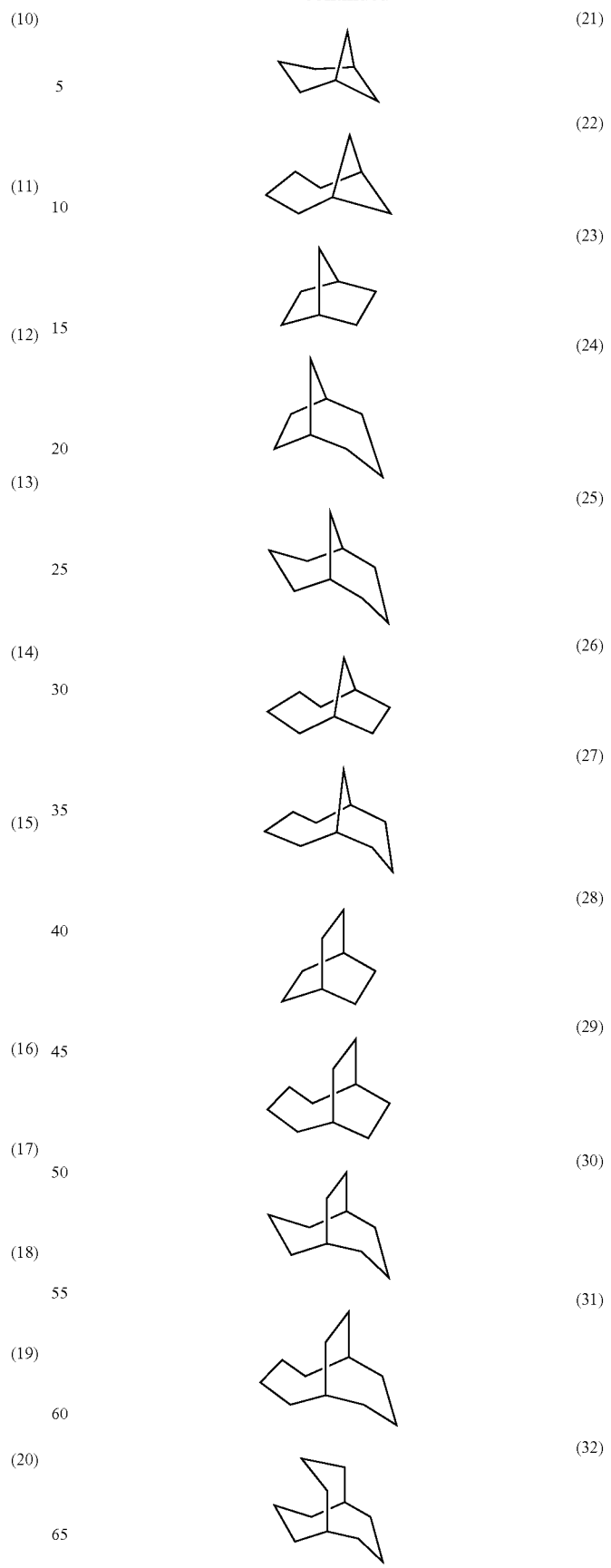

-continued

(33) 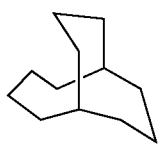

(34) 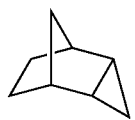

(35) 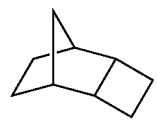

(36) 

(37) 

(38) 

(39) 

(40) 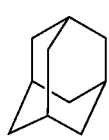

(41) 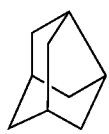

(42) 

(43) 

(44) 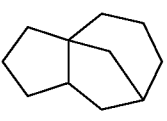

-continued

(45) 

(46) 

(47) 

(48) 

(49) 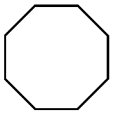

(50) 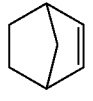

(51) 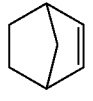

Substituents may be introduced in these polyalicyclic hydrocarbon structures. As the substituents, there can be mentioned, for example, an alkyl group (preferably 1 to 6 carbon atoms), a cycloalkyl group (preferably 3 to 10 carbon atoms), an aryl group (preferably 6 to 15 carbon atoms), a halogen atom, a hydroxyl group, an alkoxy group (preferably 1 to 6 carbon atoms), a carboxyl group, a carbonyl group, a thiocarbonyl group, an alkoxycarbonyl group (preferably 2 to 7 carbon atoms) and groups each comprised of a combination of these (preferably 1 to 30 carbon atoms in total, more preferably 1 to 15 carbon atoms in total).

Among these polyalicyclic hydrocarbon structures, the structures of formulae (7), (23), (40), (41) and (51) above and the structure containing two monovalent groups each corresponding to the structure of formula (48) above in which a bonding hand is created at an arbitrary hydrogen atom are preferred. The structures of formulae (23), (40) and (51) above and the structure containing two monovalent groups each corresponding to the structure of formula (48) above in which a bonding hand is created at an arbitrary hydrogen atom are more preferred. The structure of formula (40) above is most preferred.

It is preferred for the group with a polyalicyclic hydrocarbon structure to be a monovalent group corresponding to any of these polyalicyclic hydrocarbon structures in which a bonding hand is created at an arbitrary hydrogen atom.

It is preferred for the structure in which the hydrogen atom of phenolic hydroxyl group is replaced by the above group with a non-acid-decomposable polyalicyclic hydrocarbon structure to be contained in compound (D) being a polymeric compound as a repeating unit with the structure in which the hydrogen atom of phenolic hydroxyl group is replaced by the above group with a non-acid-decomposable polyalicyclic hydrocarbon structure. More preferably, the structure is contained in compound (D) as any of repeating units of general formula (3) below.

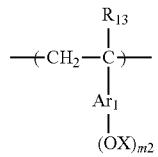
(3)

In general formula (3), $R_{13}$ represents a hydrogen atom or a methyl group.

X represents a group with a non-acid-decomposable polyalicyclic hydrocarbon structure.

$Ar_1$ represents an aromatic ring; and m2 is an integer of 1 or greater.

$R_{13}$ in general formula (3) is a hydrogen atom or a methyl group, in which a hydrogen atom is especially preferred.

As the aromatic ring represented by $Ar_1$ in general formula (3), there can be mentioned, for example, an optionally substituted aromatic hydrocarbon ring having 6 to 18 carbon atoms, such as a benzene ring, a naphthalene ring, an anthracene ring, a fluorene ring or a phenanthrene ring, or an aromatic ring heterocycle containing a heterocycle, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring or a triazole ring. Of these, a benzene ring and a naphthalene ring are preferred from the viewpoint of resolution. A benzene ring is most preferred.

A substituent other than the above —OX groups may be introduced in the aromatic ring represented by $Ar_1$. As the substituent, there can be mentioned, for example, an alkyl group (preferably 1 to 6 carbon atoms), a cycloalkyl group (preferably 3 to 10 carbon atoms), an aryl group (preferably 6 to 15 carbon atoms), a halogen atom, a hydroxyl group, an alkoxy group (preferably 1 to 6 carbon atoms), a carboxyl group or an alkoxycarbonyl group (preferably 2 to 7 carbon atoms). The substituent is preferably an alkyl group, an alkoxy group or an alkoxycarbonyl group, more preferably an alkoxy group.

X represents a group with a non-acid-decomposable polyalicyclic hydrocarbon structure. Particular examples and preferred ranges of the groups each with a non-acid-decomposable polyalicyclic hydrocarbon structure represented by X are the same as mentioned above. It is preferred for X to be any of groups of the formula —Y—$X_2$ in general formula (4) to be described hereinafter.

In the formula, m2 is preferably an integer of 1 to 5, most preferably 1. When m2 is 1 and $Ar_1$ is a benzene ring, the position of —OX substitution may be any of the para-, meta- and ortho-positions to the site of bonding to the principal chain of the polymer in the benzene ring. The para- and meta-positions are preferred, and the para-position is more preferred.

In the present invention, it is preferred for the repeating units of general formula (3) above to be the repeating units of general formula (4) below.

When use is made of polymeric compound (D) comprising any of repeating units of general formula (4), the Tg value of polymeric compound (D) is high, so that a very hard resist film is formed. Accordingly, the acid diffusion and dry etching resistance can be controlled highly reliably.

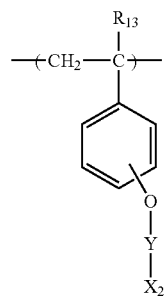
(4)

In general formula (4), $R_{13}$ represents a hydrogen atom or a methyl group.

Y represents a single bond or a bivalent connecting group.

$X_2$ represents a non-acid-decomposable polyalicyclic hydrocarbon group.

Among the repeating units of general formula (4) above, examples preferably employed in the present invention will be described below.

$R_{13}$ in general formula (4) represents a hydrogen atom or a methyl group, in which a hydrogen atom is especially preferred.

In general formula (4), Y is preferably a bivalent connecting group. The bivalent connecting group represented by Y is preferably a carbonyl group, a thiocarbonyl group, an alkylene group (preferably 1 to 10 carbon atoms, more preferably 1 to 5 carbon atoms), a sulfonyl group, —$COCH_2$—, —NH—, or a bivalent connecting group comprised of a combination of these (preferably, in total, 1 to 20 carbon atoms, more preferably 1 to 10 carbon atoms). The bivalent connecting group is more preferably a carbonyl group, —$COCH_2$—, a sulfonyl group, —CONH— or —CSNH—, further more preferably a carbonyl group or —$COCH_2$—, and most preferably a carbonyl group.

$X_2$ represents a polyalicyclic hydrocarbon group, being non-acid-decomposable. The sum of carbon atoms of the polyalicyclic hydrocarbon group is preferably in the range of 5 to 40, more preferably 7 to 30. The polyalicyclic hydrocarbon group within its rings may contain an unsaturated bond.

This polyalicyclic hydrocarbon group refers to a group containing a plurality of monoalicyclic hydrocarbon groups, or a polycycle-containing alicyclic hydrocarbon group, and may be a bridged one. The monoalicyclic hydrocarbon groups are preferably cycloalkyl groups each having 3 to 8 carbon atoms. As such, there can be mentioned, for example, a cyclopropyl group, a cyclopentyl group, a cyclohexyl group, a cyclobutyl group, a cyclooctyl group and the like. The group containing a plurality of monoalicyclic hydrocarbon groups contains a plurality of these groups. The group containing a plurality of monoalicyclic hydrocarbon groups preferably contains 2 to 4, most preferably 2, monoalicyclic hydrocarbon groups.

As the polycycle-containing alicyclic hydrocarbon group, there can be mentioned a group with, for example, a bicyclo, tricyclo or tetracyclo structure having 5 or more carbon atoms. A group with a polycyclo structure having 6 to 30 carbon atoms is preferred. As such, there can be mentioned, for example, an adamantyl group, a norbornyl group, a norbornenyl group, an isobornyl group, a camphonyl group, a dicyclopentyl group, an α-pinanyl group, a tricyclodecanyl group, a tetracyclododecyl group or an androstanyl group.

The carbon atoms of each of the mono- or polycycloalkyl groups may be partially replaced with a heteroatom, such as an oxygen atom.

As preferred polyalicyclic hydrocarbon groups represented by $X_2$ above, there can be mentioned an adamantyl group, a decalin group, a norbornyl group, a norbornenyl group, a cedrol group, a group containing a plurality of cyclohexyl groups, a group containing a plurality of cycloheptyl groups, a group containing a plurality of cyclooctyl groups, a group containing a plurality of cyclodecanyl groups, a group containing a plurality of cyclododecanyl groups and a tricyclodecanyl group. An adamantyl group is most preferred from the viewpoint of dry etching resistance. Chemical formulae of the polyalicyclic hydrocarbon structures in the polyalicyclic hydrocarbon groups represented by $X_2$ are the same as the above chemical formulae of the polyalicyclic hydrocarbon structures in the groups each with a polyalicyclic hydrocarbon structure. Preferred ranges are also the same. As the polyalicyclic hydrocarbon group represented by $X_2$, there can be mentioned a monovalent group corresponding to any of the above-mentioned polyalicyclic hydrocarbon structures in which a bonding hand is created at an arbitrary hydrogen atom.

Substituents may be introduced in these alicyclic hydrocarbon groups. As such substituents, there can be mentioned those set forth above as being introducible in the polyalicyclic hydrocarbon structures.

In general formula (4), the position of —O—Y—$X_2$ substitution may be any of the para-, meta- and ortho-positions to the site of bonding to the principal chain of the polymer in the benzene ring. The para-position is preferred.

In the present invention, it is most preferred for the repeating units of general formula (3) above to be repeating units of general formula (4') below.

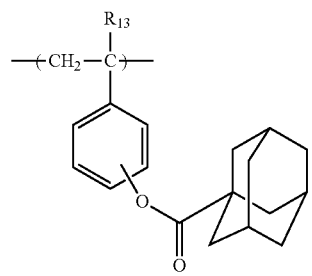

(4')

In general formula (4'), $R_{13}$ represents a hydrogen atom or a methyl group.

$R_{13}$ in general formula (4') is a hydrogen atom or a methyl group, in which a hydrogen atom is especially preferred.

In general formula (4'), the position of substitution with the adamantyl ester group may be any of the para-, meta- and ortho-positions to the site of bonding to the principal chain of the polymer in the benzene ring. The para-position is preferred.

Specific examples of the repeating units of general formula (3) are shown below.

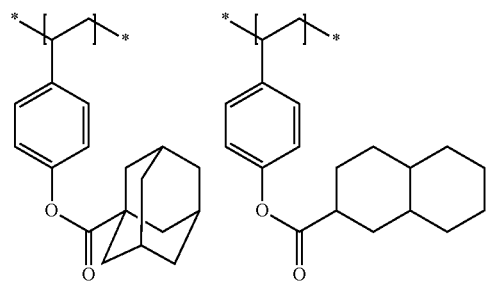

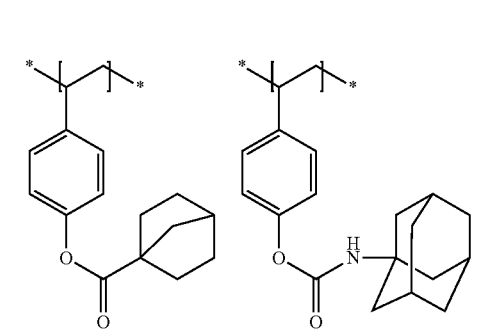

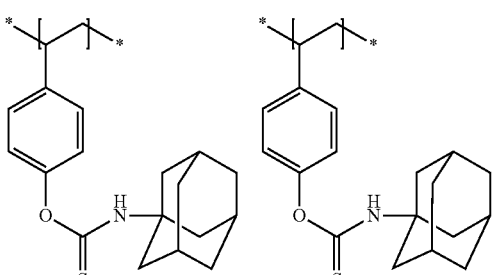

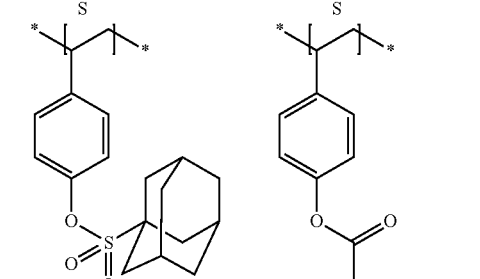

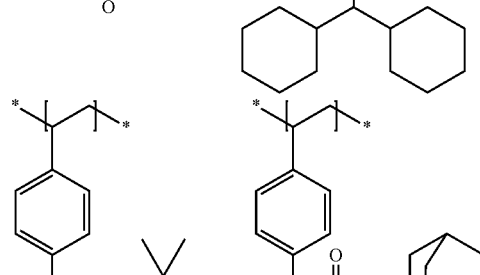

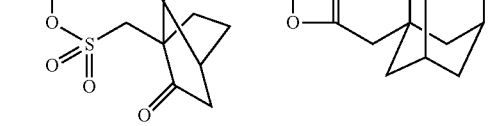

111
-continued
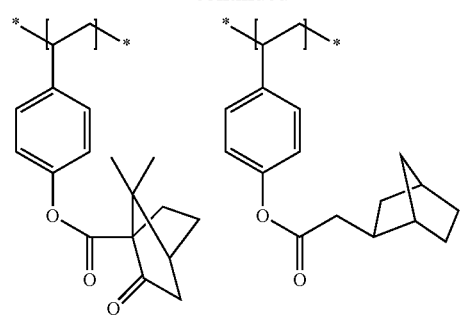
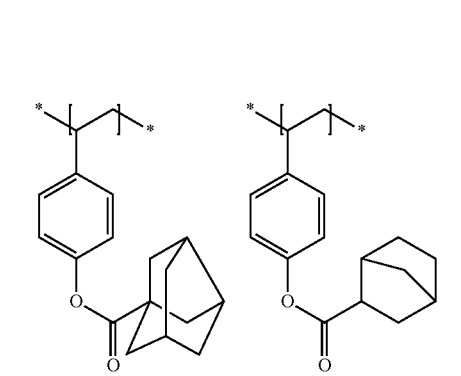
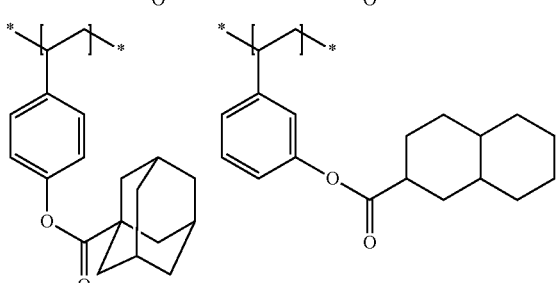
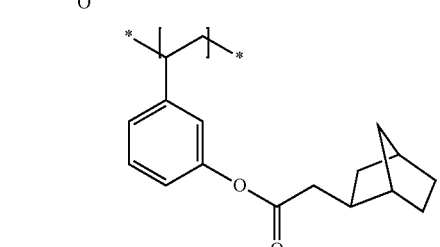
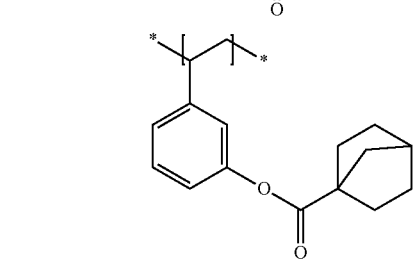
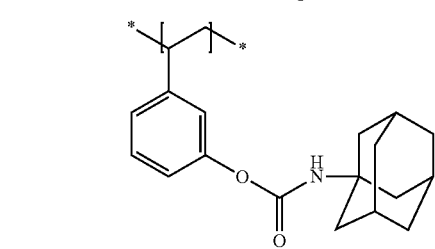
112
-continued
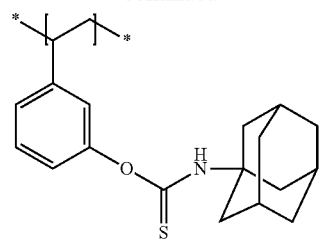
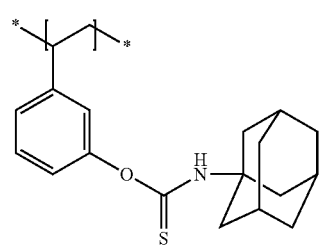
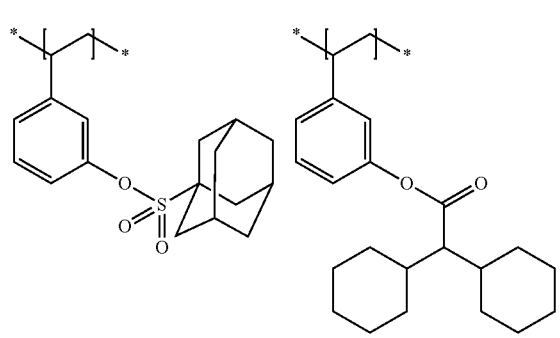
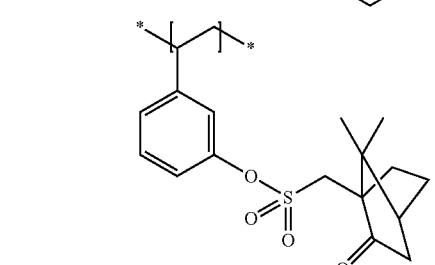
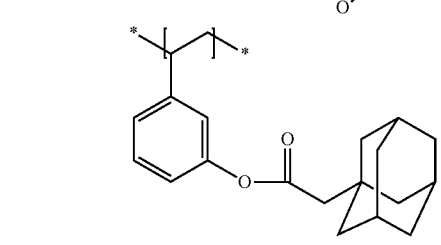
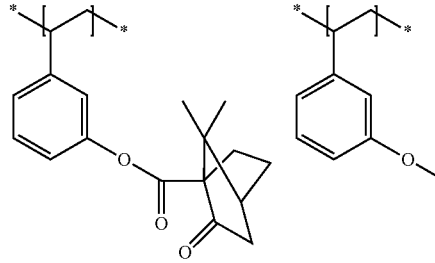

-continued

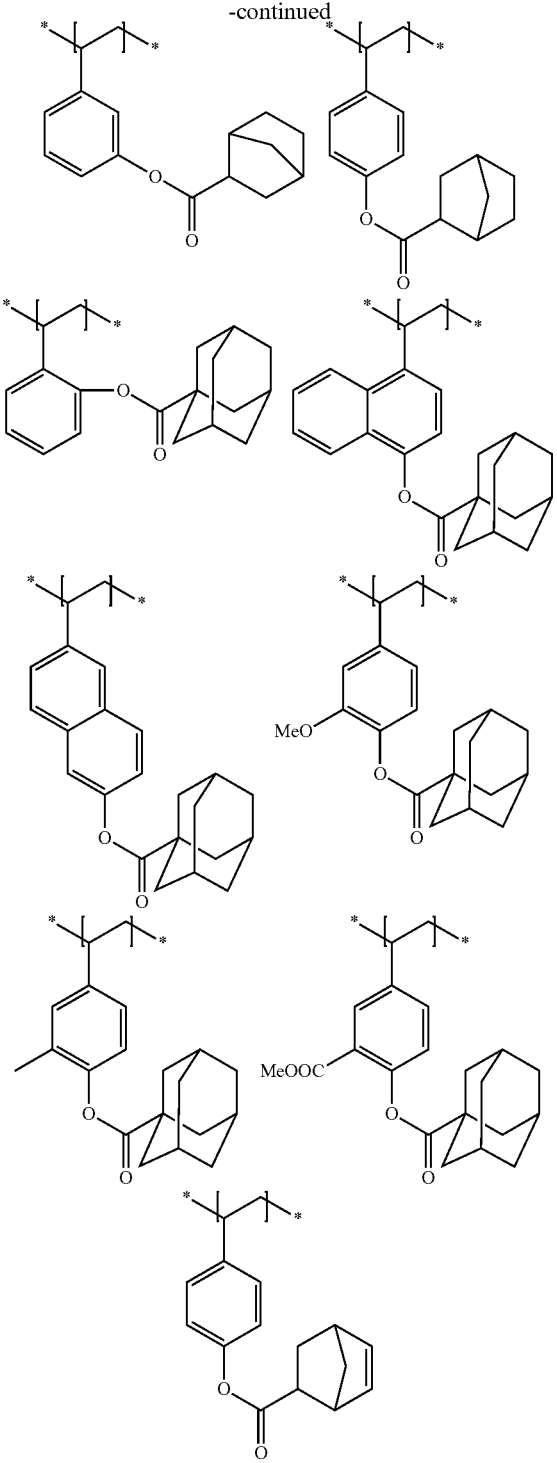

When compound (D) is a polymeric compound and comprises a repeating unit with the structure in which the hydrogen atom of phenolic hydroxyl group is replaced by the above group with a non-acid-decomposable polyalicyclic hydrocarbon structure, the content of this repeating unit is preferably in the range of 1 to 40 mol %, more preferably 2 to 30 mol %, based on all the repeating units of compound (D) as a polymeric compound.

It is also preferred for compound (D) as a polymeric compound for use in the present invention to further comprise the following repeating units (hereinafter also referred to as "other repeating units") as repeating units other than the foregoing repeating units.

As examples of polymerizable monomers for the formation of such other repeating units, there can be mentioned styrene, an alkyl-substituted styrene, an alkoxy-substituted styrene, a halogenated styrene, an O-alkylated styrene, an O-acylated styrene, a hydrogenated hydroxystyrene, maleic anhydride, an acrylic acid derivative (acrylic acid, an acrylic ester or the like), a methacrylic acid derivative (methacrylic acid, a methacrylic ester or the like), an N-substituted maleimide, acrylonitrile, methacrylonitrile, vinylnaphthalene, vinylanthracene, an optionally substituted indene and the like.

It is optional for compound (D) as a polymeric compound to contain these other repeating units. When these other repeating units are contained, the content thereof in compound (D) as a polymeric compound, based on all the repeating units constituting compound (D) as a polymeric compound, is generally in the range of 1 to 30 mol %, preferably 1 to 20 mol % and more preferably 2 to 10 mol %.

Compound (D) as a polymeric compound can be synthesized in accordance with the heretofore known radical polymerization method, anion polymerization method or living radical polymerization method (iniferter method or the like). For example, in the anion polymerization method, a vinyl monomer is dissolved in an appropriate organic solvent, and reacted by use of a metal compound (butyllithium, etc.) as an initiator generally in cooled condition, so that a polymer can be obtained.

As compound (D) being a polymeric compound, use can also be made of a polyphenol compound (for example, JP-A-2008-145539) produced by a condensation reaction between an aromatic ketone or aromatic aldehyde and a compound containing 1 to 3 phenolic hydroxyl groups; a calixarene derivative (for example, JP-A-2004-18421); a Noria derivative (for example, JP-A-2009-222920); or a polyphenol derivative (for example, JP-A-2008-94782). Compound (D) may be synthesized through modification by a polymer reaction.

Also, compound (D) as a polymeric compound is preferably prepared by synthesizing a polymer in accordance with the radical polymerization method or anion polymerization method and modifying the polymer through a polymer reaction.

The weight average molecular weight of compound (D) as a polymeric compound is preferably in the range of 1000 to 200,000, more preferably 2000 to 50,000 and further more preferably 2000 to 15,000.

The polydispersity index (molecular weight distribution, Mw/Mn) of compound (D) as a polymeric compound is preferably 2.0 or below. From the viewpoint of sensitivity and resolution enhancements, the polydispersity index is preferably in the range of 1.0 to 1.80, more preferably 1.0 to 1.60 and most preferably 1.0 to 1.20. The use of living polymerization, such as living anion polymerization, preferably uniformizes the polydispersity index (molecular weight distribution) of obtained polymeric compound. The weight average molecular weight and polydispersity index of compound (D) as a polymeric compound are defined as polystyrene-equivalent values determined by GPC measurement.

The amount of compound (D) added to the composition of the present invention, based on the total solids of the composition, is preferably in the range of 30 to 95 mass %, more preferably 40 to 90 mass % and most preferably 50 to 85 mass %.
Specific examples of compounds (D) are shown below, which in no way limit the present invention.
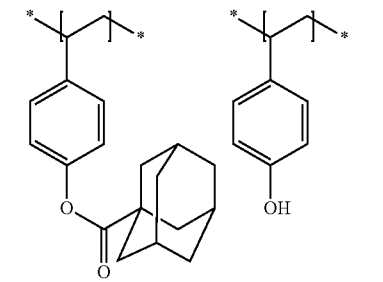
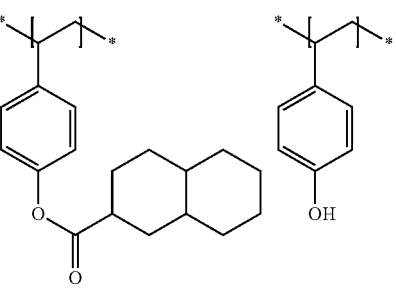
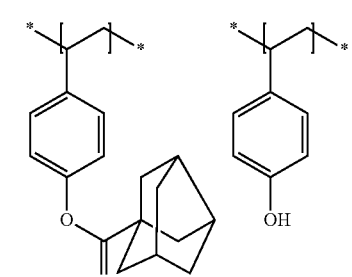
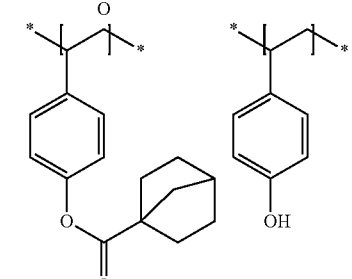
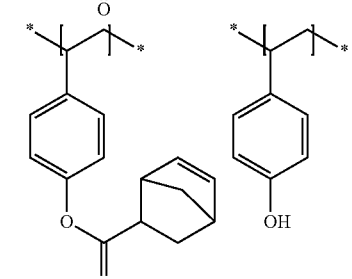
-continued
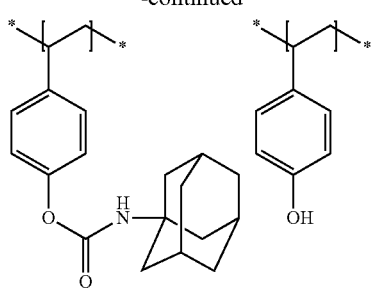
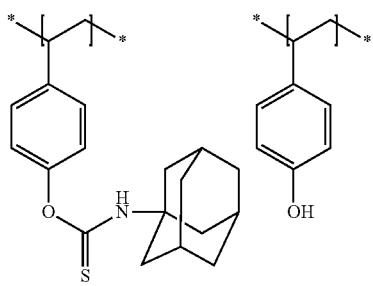
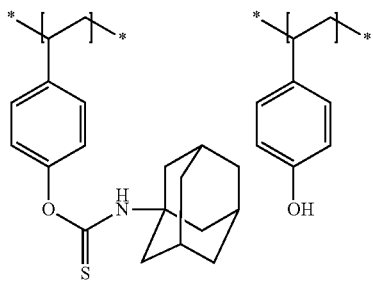
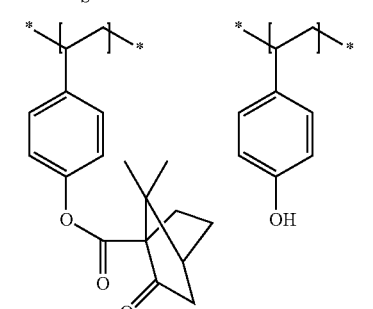
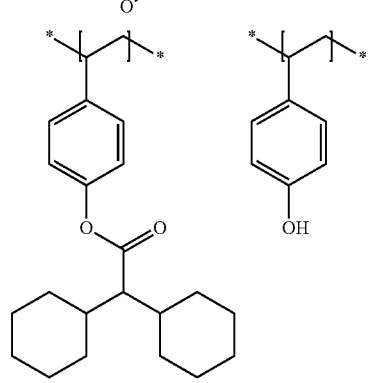

117
-continued
118
-continued
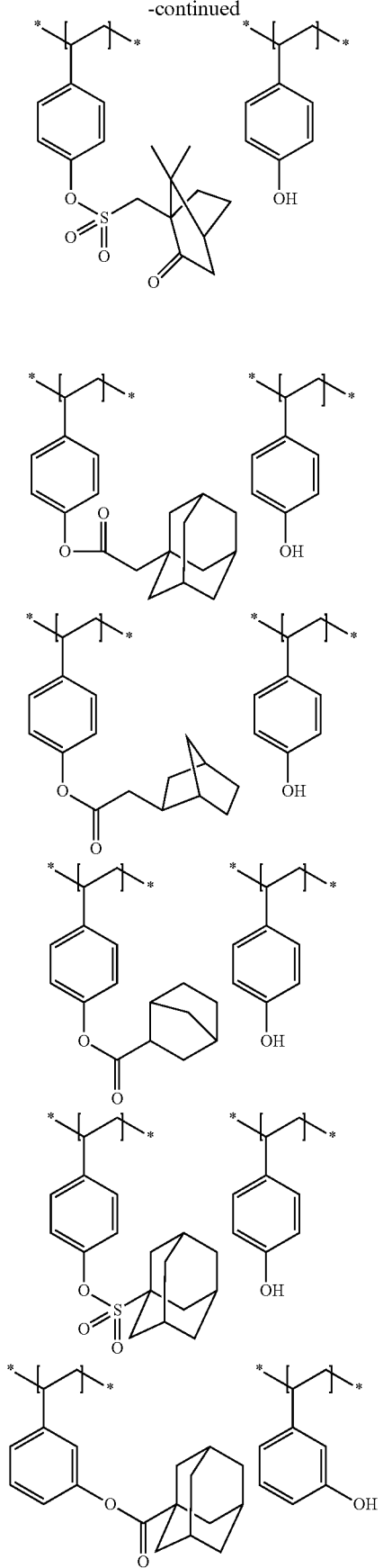
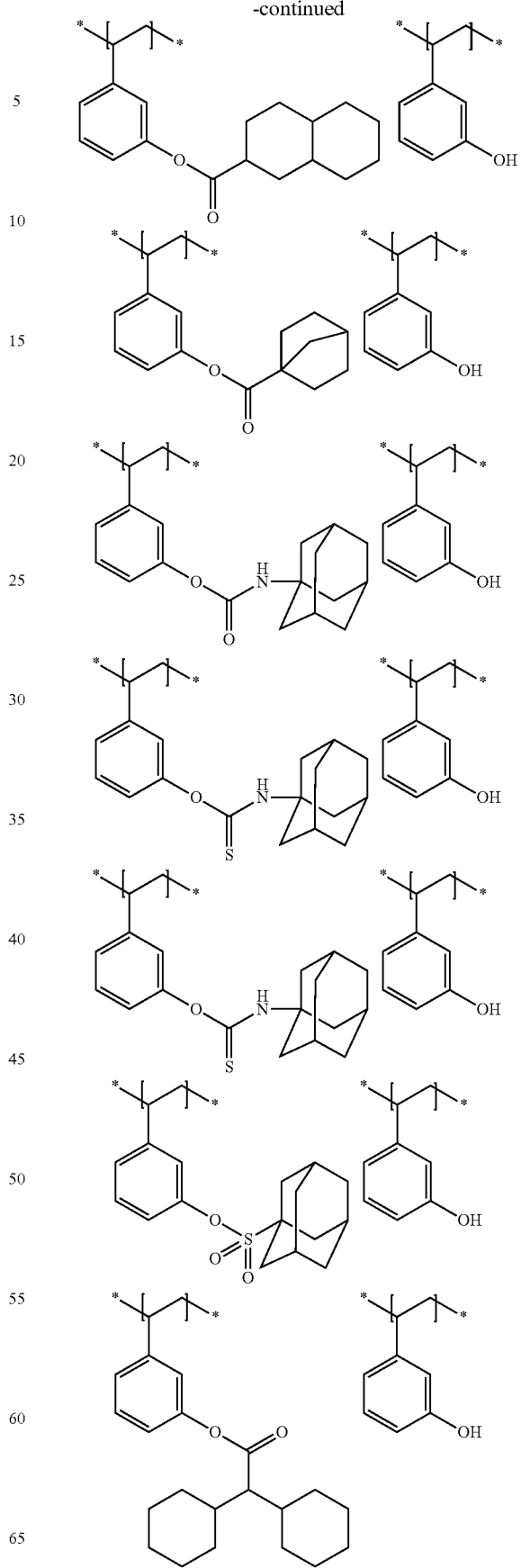

119
-continued
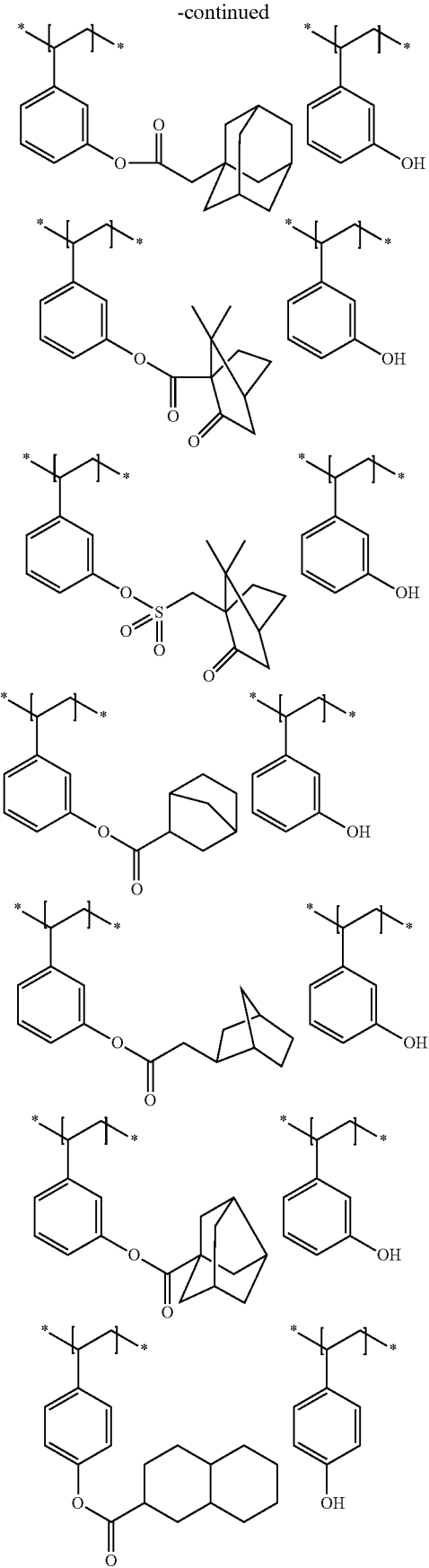
120
-continued
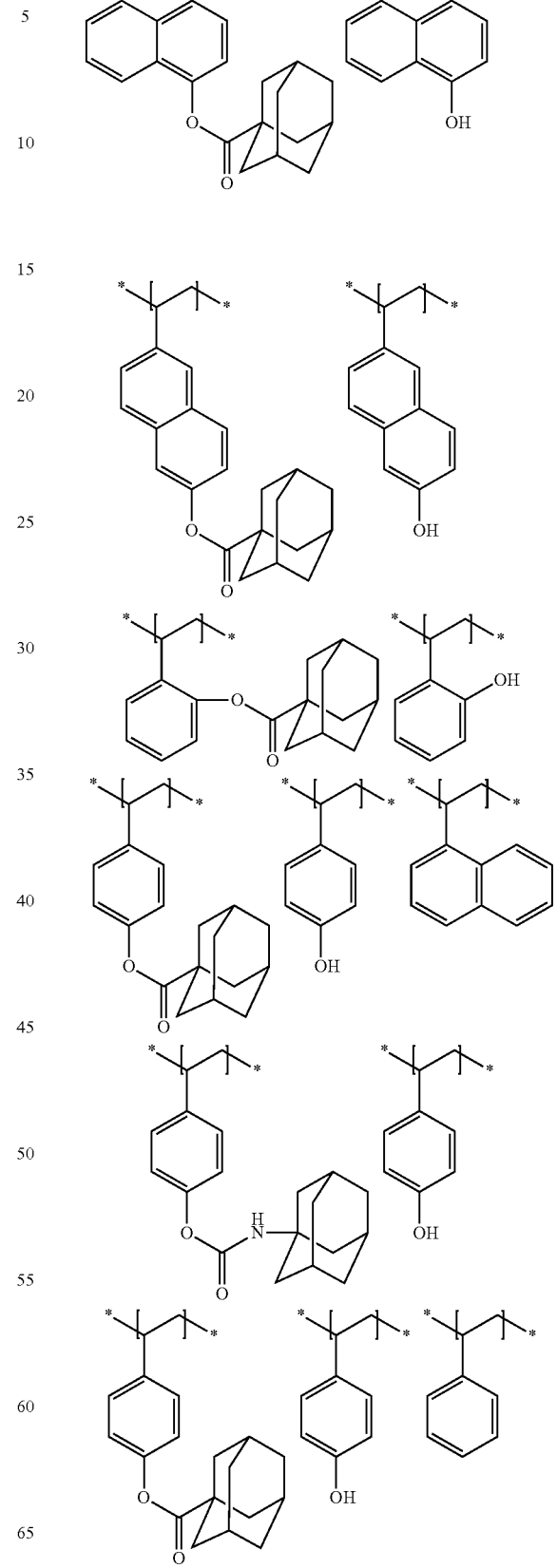

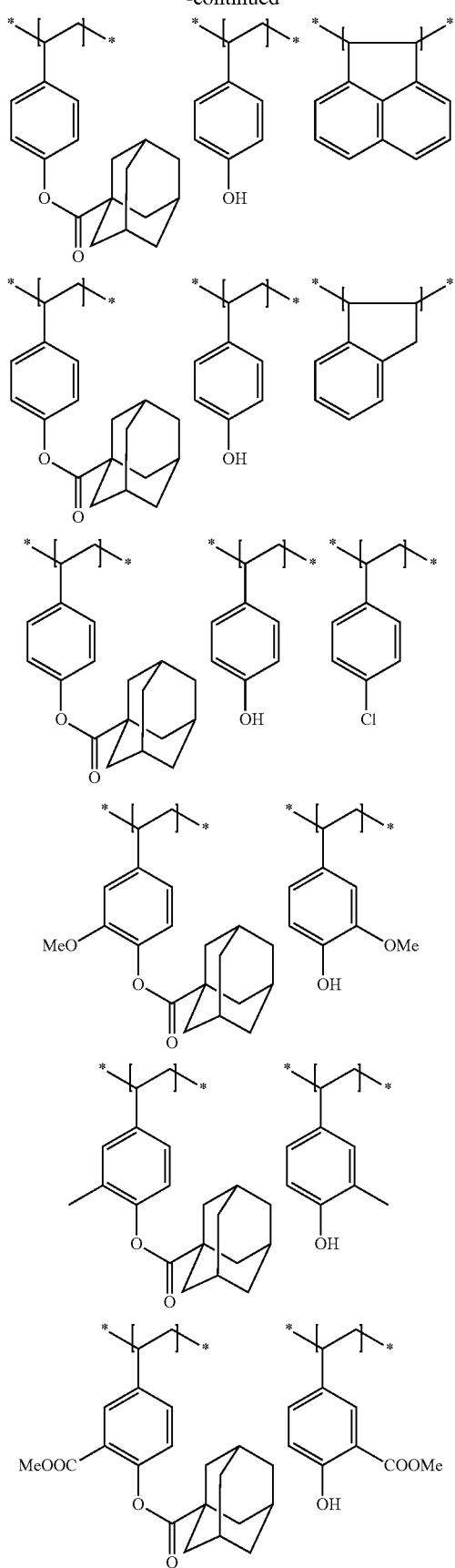

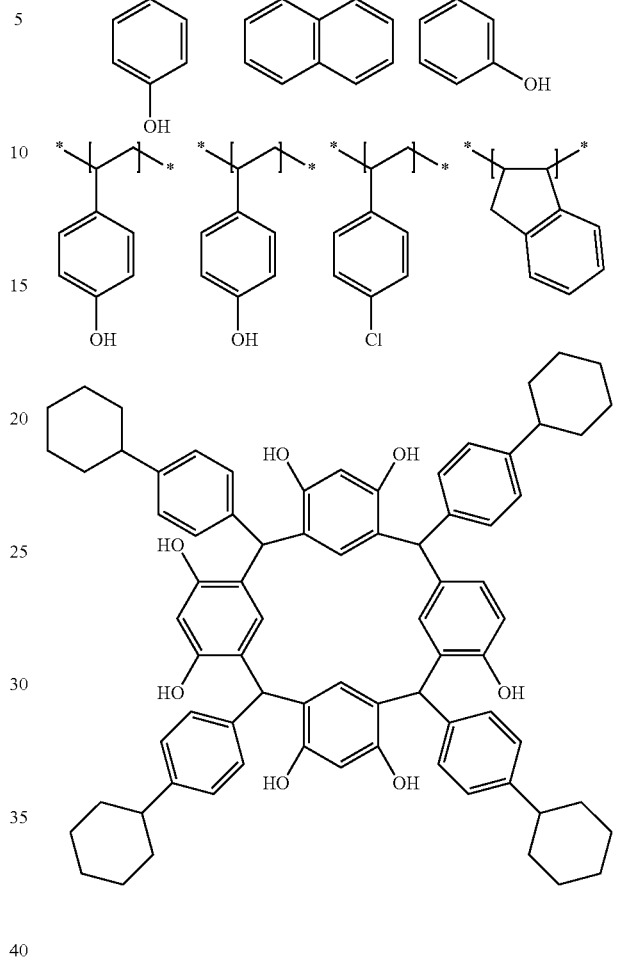

[5] Basic Compound

It is preferred for the composition of the present invention to comprise a basic compound as an acid trapping agent in addition to the foregoing components. The incorporation of a basic compound lessens any performance change over time from exposure to light to postbake. It is preferred for the basic compound to be an organic basic compound. In particular, as such, there can be mentioned aliphatic amines, aromatic amines, heterocyclic amines, a nitrogen-containing compound in which a carboxyl group is introduced, a nitrogen-containing compound in which a sulfonyl group is introduced, a nitrogen-containing compound in which a hydroxyl group is introduced, a nitrogen-containing compound in which a hydroxyphenyl group is introduced, an alcoholic nitrogen-containing compound, amide derivatives, imide derivatives and the like. Further, an amine oxide compound (described in JP-A-2008-102383) and an ammonium salt (preferably a hydroxide or a carboxylate; in particular, a tetraalkylammonium hydroxide, typically tetrabutylammonium hydroxide, is preferred from the viewpoint of LER) can be appropriately used.

Moreover, a compound whose basicity is increased by the action of an acid can be used as one type of basic compound.

Particular examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, compounds set forth as examples in column 3, line 60 et seq. of U.S. Pat. No. 6,040,112, 2-[2-{2-(2,2-dimethoxy-phenoxyethoxy)ethyl}-bis(2-methoxyethyl)]amine, compounds (C1-1) to (C3-3) set forth as examples in Section [0066] of U.S. Patent Application Publication No. 2007/0224539 A1, and the like. As compounds with a nitrogen-containing heterocyclic structure, there can be mentioned 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]non-5-ene, 1,8-diazabicyclo[5.4.0]undec-7-ene, tetrabutylammonium hydroxide, and the like.

Furthermore, appropriate use can be made of a photolytic basic compound (compound that initially exhibits basicity since a basic nitrogen atom acts as a base but when exposed to actinic rays or radiation, is decomposed to thereby generate an amphoteric ion compound containing a basic nitrogen atom and an organic acid moiety, these inducing an intramolecular neutralization to thereby result in decrease or loss of the basicity, for example, any of onium salts described in Japanese Patent 3577743, JP-A-2001-215689, JP-A-2001-166476 and JP-A-2008-102383) and a photobasicity generator (for example, a compound described in JP-A-2010-243773).

Among these basic compounds, an ammonium salt is preferred from the viewpoint of resolution enhancement.

In the present invention, the content of basic compound, based on the total solids of the composition, is preferably in the range of 0.01 to 10 mass %, more preferably 0.03 to 5 mass % and most preferably 0.05 to 3 mass %.

[6] Surfactant

The composition of the present invention may further comprise a surfactant in order to enhance its coatability. As nonlimiting examples of surfactants, there can be mentioned nonionic surfactants, such as a polyoxyethylene alkyl ether, a polyoxyethylene alkylallyl ether, a polyoxyethylene-polyoxypropylene block copolymer, a sorbitan fatty acid ester and a polyoxyethylene sorbitan fatty acid ester; fluorinated surfactants, such as Megafac F171 and Megafac F176 (produced by DIC Corporation), Florad FC430 (produced by Sumitomo 3M Ltd.), Surfinol E1004 (produced by Asahi Glass Co., Ltd.) and PF656 and PF6320 produced by OMNOVA SOLUTIONS, INC.; organosiloxane polymers; and polysiloxane polymers.

When the composition of the present invention contains a surfactant, the content thereof, based on the whole amount (excluding the solvent) of the composition, is preferably in the range of 0.0001 to 2 mass %, more preferably 0.0005 to 1 mass %.

[7] Organic Carboxylic Acid

It is preferred for the composition of the present invention to comprise an organic carboxylic acid in addition to the foregoing components. As appropriate organic carboxylic acid compounds, there can be mentioned an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, phthalic acid, terephthalic acid, isophthalic acid, 2-naphthoic acid, 1-hydroxy-2-naphthoic acid, 2-hydroxy-3-naphthoic acid and the like. When electron beam exposure is carried out in vacuum, there is the danger that vaporization thereof from the surface of the resist film occurs to thereby stain the inside of the lithography chamber. From this viewpoint, aromatic organic carboxylic acids are preferred. Among them, for example, benzoic acid, 1-hydroxy-2-naphthoic acid and 2-hydroxy-3-naphthoic acid can be appropriately used.

The ratio of organic carboxylic acid added, based on the total solids of the composition, is preferably in the range of 0.5 to 15 mass %, more preferably 2 to 10 mass %.

According to necessity, the composition of the present invention may further be loaded with a dye, a plasticizer, an acid amplifier (described in, for example, International Publication Nos. 95/29968 and 98/24000, JP-A's H8-305262, H9-34106 and H8-248561, Jpn. PCT National Publication No. H8-503082, U.S. Pat. No. 5,445,917, Jpn. PCT National Publication No. H8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943 and JP-A's H10-1508, H10-282642, H9-512498, 2000-62337, 2005-17730 and 2008-209889), etc. With respect to all of these compounds, there can be mentioned those described in JP-A-2008-268935.

[8] Carboxylic Acid Onium Salt

The composition of the present invention may comprise a carboxylic acid onium salt. As the carboxylic acid onium salt, there can be mentioned a carboxylic acid sulfonium salt, a carboxylic acid iodonium salt, a carboxylic acid ammonium salt or the like. Especially preferred carboxylic acid onium salts are a carboxylic acid sulfonium salt and a carboxylic acid iodonium salt. In the present invention, it is preferred for the carboxylate residue in the carboxylic acid onium salt to contain neither an aromatic group nor a carbon-carbon double bond. An especially preferred anion moiety thereof is a linear, branched, monocyclic or polycyclic alkyl carboxylate anion having 1 to 30 carbon atoms. A more preferred anion moiety is a carboxylate anion wherein the alkyl group is partially or wholly fluorinated. The alkyl in its chain may contain an oxygen atom. Accordingly, the transparency to light of wavelength 220 nm or shorter can be ensured; the sensitivity and resolving power can be enhanced; and the iso/dense bias and exposure margin can be improved.

The ratio of carboxylic acid onium salt added, based on the total solids of the composition, is preferably in the range of 1 to 15 mass %, more preferably 2 to 10 mass %.

[9] Acid Amplifier

The actinic-ray- or radiation-sensitive composition of the present invention may further comprise one or two or more of compounds (hereinafter also referred to as acid amplifiers) that when acted on by an acid, are decomposed to thereby generate acids. It is preferred for the acid generated by each acid amplifier to be a sulfonic acid, a methide acid or an imidic acid. The content of acid amplifier, based on the total solids of the composition, is preferably in the range of 0.1 to 50 mass %, more preferably 0.5 to 30 mass % and further more preferably 1.0 to 20 mass %.

The ratio of acid amplifier to acid generator added (solid content of acid amplifier based on the total solids of the composition/solid content of acid generator based on the total solids of the composition) is not particularly limited. However, the ratio is preferably in the range of 0.01 to 50, more preferably 0.1 to 20 and most preferably 0.2 to 1.0.

Nonlimiting examples of the acid amplifies that can be used in the present invention are shown below.

(PA-1)
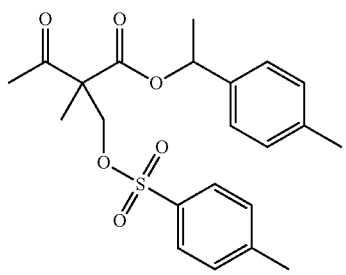
(PA-2)
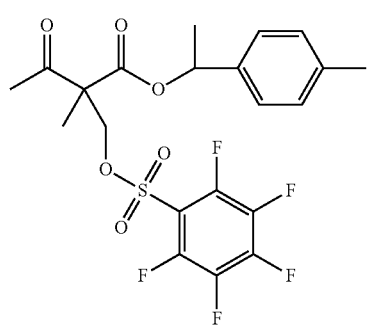
(PA-3)
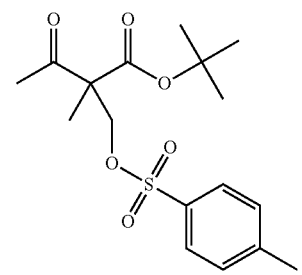
(PA-4)
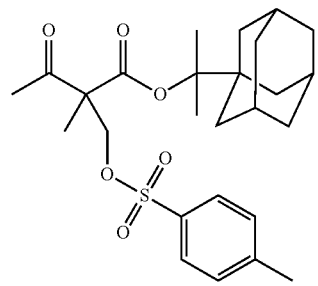
(PA-5)
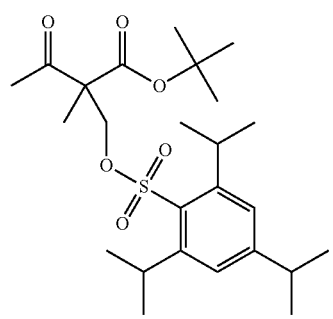
(PA-6)
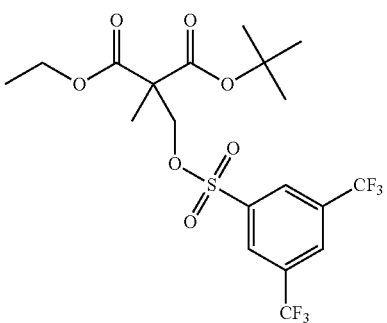
(PA-7)
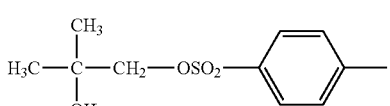
(PA-8)
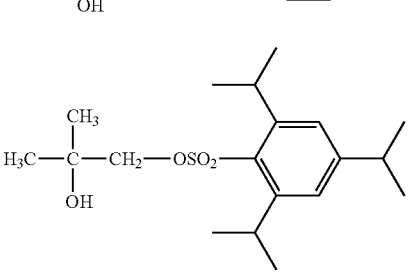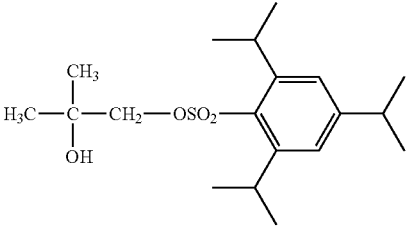
(PA-9)
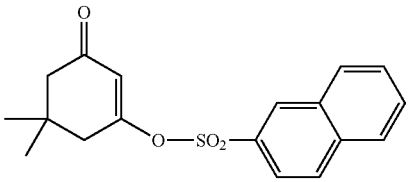
(PA-10)
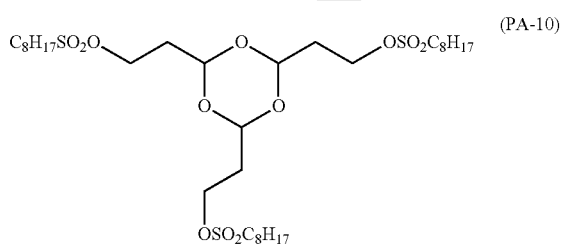
(PA-11)
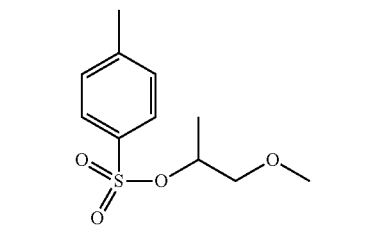
(PA-12)
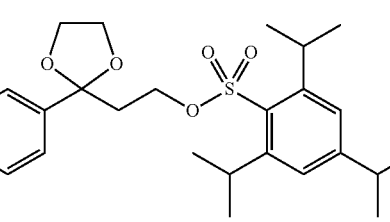

-continued (PA-13)
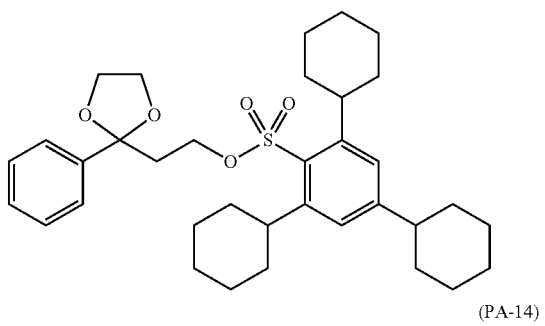

(PA-14)
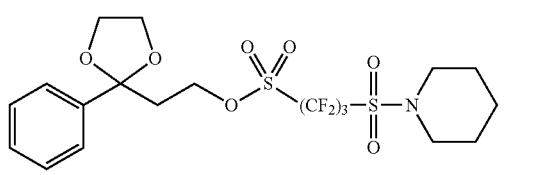

(PA-15)
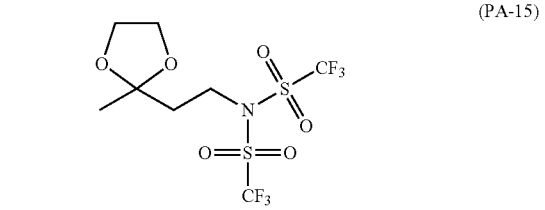

(PA-16)
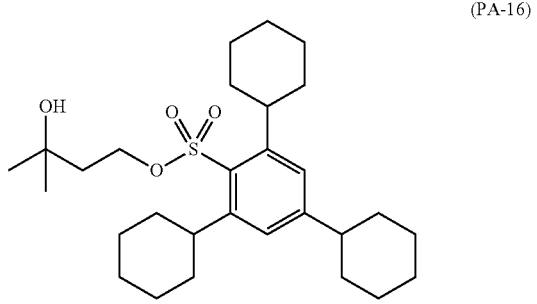

(PA-17)
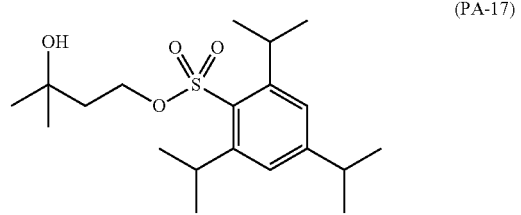

(PA-18)
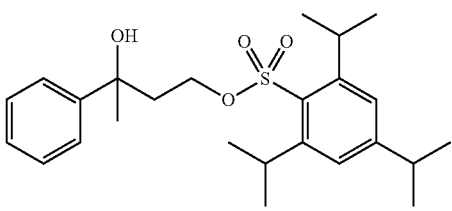

[10] Solvent

The composition of the present invention may comprise a solvent. Examples of preferred solvents include ethylene glycol monoethyl ether acetate, cyclohexanone, 2-heptanone, propylene glycol monomethyl ether (PGME, also known as 1-methoxy-2-propanol), propylene glycol monomethyl ether acetate (PGMEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl μ-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, ethylene carbonate and the like. These solvents may be used individually or in combination.

Preferably, the solids of the composition of the present invention are dissolved in any of the above solvents to thereby provide a solution of 1 to 40 mass % solid content. The solid content is more preferably in the range of 1 to 30 mass %, further more preferably 3 to 20 mass %.

<Resist Film and Mask Blank>

The present invention also relates to a resist film comprising the composition of the present invention. For example, this film is formed by applying the composition of the present invention onto a support, such as a substrate. It is preferred for the thickness of this film to be in the range of 0.02 to 0.1 μm. Appropriate methods of application onto a substrate include spin coating, roll coating, flow coating, dip coating, spray coating, doctor coating and the like. Spin coating is preferred, which is preferably performed at a rotating speed of 1000 to 3000 rpm. Coating film is prebaked at 60 to 150° C. for 1 to 20 minutes, preferably 80 to 120° C. for 1 to 10 minutes, thereby obtaining a thin film.

As the material constituting the substrate to be wrought or the topmost surface layer thereof, in the instance of, for example, a semiconductor wafer, use can be made of a silicon wafer. Examples of the materials constituting the topmost surface layer include Si, $SiO_2$, SiN, SiON, TiN, WSi, BPSG, SOG, an organic antireflection film and the like.

Furthermore, the present invention relates to a mask blank provided with the resist film obtained in the above manner. When a pattern is formed on a photomask blank for photomask fabrication in order to obtain the mask blank provided with the resist film, a transparent substrate of quartz, calcium fluoride or the like can be mentioned as a useful transparent substrate. Generally, the substrate is laminated with necessary films selected from among functional films, such as a light shielding film, an antireflection film and a phase shift film and, additionally, an etching stopper film and an etching mask film. As the material of each of the functional films, use is made of silicon or a transition metal, such as chromium, molybdenum, zirconium, tantalum, tungsten, titanium or niobium. A film containing such a material is used in the form of a laminate. As the material for use in the topmost surface layer, there can be mentioned, for example, one whose main constituent material is silicon or a material comprised of silicon and, contained therein, oxygen and/or nitrogen; a silicon compound material whose main constituent material is a material comprised of the same and, contained therein, a transition metal; or a transition metal compound material whose main constituent material is a transition metal, especially at least one member selected from among chromium, molybdenum, zirconium, tantalum, tungsten, titanium, niobium and the like, or a material comprised of the same and, contained therein, at least one element selected from among oxygen, nitrogen and carbon.

The light shielding film, although may be in the form of a monolayer, is preferably in the form of a multilayer structure comprised of a plurality of materials superimposed one upon another by coating. In the multilayer structure, the thickness of each layer, although not particularly limited, is preferably in the range of 5 to 100 nm, more preferably 10 to 80 nm. The thickness of the whole of the light shielding film, although not particularly limited, is preferably in the range of 5 to 200 nm, more preferably 10 to 150 nm.

When a pattern formation is performed using a composition on a photomask blank whose topmost surface layer contains a material comprised of chromium and, contained therein, oxygen or nitrogen among the above-mentioned materials, generally, it is likely to experience the occurrence of a constricted shape near the substrate, known as an undercut shape. This undercut problem can be alleviated by the use of the present invention as compared with the prior art.

The actinic-ray- or radiation-sensitive film after exposure to actinic rays or radiation (electron beams, etc.) (hereinafter also referred to as exposure to light) and preferably bake (usually 80 to 150° C., preferably 90 to 130° C.) is developed with water. Thus, a desirable pattern can be obtained. Using this pattern as a mask, appropriate etching treatment, ion injection, etc. are carried out, thereby obtaining a semiconductor nanocircuit, an imprint mold structure, etc.

With respect to the process for manufacturing an imprint mold by use of the composition of the present invention, reference can be made to descriptions made in, for example, Japanese Patent No. 4109085, JP-A-2008-162101 and "Fundamentals of nanoimprint and its technology development/application deployment-technology of nanoimprint substrate and its latest technology deployment" edited by Yoshihiko Hirai, published by Frontier Publishing.

<Method of Forming Pattern>

The composition of the present invention can be appropriately used in the following negative pattern forming process. That is, the composition of the present invention can be appropriately used in the process comprising applying the composition onto a substrate to thereby form a resist film, exposing the resist film to actinic rays or radiation (namely, exposure to light) and developing the exposed film with a developer to thereby obtain a negative pattern. As this process, use can be made of any of processes described in, for example, JP-A's 2008-292975 and 2010-217884.

The present invention also relates to a pattern forming method comprising exposing to light the above resist film or mask blank laminated with the film and developing the exposed resist film or the mask blank laminated with the exposed film. In the present invention, the exposure is preferably performed using electron beams or extreme ultraviolet.

In the exposure to light (pattern forming operation) of the resist film in, for example, the manufacturing of a precision integrated circuit device, first, it is preferred to perform patternwise exposure of the resist film of the present invention to electron beams or extreme ultraviolet (EUV). The exposure is performed in an exposure amount of, in the use of electron beams, about 0.1 to 20 $\mu C/cm^2$, preferably about 3 to 10 $\mu C/cm^2$, and, in the use of extreme ultraviolet, about 0.1 to 20 $mJ/cm^2$, preferably about 3 to 15 $mJ/cm^2$. Subsequently, post-exposure bake is performed on a hot plate at 60 to 150° C. for 1 to 20 minutes, preferably 80 to 120° C. for 1 to 10 minutes. Thereafter, development, rinsing and drying are performed to thereby obtain a pattern. The development is performed with a developer for 0.1 to 3 minutes, preferably 0.5 to 2 minutes by conventional methods, such as a dip method, a puddle method and a spray method.

Both an organic developer and an alkali developer can be used as the developer. As the organic developer, use can be made of not only a polar solvent, such as an ester solvent (butyl acetate, ethyl acetate, etc.), a ketone solvent (2-heptanone, cyclohexanone, etc.), an alcohol solvent, an amide solvent or an ether solvent, but also a hydrocarbon solvent. The content of water in the organic developer as a whole is preferably less than 10 mass %. More preferably, the organic developer contains substantially no trace of water.

A quaternary ammonium salt whose representative is tetramethylammonium hydroxide is generally used in the alkali developer. Besides this, use can be made of an alkaline aqueous solution containing, for example, an inorganic alkali, a primary amine, a secondary amine a tertiary amine, an alcoholamine or a cycloamine. Appropriate amounts of an alcohol and a surfactant can be added to the above alkali developer before use. The alkali concentration of the alkali developer is generally in the range of 0.1 to 20 mass %. The pH value of the alkali developer is generally in the range of 10.0 to 15.0.

The composition of the present invention is a negative resist composition for use in the formation of a negative pattern, so that the film therefrom at unexposed areas is dissolved while the film therefrom at exposed areas has less tendency to be dissolved in the developer due to the crosslinking of compounds. Utilizing this, a desired pattern can be formed on substrates.

Furthermore, the present invention relates to a process for manufacturing an electronic device in which the above-described pattern forming method of the present invention is included, and relates to an electronic device manufactured by the process.

The electronic device of the present invention can be appropriately mounted in electrical and electronic equipments (household electronic appliance, OA/media-related equipment, optical apparatus, telecommunication equipment and the like).

EXAMPLES

Synthetic Example 1; Synthesis of Compound (A-1)

A sulfonium salt was synthesized by the Friedel-Crafts reaction between 2-phenylpropyl acetate and diphenyl sulfoxide. Thereafter, the salt was hydrolyzed, thereby obtaining compound (A-1-1).

In a three-necked flask, 3.7 g of compound (A-1-1) was dissolved in a mixed solvent comprised of 1.5 g of pyridine and 25 g of THF. While cooling with ice under agitation, 2.1 g of chloroacetyl chloride was dropped thereinto over a period of 30 minutes. After the completion of dropping, the ice bath was removed, and the mixture was warmed to room temperature (25° C.) at which the mixture was agitated for an hour. Thereafter, 100 g of chloroform was added to the mixture, and the resultant organic phase was sequentially washed with water, a saturated aqueous sodium bicarbonate solution and water. The solvent was removed, thereby obtaining brown liquid compound (A-1-2).

In a three-necked flask, compound (A-1-2) was dissolved in 25 g of acetone. While cooling the solution with ice under agitation, 1.7 g of piperidine was dropped thereinto over a period of 30 minutes. After the completion of dropping, the ice bath was removed, and the mixture was warmed to room temperature at which the mixture was agitated for 5 hours.

Thereafter, 100 g of chloroform was added to the mixture, and the resultant organic phase was sequentially washed with water, a saturated aqueous sodium bicarbonate solution and water. The solvent was removed, thereby obtaining brown liquid compound (A-1-3).

(Compound (A-1-3) was dissolved in 50 g of water, and 3.6 g of compound (A-1-4) was added to the aqueous solution and agitated for 30 minutes. Thereafter, 100 g of chloroform was added to the mixture, and the resultant organic phase was washed with water, thereby obtaining 3.3 g of brown liquid compound (A-1).

The $^1$H-NMR analytical result of compound (A-1) is as follows.

$^1$H-NMR (300 MHz, CDCl$_3$); 7.78-7.62 (m, 12H), 7.55 (d, 2H), 4.22 (m, 2H), 3.95 (d, 1H), 3.76 (d, 1H), 3.23 (m, 1H), 3.13 (s, 2H), 3.04 (t, 1H), 2.65 (t, 1H), 2.40 (m, 4H), 1.82-1.55 (m, 8H), 1.48-1.20 (m, 6H), 1.14-0.84 (m, 3H).

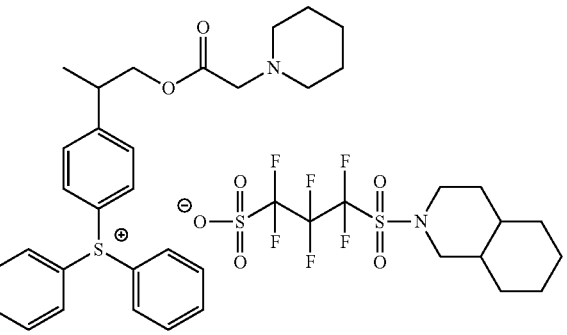

A-1

Compounds (A-2) to (A-14) listed in Table 1 were synthesized through salt exchanges between sulfonium bromide and sodium sulfonate in the same manner as in the synthesis of compound (A-1). Table 1 also shows the structures of comparative compounds (R1) to (R4) employed as comparative examples.

TABLE 1

| Compd.(A) | Structural formula | Vol.(Å$^3$) of generated acid |
|---|---|---|
| Compd. (A-1) | [structure] | 311 |
| Compd. (A-2) | [structure] | 127 |
| Compd. (A-3) | [structure] | 277 |

TABLE 1-continued
| Compd. (A-4) | 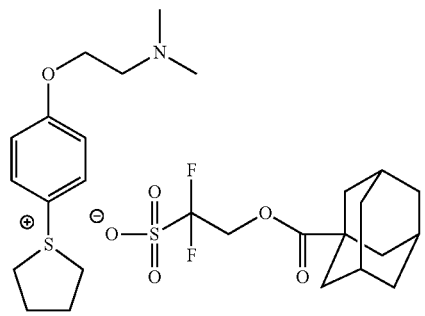 | 270 |
| Compd. (A-5) | 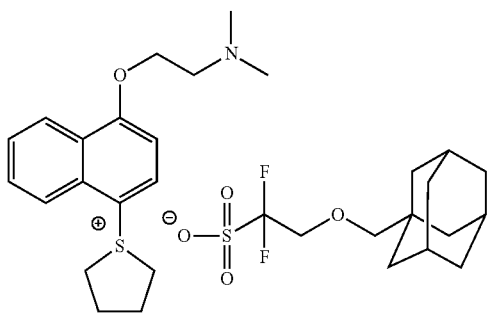 | 271 |
| Compd. (A-6) | 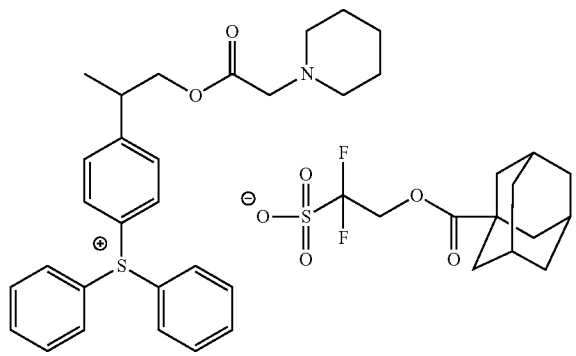 | 270 |
| Compd. (A-7) | 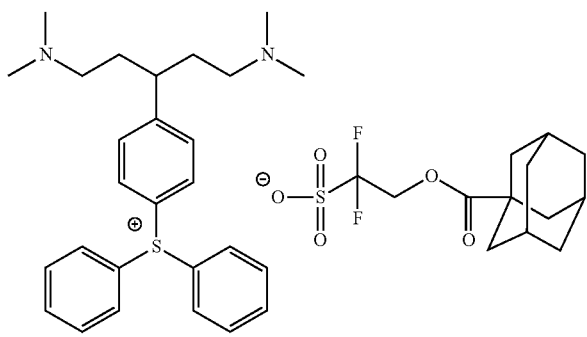 | 270 |

TABLE 1-continued
| | | |
|---|---|---|
| Compd. (A-8) | 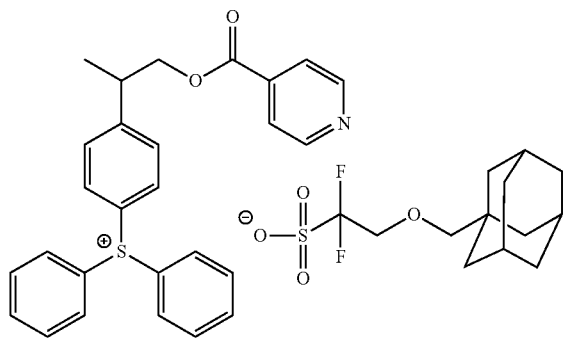 [SMILES: CC(COC(=O)c1ccncc1)c1ccc([S+](c2ccccc2)c2ccccc2)cc1 ; O=S(=O)([O-])C(F)(F)COCC12CC3CC(CC(C3)C1)C2] | 271 |
| Compd. (A-9) | 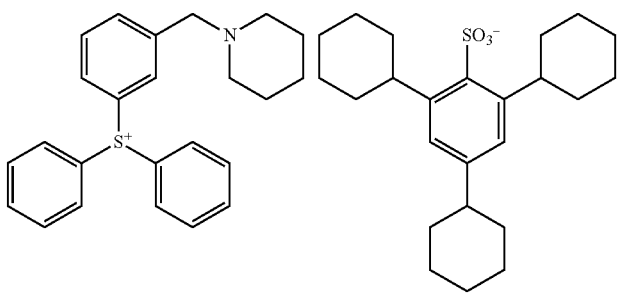 | 437 |
| Compd. (A-10) | 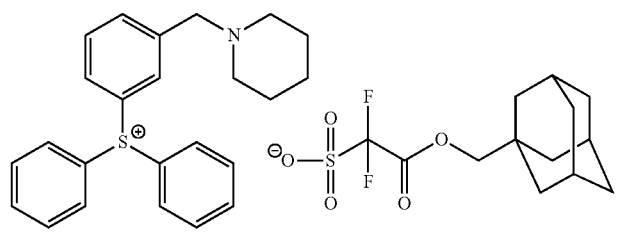 [SMILES: c1ccc([S+](c2ccccc2)c2cccc(CN3CCCCC3)c2)cc1 ; O=C(OCC12CC3CC(CC(C3)C1)C2)C(F)(F)S(=O)(=O)[O-]] | 271 |
| Compd. (A-11) | 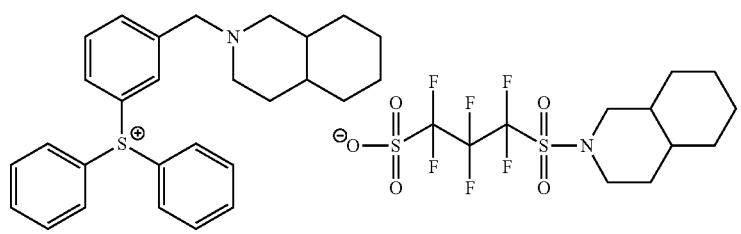 [SMILES: c1ccc([S+](c2ccccc2)c2cccc(CN3CCC4CCCCC4C3)c2)cc1 ; O=S(=O)([O-])C(F)(F)C(F)(F)C(F)(F)S(=O)(=O)N1CCC2CCCCC2C1] | 311 |
| Compd. (A-12) | 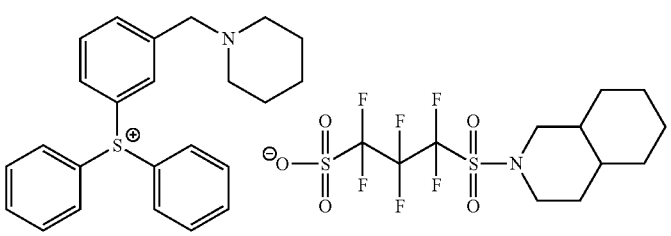 [SMILES: c1ccc([S+](c2ccccc2)c2cccc(CN3CCCCC3)c2)cc1 ; O=S(=O)([O-])C(F)(F)C(F)(F)C(F)(F)S(=O)(=O)N1CCC2CCCCC2C1] | 311 |

TABLE 1-continued

| Compd. | Chemical formula and structural formula | |
|---|---|---|
| Compd. (A-13) | [structure: 4-(piperidinomethyl)phenyl diphenylsulfonium 2,4,6-triisopropylbenzenesulfonate] | 303 |
| Compd. (A-14) | [structure: 5-[4-(piperidinomethyl)phenyl]-5H-phenoxathiinium 2-(1-adamantanecarbonyloxymethyl)-1,1,1-trifluoro-2-fluoromethanesulfonate] | 290 |

| Compd. | Chemical formula and structural formula |
|---|---|
| Comparative compd. (R1) | Tri-n-octylamine |
| Comparative compd. (R2) | 2,4,5-triphenylimidazole |
| Comparative compd. (R3) | [structure: tetrabutylammonium benzoate] |
| Comparative compd. (R4) | [structure: triphenylsulfonium 4-(dimethylamino)benzenesulfonate] |

The $^1$H-NMR chemical shifts of compounds (A-11), (A-12), (A-10) and (A-9) are listed below.

Compound (A-11)

$^1$H-NMR (400 MHz, CDCl$_3$); 7.80-7.58 (m, 14H), 3.97 (d, 1H), 3.78 (d, 1H), 3.53 (s, 2H), 3.03 (t, 1H), 2.74 (d, 1H), 2.66 (t, 1H), 2.55 (d, 1H), 2.03-0.84 (26H, m).

Compound (A-12)

$^1$H-NMR (400 MHz, CDCl$_3$); 7.80-7.58 (m, 14H), 3.97 (d, 1H), 3.78 (d, 1H), 3.52 (s, 2H), 3.03 (t, 1H), 2.62 (t, 1H), 2.32 (s, 4H), 1.82-0.84 (18H, m).

Compound (A-10)

$^1$H-NMR (d6-DMSO: ppm) δ; 1.10-0.88 (2H, m), 1.26-1.12 (5H, m), 1.74-1.51 (5H, m), 2.28 (s, 4H), 2.81-2.73 (1H, m), 3.18-3.07 (1H, m), 3.52 (s, 2H), 3.65 (1H, d, J=12.8 Hz), 3.81 (2H, s), 7.90-7.64 (m, 14H).

Compound (A-9)

$^1$H-NMR (d6-DMSO: ppm) δ; 1.17-1.09 (18H, m), 2.28 (s, 4H), 2.81-2.76 (1H, m), 3.52 (s, 2H), 4.61-4.55 (2H, m), 6.94 (2H, s), 7.90-7.64 (m, 14H).

Examples 1E to 24E and Comparative Examples 1E to 4E: Exposure to Electron Beams; Negative; Alkali Development (1) Provision of Support A 6-inch wafer coated with Cr oxide by vapor deposition (common one having undergone a shielding film treatment for use in photomask blanks) was provided.

(2) Provision of Resist Coating Liquid (Coating Liquid Formulation of Negative Resist Composition N1)

| | |
|---|---|
| Compound (A1) (structural formula shown above) | 0.04 g |
| Photoacid generator (z61) (structural formula shown below) | 0.47 g |
| Compound (P2) (structural formula to be shown hereinafter) | 4.68 g |
| Crosslinking agent CL-1 (structural formula shown below) | 0.59 g |
| Crosslinking agent CL-4 (structural formula shown below) | 0.30 g |
| 2-Hydroxy-3-naphthoic acid (organic carboxylic acid) | 0.11 g |
| Surfactant PF6320 (produced by OMNOVA) | 0.005 g |
| Propylene glycol monomethyl ether acetate (solvent S2) | 75.0 g |
| Propylene glycol monomethyl ether (solvent S1) | 18.8 g |

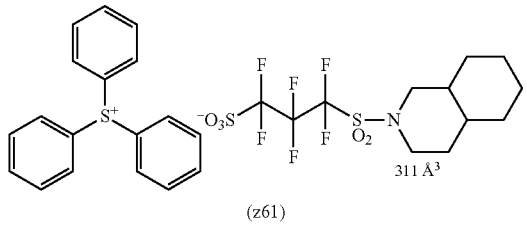

(z61)

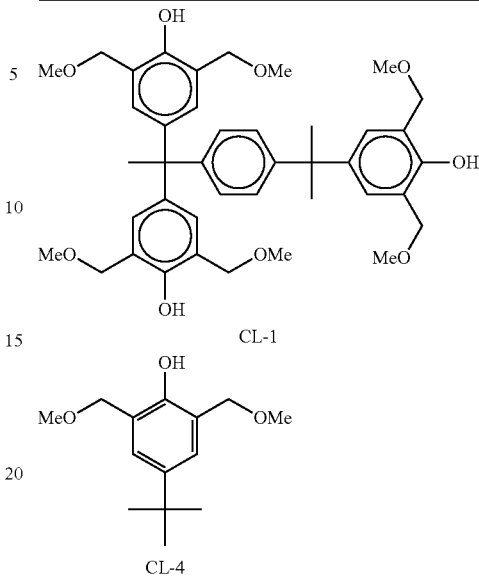

CL-1

CL-4

The above composition in solution form was precision filtered through a polytetrafluoroethylene filter of 0.04 μm pore diameter, thereby obtaining a resist coating solution.

Negative resist compositions N2 to N24 and negative resist comparative compositions N1 to N4 were prepared in the same manner as in the preparation of negative resist composition N1, except that the components listed in Table 2 below were used as resist solution recipes.

TABLE 2

| | Onium salt compd.(A) | Compd.(D) contg. phenolic hydroxyl group | Photoacid generator (B) | Organic carboxylic acid | Surfactant | Crosslinking agent (C) | Solvent |
|---|---|---|---|---|---|---|---|
| Comp. | | | | | | | |
| N1 | A1 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N2 | A2 (0.04 g) | P2 (4.68 g) | z61 (0.47 g) | D1 (0.11 g) | W-1 (0.005 g) | CL-1/CL-4 (0.59 g/0.30 g) | S1/S3 (75.0 g/18.8 g) |
| N3 | A3 (0.04 g) | P2 (4.68 g) | z61 (0.47 g) | D1 (0.11 g) | W-1 (0.005 g) | CL-1/CL-4 (0.59 g/0.30 g) | S2/S3 (75.0 g/18.8 g) |
| N4 | A4 (0.04 g) | P2 (4.68 g) | z61 (0.47 g) | D1 (0.11 g) | W-1 (0.005 g) | CL-1/CL-4 (0.59 g/0.30 g) | S2/S7 (75.0 g/18.8 g) |
| N5 | A5 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N6 | A6 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N7 | A7 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N8 | A8 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N9 | A9 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N10 | A10 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N11 | A11 (0.04 g) | P2 (4.68 g) | z61 (0.47 g) | D1 (0.11 g) | W-1 (0.005 g) | CL-1/CL-4 (0.59 g/0.30 g) | S2/S1 (75.0 g/18.8 g) |
| N12 | A12 (0.04 g) | P2 (4.68 g) | z61 (0.47 g) | D1 (0.11 g) | W-1 (0.005 g) | CL-1/CL-4 (0.59 g/0.30 g) | S1/S2/S6 (50.0 g/25.0 g/18.8 g) |
| N13 | A13 (0.04 g) | P2 (4.68 g) | z61 (0.47 g) | D1 (0.11 g) | W-1 (0.005 g) | CL-1/CL-4 (0.59 g/0.30 g) | S1/S2/S5 (50.0 g/25.0 g/18.8 g) |
| N14 | A14 (0.04 g) | P2 (4.68 g) | z61 (0.47 g) | D1 (0.11 g) | W-1 (0.005 g) | CL-1/CL-4 (0.59 g/0.30 g) | S1/S2/S4 (50.0 g/25.0 g/18.8 g) |
| N15 | A10 (0.04 g) | P1 (4.68 g) | z61 (0.47 g) | D1 (0.11 g) | W-1 (0.005 g) | CL-1/CL-4 (0.59 g/0.30 g) | S2/S1 (75.0 g/18.8 g) |

TABLE 2-continued

| | Onium salt compd.(A) | Compd.(D) contg. phenolic hydroxyl group | Photoacid generator (B) | Organic carboxylic acid | Surfactant | Crosslinking agent (C) | Solvent |
|---|---|---|---|---|---|---|---|
| N16 | A10 (0.04 g) | P3 (4.68 g) | z49 (0.47 g) | D1 (0.11 g) | None | CL-1/CL-4 (0.59 g/0.30 g) | S2/S1 (75.0 g/18.8 g) |
| N17 | A13 (0.04 g) | P4 (4.68 g) | z5 (0.47 g) | D2 (0.11 g) | None | CL-1/CL-4 (0.59 g/0.30 g) | S2/S1 (75.0 g/18.8 g) |
| N18 | A10 (0.04 g) | P5 (4.68 g) | z5 (0.47 g) | D3 (0.11 g) | None | CL-1/CL-4 (0.59 g/0.30 g) | S2/S1 (75.0 g/18.8 g) |
| N19 | A10 (0.04 g) | P6 (4.79 g) | z63 (0.47 g) | None | None | CL-1/CL-4 (0.59 g/0.30 g) | S2/S1 (75.0 g/18.8 g) |
| N20 | A10 (0.04 g) | None | z37/z45 (0.27 g/0.20 g) | None | None | CL-6 (5.57 g) | S2/S1 (75.0 g/18.8 g) |
| N21 | A10 (0.04 g) | P4 (4.79 g) | z42 (0.47 g) | None | W-2 (0.005 g) | CL-6 (0.89 g) | S2/S1 (75.0 g/18.8 g) |
| N22 | A10/A9 (0.02 g/0.02 g) | P4/P1 (2.0 g/2.79 g) | z48 (0.47 g) | None | W-3 (0.005 g) | CL-3 (0.89 g) | S2/S1 (75.0 g/18.8 g) |
| N23 | A11 (0.04 g) | P4/P1 (2.0 g/2.79 g) | z66 (0.47 g) | None | None | CL-2 (0.89 g) | S2/S1 (75.0 g/18.8 g) |
| N24 | A9 (0.04 g) | P4 (4.79 g) | z67 (0.47 g) | None | None | CL-1/CL-5 (0.59 g/0.30 g) | S2/S1 (75.0 g/18.8 g) |
| Comparative comp. | | | | | | | |
| Comparative comp. N1 | R1 (0.04 g) | P2 (4.79 g) | z2 (0.47 g) | D2 (0.11 g) | W-1 (0.005 g) | CL-3 (0.89 g) | S1 (93.8 g) |
| Comparative comp. N2 | R2 (0.04 g) | P2 (4.68 g) | z2 (0.47 g) | D2 (0.11 g) | W-1 (0.005 g) | CL-3 (0.89 g) | S1 (93.8 g) |
| Comparative comp. N3 | R3 (0.04 g) | P2 (4.68 g) | z2 (0.47 g) | D2 (0.11 g) | W-1 (0.005 g) | CL-3 (0.89 g) | S1 (93.8 g) |
| Comparative comp. N4 | R4 (0.04 g) | P2 (4.68 g) | z2 (0.47 g) | D2 (0.11 g) | W-1 (0.005 g) | CL-3 (0.89 g) | S1 (93.8 g) |

With respect to the abbreviations of components used in the above Examples and Comparative Examples, those not identifiable above are defined below.

[Compound Containing Phenolic Hydroxyl Group (Compound (D))]

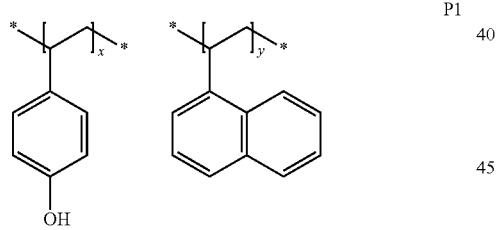

P1 x/y (molar ratio) = 90/10
Mw = 12000, Mw/Mn = 2.3

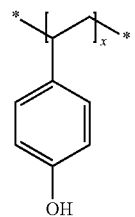

P3 x (molar ratio) = 100
Mw = 3700, Mw/Mn = 1.1

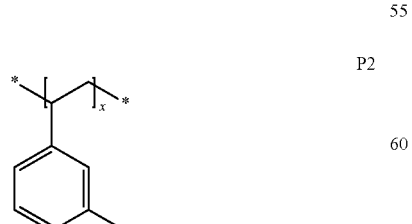

P2 x (molar ratio) = 100
Mw = 4500, Mw/Mn = 1.1

P4 x/y (molar ratio) = 85/15
Mw = 4200, Mw/Mn = 1.1

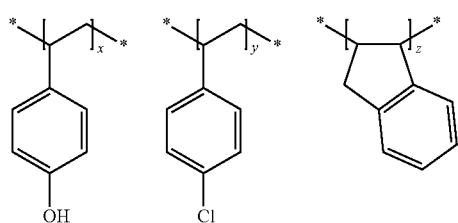
P5
x/y/z (molar ratio) = 75/5/20
Mw = 4500, Mw/Mn = 1.5
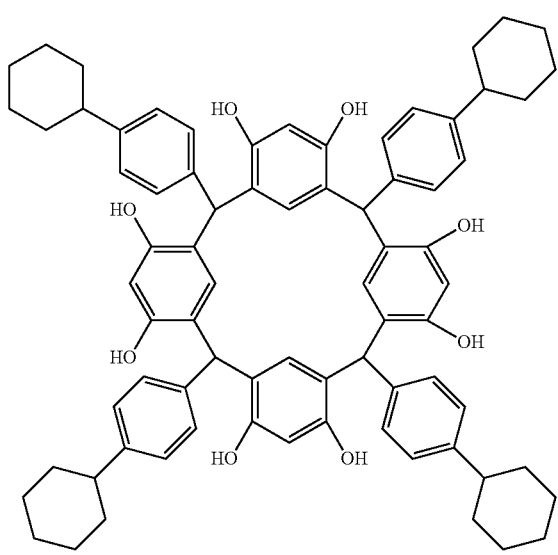
P6
[Photoacid Generator (Compound (B))]
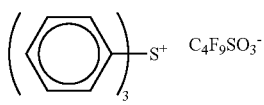
(z2)
113A³
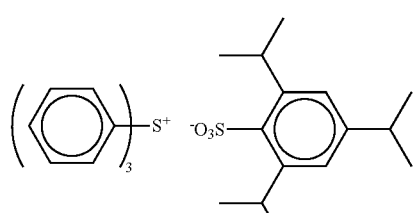
(z5)
303A³
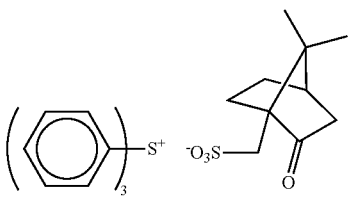
(z8)
216A³
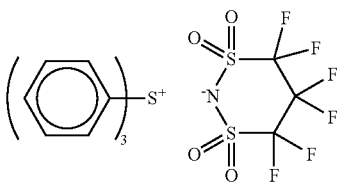
(z37)
136A³
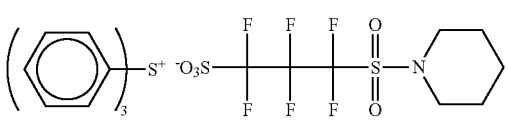
(z42)
244A³
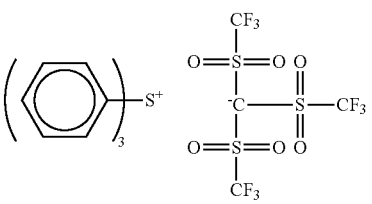
(z45)
189A³
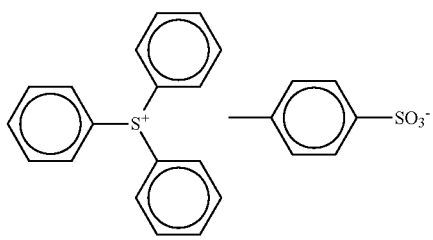
(z48)
186A³
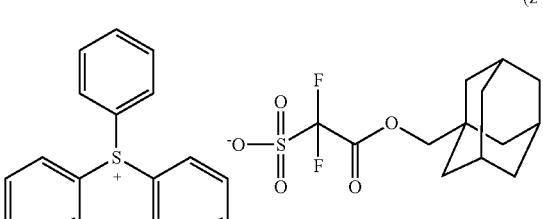
(z49)
271A³

-continued
(z61)
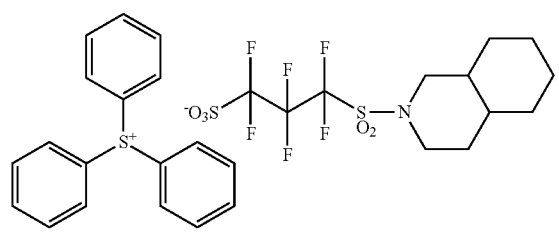
311A³
(z63)
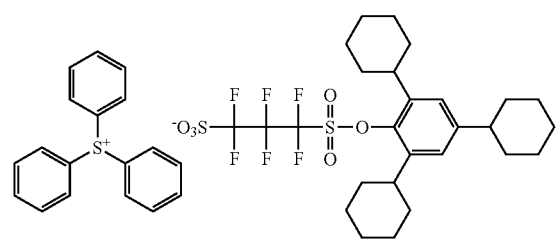
535A³
(z66)
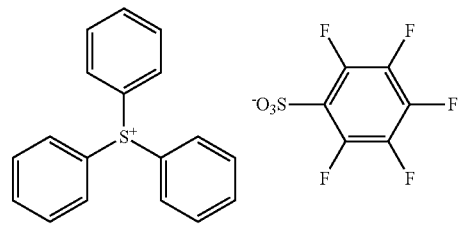
127A³
(z67)
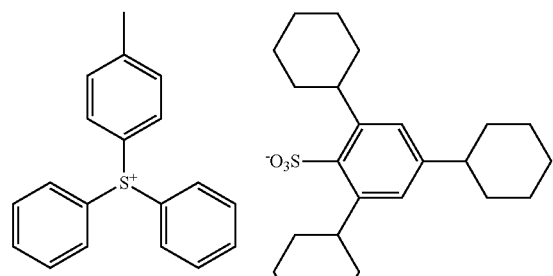
437A³
[Crosslinking Agent (Compound (C))]
CL-1
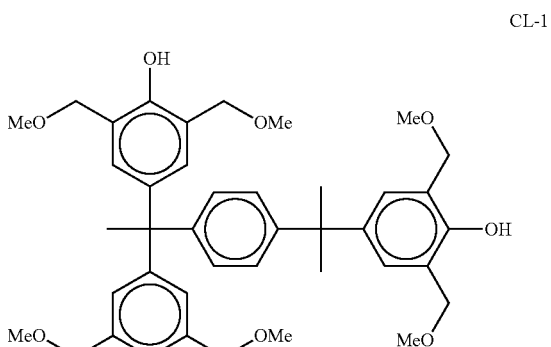
CL-2
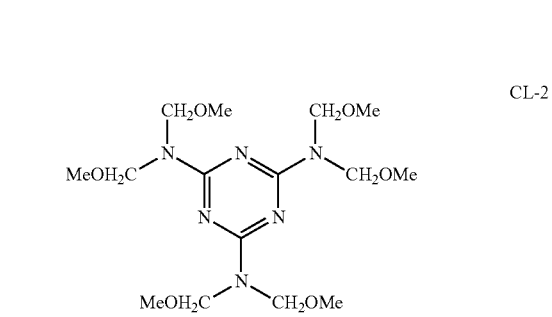
CL-3
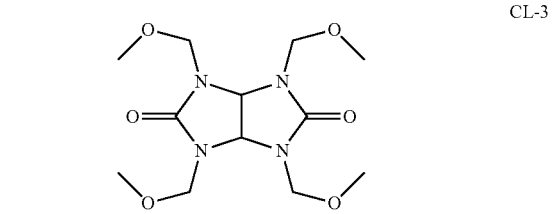
CL-4
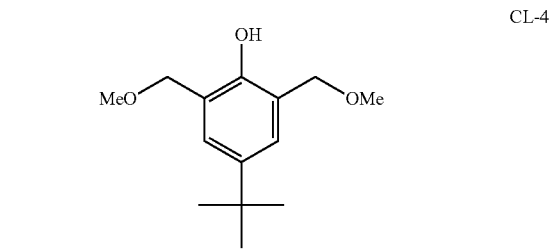
CL-5
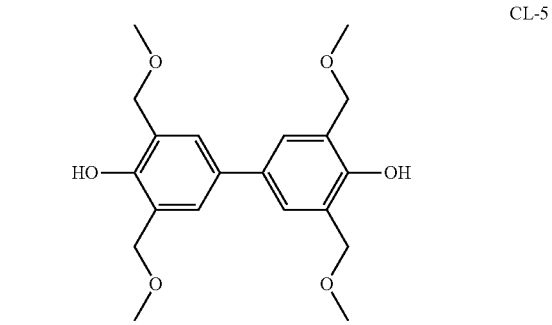

-continued

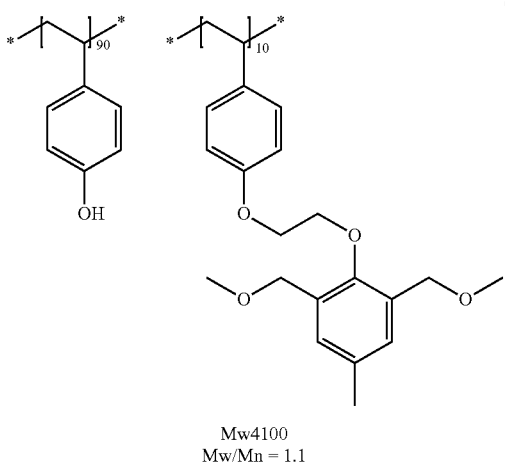

CL-6

Mw4100
Mw/Mn = 1.1

[Organic Carboxylic Acid]
D1: 2-hydroxy-3-naphthoic acid,
D2: 2-naphthoic acid, and
D3: benzoic acid.
[Surfactant]
W-1: PF6320 (produced by OMNOVA SOLUTIONS, INC.),
W-2: Megafac F176 (produced by DIC Corporation, fluorinated), and
W-3: polysiloxane polymer KP-341 (produced by Shin-Etsu Chemical Co., Ltd., siliconized).
[Solvent]
S1: propylene glycol monomethyl ether (1-methoxy-2-propanol),
S2: propylene glycol monomethyl ether acetate (1-methoxy-2-acetoxypropane),
S3: 2-heptanone,
S4: ethyl lactate,
S5: cyclohexanone,
S6: γ-butyrolactone, and
S7: propylene carbonate.
(3) Formation of Resist Film
Each of the obtained resist coating solutions was applied onto the above 6-inch wafer by means of a spin coater Mark 8 manufactured by Tokyo Electron Limited, and dried on a hot plate at 110° C. for 90 seconds, thereby obtaining a 50 nm-thick resist film. Namely, a resist-coated mask blank was obtained.
(4) Formation of Negative Resist Pattern
This resist film was patternwise exposed to electron beams by means of an electron beam lithography system (model ELS-7500 manufactured by Elionix Inc., acceleration voltage 50 KeV). After the exposure, the film was baked on a hot plate at 110° C. for 90 seconds, dipped in a 2.38 mass % aqueous tetramethylammonium hydroxide (TMAH) solution for 60 seconds, rinsed with water for 30 seconds and dried.
(5) Evaluation of Resist Pattern
The obtained patterns were evaluated by the following methods with respect to the sensitivity, resolving power, pattern shape, line edge roughness (LER), dependence on PEB temperature and PED stability.
[Sensitivity]
The shape of cross section of each of the obtained patterns was observed by means of a scanning electron microscope (model S-4300, manufactured by Hitachi, Ltd.). The sensitivity was defined as the exposure amount in which a 50 nm line width 1:1 line and space resist pattern was resolved. The smaller the value of this exposure amount, the higher the sensitivity.
[L/S Resolving Power]
The resolving power (nm) was defined as the limiting resolving power (minimum line width permitting the separation and resolution of a line and a space (line:space=1:1)) in the exposure amount exhibiting the above sensitivity.
[Pattern Shape]
The shape of cross section of each 50 nm line width 1:1 line and space pattern in the exposure amount exhibiting the above sensitivity was observed by means of a scanning electron microscope (model S-4300, manufactured by Hitachi, Ltd.). The shape of cross section of each line pattern when the ratio of [line width of line pattern at its top portion (surface portion)/line width of line pattern at its middle portion (position at half of the height of the line pattern)] was 1.2 or greater was graded into "inverted taper"; that when the ratio was in the range of 1.05 to less than 1.2 was graded into "slightly inverted taper"; and that when the ratio was less than 1.05 was graded into "rectangle."
[Isolated Space Pattern Resolving Power]
The limiting resolving power (minimum space width permitting the separation and resolution of a line and a space) of isolated space (line:space=100:1) was determined at the above sensitivity. This value was denoted as the "isolated space pattern resolving power (nm)." The smaller the value, the better the performance exhibited.
[Line Edge Roughness (LER)]
A 50 nm line width 1:1 line and space pattern was formed in the exposure amount exhibiting the above sensitivity. At arbitrary 30 points within 50 μm in the longitudinal direction of the pattern, the distance between actual edge and a reference line on which edges were to be present was measured by means of a scanning electron microscope (model S-9220, manufactured by Hitachi, Ltd.). The standard deviation of measured distances was determined, and 3σ was computed therefrom. The smaller the value thereof, the more favorable the performance exhibited.
[Dependence on PEB Temperature]
The optimum exposure amount was defined as the exposure amount in which a 1:1 line and space of 50 nm mask size was reproduced upon post-exposure bake (PEB) at 110° C. for 90 seconds. The exposure in the optimum exposure amount was followed by subsequent bakes at two temperatures, one being the above temperature+2° C. (namely 112° C.) and the other being the above temperature—2° C. (namely 108° C.). The resultant line and space patterns were measured, thereby determining line width L1 and line width L2 thereof. The dependence on PEB temperature (PEBS) was defined as the variation of line width per PEB temperature change 1° C., and was calculated by the following formula:

$$\text{Dependence on PEB temperature (nm/° C.)} = |L1-L2|/4$$

The smaller the value, the more favorably smaller the performance change by temperature change.
[Evaluation of PED (Post-Exposure Time Delay) Stability]
Exposure was performed in the exposure amount in which the dimension of each 50 nm line width 1:1 line and space pattern was 50 nm. Immediately thereafter, PEB was performed, and the line width dimension (0 h) was measured.

Separately, PEB was performed two hours after the exposure, and the line width dimension (2.0 h) on the wafer was measured. The line width change ratio was calculated by the following formula:

Line width change ratio (%)=$\Delta CD$(2.0 h–0 h)nm/50 nm

The smaller the value, the more favorable the performance exhibited. The value was used as an index of PED stability.

Evaluation results are listed in Table 3.

8 manufactured by Tokyo Electron Limited, and dried on a hot plate at 110° C. for 90 seconds, thereby obtaining a 50 nm-thick resist film. Namely, a resist-coated mask blank was obtained.

(Evaluation of Resist)

Each of the obtained resist films was evaluated with respect to the sensitivity, resolving power, pattern shape, line edge roughness (LER), dependence on PEB temperature and PED stability in accordance with the following methods.

TABLE 3

(EB exposure; negative; alkali developer)

| | Comp. | Sensitivity ($\mu C/cm^2$) | L/S resolving power (nm) | Pattern shape | Isolated space resolving power (nm) | LER (nm) | Dependence on PEB temp | PED stability |
|---|---|---|---|---|---|---|---|---|
| Ex. | | | | | | | | |
| 1E | N1 | 20.3 | 20 | Rectangle | 25 | 4.0 | 0.3 | 0.3 |
| 2E | N2 | 20.2 | 25 | Rectangle | 30 | 4.1 | 0.3 | 0.3 |
| 3E | N3 | 20.2 | 20 | Rectangle | 25 | 4.0 | 0.3 | 0.3 |
| 4E | N4 | 20.3 | 20 | Rectangle | 25 | 4.0 | 0.3 | 0.3 |
| 5E | N5 | 20.1 | 20 | Rectangle | 25 | 4.1 | 0.3 | 0.3 |
| 6E | N6 | 20.3 | 20 | Rectangle | 25 | 4.0 | 0.3 | 0.3 |
| 7E | N7 | 23.3 | 20 | Rectangle | 30 | 4.5 | 0.4 | 0.4 |
| 8E | N8 | 22.3 | 20 | Rectangle | 30 | 4.5 | 0.4 | 0.4 |
| 9E | N9 | 20.2 | 20 | Rectangle | 25 | 4.0 | 0.2 | 0.2 |
| 10E | N10 | 20.3 | 20 | Rectangle | 25 | 4.0 | 0.2 | 0.2 |
| 11E | N11 | 20.1 | 20 | Rectangle | 25 | 4.1 | 0.2 | 0.2 |
| 12E | N12 | 20.3 | 20 | Rectangle | 25 | 4.0 | 0.2 | 0.2 |
| 13E | N13 | 20.3 | 20 | Rectangle | 25 | 4.0 | 0.2 | 0.2 |
| 14E | N14 | 20.2 | 20 | Rectangle | 25 | 4.1 | 0.2 | 0.2 |
| 15E | N15 | 20.2 | 20 | Rectangle | 25 | 4.0 | 0.2 | 0.2 |
| 16E | N16 | 20.3 | 20 | Rectangle | 25 | 4.1 | 0.2 | 0.2 |
| 17E | N17 | 20.1 | 20 | Rectangle | 25 | 4.0 | 0.2 | 0.2 |
| 18E | N18 | 20.3 | 20 | Rectangle | 25 | 4.1 | 0.2 | 0.2 |
| 19E | N19 | 20.3 | 20 | Rectangle | 25 | 4.0 | 0.2 | 0.2 |
| 20E | N20 | 20.3 | 20 | Rectangle | 25 | 4.0 | 0.2 | 0.2 |
| 21E | N21 | 20.1 | 20 | Rectangle | 25 | 4.0 | 0.3 | 0.3 |
| 22E | N22 | 20.3 | 20 | Rectangle | 25 | 4.5 | 0.5 | 0.5 |
| 23E | N23 | 20.2 | 20 | Rectangle | 25 | 4.5 | 0.5 | 0.5 |
| 24E | N24 | 20.3 | 20 | Rectangle | 25 | 4.0 | 0.3 | 0.3 |
| Comparative Ex. | | | | | | | | |
| Comparative Ex. 1E | Comparative comp. N1 | 20.3 | 30 | Inverted taper | 35 | 5.0 | 2.2 | 2.5 |
| Comparative Ex. 2E | Comparative comp. N2 | 20.2 | 30 | Inverted taper | 35 | 5.1 | 2.3 | 2.0 |
| Comparative Ex. 3E | Comparative comp. N3 | 20.2 | 30 | Slightly inverted taper | 35 | 5.1 | 0.8 | 0.9 |
| Comparative Ex. 4E | Comparative comp. N4 | 20.1 | 30 | Slightly inverted taper | 35 | 5.2 | 0.8 | 0.9 |

From the results of Table 3, it is apparent that the compositions of the present invention exhibit enhanced sensitivity, resolving power, pattern shape and LER performance, and realizes low dependence on PEB temperature and excellent PED stability, in the exposure to electron beams.

Examples 1F to 6F and Comparative Examples 1F to 4F: Exposure to EUV; Negative; Alkali Development Each of the negative resist compositions indicated in Table 4 below was precision filtered through a polytetrafluoroethylene filter of 0.04 μm pore diameter, thereby obtaining a resist coating solution.

(Formation of Resist Film)

Each of the obtained resist coating solutions was applied onto the above 6-inch wafer by means of a spin coater Mark Each of the obtained resist films was exposed through a reflective mask of 50 nm line width 1:1 line and space pattern to EUV light (wavelength 13 nm). After the exposure, the film was baked at 110° C. for 90 seconds, and developed with a 2.38 mass % aqueous tetramethylammonium hydroxide (TMAH) solution.

[Sensitivity]

The shape of cross section of each of the obtained patterns was observed by means of a scanning electron microscope (model S-4300, manufactured by Hitachi, Ltd.). The sensitivity was defined as the exposure amount in which a 50 nm line width 1:1 line and space resist pattern was resolved. The smaller the value of this exposure amount, the higher the sensitivity.

[L/S Resolving Power]

The shape of cross section of each of the obtained patterns was observed by means of a scanning electron microscope (model S-4300, manufactured by Hitachi, Ltd.). The resolving power (nm) was defined as the limiting resolving power (minimum line width permitting the separation and resolution of a line and a space (line:space=1:1)) in the exposure amount in which a 50 nm line width 1:1 line and space resist pattern was resolved.

[Pattern Shape]

The shape of cross section of each 50 nm line width 1:1 line and space pattern in the exposure amount exhibiting the above sensitivity was observed by means of a scanning electron microscope (model S-4300, manufactured by Hitachi, Ltd.). The shape of cross section of each line pattern when the ratio of [line width of line pattern at its top portion (surface portion)/line width of line pattern at its middle portion (position at half of the height of the line pattern)] was 1.2 or greater was graded into "inverted taper"; that when the ratio was in the range of 1.05 to less than 1.2 was graded into "slightly inverted taper"; and that when the ratio was less than 1.05 was graded into "rectangle."

[Line Edge Roughness (LER)]

A 50 nm line width 1:1 line and space pattern was formed in the exposure amount exhibiting the above sensitivity. At arbitrary 30 points within 50 μm in the longitudinal direction of the pattern, the distance between actual edge and a reference line on which edges were to be present was measured by means of a scanning electron microscope (model S-9220, manufactured by Hitachi, Ltd.). The standard deviation of measured distances was determined, and 3σ was computed therefrom. The smaller the value thereof, the more favorable the performance exhibited.

[Dependence on PEB Temperature]

The optimum exposure amount was defined as the exposure amount in which a 1:1 line and space of 50 nm mask size was reproduced upon post-exposure bake (PEB) at 110° C. for 90 seconds. The exposure in the optimum exposure amount was followed by subsequent bakes at two temperatures, one being the above temperature+2° C. (namely 112° C.) and the other being the above temperature—2° C. (namely 108° C.). The resultant line and space patterns were measured, thereby determining line width L1 and line width L2 thereof. The dependence on PEB temperature (PEBS) was defined as the variation of line width per PEB temperature change 1° C., and was calculated by the following formula:

Dependence on PEB temperature (nm/° C.)=|L1−L2|/4

The smaller the value, the more favorably smaller the performance change by temperature change.

[Evaluation of PED (Post-Exposure Time Delay) Stability]

Exposure was performed in the exposure amount in which the dimension of the 50 nm line width 1:1 line and space pattern was 50 nm. Immediately thereafter, PEB was performed, and the line width dimension (0 h) was measured. Separately, PEB was performed two hours after the exposure, and the line width dimension (2.0 h) on the wafer was measured. The line width change ratio was calculated by the following formula:

Line width change ratio (%)=ΔCD(2.0 h−0 h)nm/50 nm

The smaller the value, the more favorable the performance exhibited. The value was used as an index of PED stability.

TABLE 4

| | | (EUV exposure; negative; alkali developer) | | | | | |
|---|---|---|---|---|---|---|---|
| Ex. | Comp. | Sensitivity (mJ/cm²) | L/S resolving power (nm) | Pattern shape | LER (nm) | Dependence on PEB temp | PED stability |
| 1F | N10 | 15.8 | 20 | Rectangle | 4.1 | 0.2 | 0.2 |
| 2F | N15 | 15.7 | 20 | Rectangle | 4.0 | 0.2 | 0.2 |
| 3F | N16 | 15.8 | 20 | Rectangle | 4.1 | 0.2 | 0.2 |
| 4F | N17 | 15.6 | 20 | Rectangle | 4.2 | 0.2 | 0.2 |
| 5F | N18 | 15.8 | 20 | Rectangle | 4.0 | 0.2 | 0.2 |
| 6F | N19 | 15.5 | 20 | Rectangle | 4.1 | 0.2 | 0.2 |
| Comparative Ex. 1F | Comparative comp. N1 | 15.5 | 30 | Inverted taper | 5.2 | 2.5 | 2.5 |
| Comparative Ex. 2F | Comparative comp. N2 | 15.6 | 30 | Inverted taper | 5.1 | 2.4 | 2.5 |
| Comparative Ex. 3F | Comparative comp. N3 | 15.5 | 30 | Slightly inverted taper | 5.1 | 0.8 | 0.9 |
| Comparative Ex. 4F | Comparative comp. N4 | 15.6 | 30 | Slightly inverted taper | 5.2 | 0.8 | 0.9 |

From the results of Table 4, it is apparent that the compositions of the present invention exhibit enhanced sensitivity, resolving power, pattern shape and LER performance, and realizes low dependence on PEB temperature and excellent PED stability, in the exposure to EUV.

Examples 1C to 6C and Comparative Examples 1C and 2C: Exposure to EB; Negative; Organic Solvent Development (1) Preparation of Resist Composition and Formation of Resist Film Each of the compositions indicated in Table 5 below was precision filtered through a membrane filter of 0.1 μm pore diameter, thereby obtaining a resist composition.

Each of the obtained resist compositions was applied onto a 6-inch Si wafer having been treated with hexamethyldisilazane (HMDS) by means of a spin coater Mark 8 manufactured by Tokyo Electron Limited, and dried on a hot plate at 100° C. for 60 seconds, thereby obtaining a 50 nm-thick resist film.

(2) Exposure to EB and Development

Each of the wafers coated with resist films that were obtained in section (1) above was patternwise exposed to electron beams by means of an electron beam lithography system (HL750 manufactured by Hitachi, Ltd., acceleration voltage 50 KeV). The lithography was performed so as to form a 1:1 line and space pattern. After the electron beam lithography, the film was baked on a hot plate at 110° C. for 60 seconds. The baked film was developed for 30 seconds by puddling the organic developer indicated in Table 5, and rinsed with the rinse liquid indicated in the same table. Thereafter, the rinsed wafer was rotated at a rotating speed of 4000 rpm for 30 seconds and baked at 90° C. for 60 seconds. As a result, resist patterns each of a 50 nm line width 1:1 line and space pattern were obtained.

Each of the thus obtained resist films was evaluated with respect to the sensitivity, resolving power, pattern shape, line edge roughness (LER), dependence on PEB temperature and PED stability in accordance with the same methods as in Examples 1E to 24E and Comparative Examples 1E to 4E. The results are listed below.

the compound (D) containing a phenolic hydroxyl group is a resin containing any of repeating units of general formula (II) below,

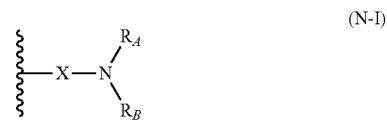
(N-I)

in which
each of $R_A$ and $R_B$ independently represents a hydrogen atom or an alkyl group, a cycloalkyl group or an alkenyl group; and

TABLE 5

(EB exposure; negative; organic developer)

| Ex. | Comp. | Developer | Rinse liquid | Sensitivity ($\mu C/cm^2$) | L/S resolving power (nm) | Pattern shape | Isolated space resolving power (nm) | LER (nm) | Dependence on PEB temp | PED stability |
|---|---|---|---|---|---|---|---|---|---|---|
| 1C | N10 | S8 | S11 | 15.0 | 20 | Rectangle | 25 | 4.1 | 0.2 | 0.2 |
| 2C | N15 | S8 | S11 | 15.0 | 20 | Rectangle | 25 | 4.1 | 0.2 | 0.2 |
| 3C | N16 | S9 | S12 | 15.6 | 20 | Rectangle | 25 | 4.0 | 0.2 | 0.2 |
| 4C | N17 | S10 | S11 | 15.2 | 20 | Rectangle | 25 | 4.2 | 0.2 | 0.2 |
| 5C | N18 | S8 | S11 | 15.8 | 20 | Rectangle | 25 | 4.0 | 0.2 | 0.2 |
| 6C | N19 | S9 | S10 | 15.2 | 20 | Rectangle | 25 | 4.0 | 0.2 | 0.2 |
| Comparative Ex. 1C | Comparative comp. N1 | S8 | S11 | 15.2 | 30 | Inverted taper | 30 | 5.0 | 3.1 | 3.1 |
| Comparative Ex. 2C | Comparative comp. N2 | S8 | S11 | 15.8 | 30 | Inverted taper | 30 | 5.0 | 3.1 | 3.0 |
| Comparative Ex. 3C | Comparative comp. N3 | S8 | S11 | 15.2 | 30 | Slightly inverted taper | 30 | 5.0 | 1.1 | 1.0 |
| Comparative Ex. 4C | Comparative comp. N4 | S8 | S11 | 15.4 | 30 | Slightly inverted taper | 30 | 5.0 | 1.1 | 1.0 |

With respect to the abbreviations of components used in the above Examples and Comparative Examples, those not identifiable above are defined below.
[Developer/Rinse Liquid]
S8: butyl acetate,
S9: pentyl acetate,
S10: anisole,
S11: 1-hexanol, and
S12: decane.

From the results of Table 5, it is apparent that the compositions of the present invention exhibit enhanced sensitivity, resolving power, pattern shape and LER performance, and realizes low dependence on PEB temperature and excellent PED stability, in the exposure to EB.

What is claimed is:
1. A negative resist composition comprising:
an onium salt compound (A) containing a nitrogen atom in its cation moiety,
a compound (B) that is configured to produce an acid when exposed to actinic rays or radiation,
a compound (C) containing an acid-crosslinkable group, and
a compound (D) containing a phenolic hydroxyl group,
wherein the cation moiety in the onium salt compound (A) comprises any of partial structures of general formula (N-I) below, and an anion moiety in the onium salt compound (A) comprises an anion moiety structure expressed by general formula (LD1) below,
the compound (C) containing an acid-crosslinkable group contains a hydroxymethyl group or an alkoxymethyl group, and

X represents a single bond or a connecting group;

provided that there is no case where any two or more of $R_A$, $R_B$ and X are bonded to each other to thereby form a ring,

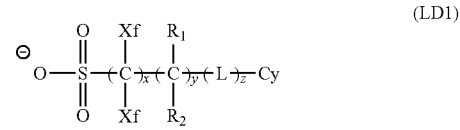
(LD1)

in which in the general formula (LD1)
each of Xf's independently represents a fluorine atom or an alkyl group substituted with at least one fluorine atom,
each of $R_1$ and $R_2$ independently represents a hydrogen atom, a fluorine atom or an alkyl group,
L, or each of L's independently, represents a bivalent connecting group,
Cy represents an alicyclic group or a heterocyclic group,
x is an integer of 1 to 20,
y is an integer of 0 to 10, and
z is an integer of 0 to 10;

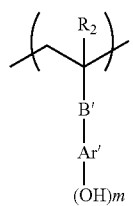

(II)

in which
R₂ represents a hydrogen atom, an optionally substituted methyl group or a halogen atom,
B' represents a single bond or a bivalent organic group,
Ar' represents an aromatic ring group, and
m is an integer of 1 or greater.

2. The negative resist composition according to claim 1, wherein the compound (C) containing an acid-crosslinkable group contains two or more hydroxymethyl groups or alkoxymethyl groups in its molecule.

3. The negative resist composition according to claim 1, for exposure to electron beams or extreme ultraviolet.

4. The negative resist composition according to claim 1, wherein the onium salt compound (A) is contained in an amount of 0.1 to 10 mass % based on total solids of the negative resist composition.

5. A resist film comprising the composition of claim 1.

6. A method of forming a pattern, comprising exposing the resist film of claim 5 to actinic rays or radiation and developing the thus exposed film.

7. The pattern forming method according to claim 6, wherein the exposure to actinic rays or radiation is performed using electron beams or extreme ultraviolet.

8. A process for manufacturing an electronic device, comprising the pattern forming method according to claim 6.

9. A mask blank comprising the resist film of claim 5.

10. A method of forming a pattern, comprising exposing a mask blank comprising the resist film of claim 5 to actinic rays or radiation and developing the thus exposed mask blank.

11. A negative resist composition comprising:
an onium salt compound (A) containing a nitrogen atom in its cation moiety,
a compound (B) that is configured to produce an acid when exposed to actinic rays or radiation,
a compound (C) containing an acid-crosslinkable group, and
a compound (D) containing a phenolic hydroxyl group,
wherein the onium salt compound (A) is a sulfonium salt compound or an iodonium salt compound, the cation moiety in the onium salt compound (A) comprises any of partial structures of general formula (N-I) below, and an anion moiety in the onium salt compound (A) comprises an anion moiety structure expressed by general formula (LD1) below,
the compound (C) containing an acid-crosslinkable group contains a hydroxymethyl group or an alkoxymethyl group, and
the compound (D) containing a phenolic hydroxyl group is a resin containing any of repeating units of general formula (II) below,
provided that S+ or I+ is not contained in the partial structure of general formula (N-I), and is contained in a residue of the cation moiety to which the partial structure is bonded,

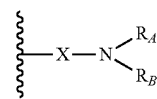

(N-I)

in which
each of $R_A$ and $R_B$ independently represents a hydrogen atom or an organic group; and
X represents an alkylene group, a group comprised of a combination of an alkylene group and an ether bond, or a group comprised of a combination of an alkylene group and an ester bond;
provided that at least two of $R_A$, $R_B$ and X may be bonded to each other to thereby form a ring,

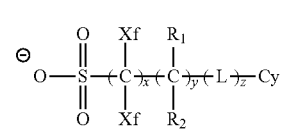

(LD1)

in which in the general formula (LD1)
each of Xf's independently represents a fluorine atom or an alkyl group substituted with at least one fluorine atom,
each of $R_1$ and $R_2$ independently represents a hydrogen atom, a fluorine atom or an alkyl group,
L, or each of L's independently, represents a bivalent connecting group,
Cy represents an alicyclic group or a heterocyclic group,
x is an integer of 1 to 20,
y is an integer of 0 to 10, and
z is an integer of 0 to 10;

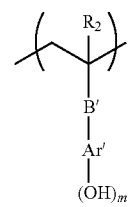

(II)

in which
R₂ represents a hydrogen atom, an optionally substituted methyl group or a halogen atom,
B' represents a single bond or a bivalent organic group,
Ar' represents an aromatic ring group, and
m is an integer of 1 or greater.

12. A negative resist composition comprising:
an onium salt compound (A) containing a nitrogen atom in its cation moiety,
a compound (B) that is configured to produce an acid when exposed to actinic rays or radiation,
a compound (C) containing an acid-crosslinkable group, and
a compound (D) containing a phenolic hydroxyl group,
wherein the onium salt compound (A) is expressed by general formula (N-II) below,
the compound (C) containing an acid-crosslinkable group contains a hydroxymethyl group or an alkoxymethyl group, and the compound (D) containing a phenolic hydroxyl group is a resin containing any of repeating units of general formula (II) below,

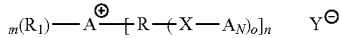

(N-II)

in which

A represents a sulfur atom or an iodine atom;

$R_1$ represents a hydrogen atom or an organic group, provided that when there are a plurality of $R_1$s, they may be identical to or different from each other;

R represents a chain or cyclic aliphatic hydrocarbon group, a heterocyclic hydrocarbon group or an aromatic hydrocarbon group, provided that when there are a plurality of R's, they may be identical to or different from each other;

X represents an alkylene group or a group comprised of a combination of an alkylene group and an ester bond, provided that when there are a plurality of X's, they may be identical to or different from each other;

$A_N$ represents a basic moiety containing a nitrogen atom, provided that when there are a plurality of $A_N$s, they may be identical to or different from each other;

when A is a sulfur atom, n is an integer of 1 to 3 and m is an integer satisfying the relationship m+n=3; and when A is an iodine atom, n is 1 or 2 and m is an integer satisfying the relationship m+n=2;

o is an integer of 1 to 10; and $Y^-$ represents an anion represented by the following general formula (LD1);

provided that at least two of $R_1$, X, R and $A_N$ may be bonded to each other to thereby form a ring,

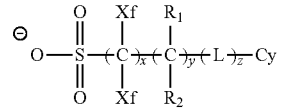

(LD1)

in which in the general formula (LD1)

each of Xf's independently represents a fluorine atom or an alkyl group substituted with at least one fluorine atom, each of $R_1$ and $R_2$ independently represents a hydrogen atom, a fluorine atom or an alkyl group, L, or each of L's independently, represents a bivalent connecting group, Cy represents an alicyclic group or a heterocyclic group, x is an integer of 1 to 20, y is an integer of 0 to 10, and z is an integer of 0 to 10;

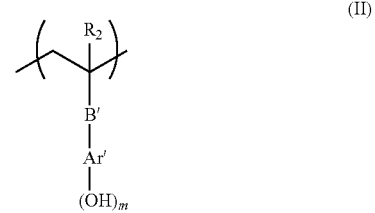

(II)

in which $R_2$ represents a hydrogen atom, an optionally substituted methyl group or a halogen atom, B' represents a single bond or a bivalent organic group, Ar' represents an aromatic ring group, and m is an integer of 1 or greater.

* * * * *